(12) United States Patent
Chen et al.

(10) Patent No.: US 11,942,343 B2
(45) Date of Patent: Mar. 26, 2024

(54) WAFER TEMPERATURE MEASUREMENT IN AN ION IMPLANTATION SYSTEM

(71) Applicant: Advanced Ion Beam Technology, Inc., Hsin-Chu (TW)

(72) Inventors: Chien-Li Chen, Hsin-Chu (TW); Steven R. Walther, Hsin-Chu (TW)

(73) Assignee: Advanced Ion Beam Technology, Inc., Hsin-Chu (TW)

( * ) Notice: Subject to any disclaimer, the term of this patent is extended or adjusted under 35 U.S.C. 154(b) by 318 days.

(21) Appl. No.: 17/162,108

(22) Filed: Jan. 29, 2021

(65) Prior Publication Data

US 2021/0242054 A1 Aug. 5, 2021

Related U.S. Application Data

(60) Provisional application No. 62/968,032, filed on Jan. 30, 2020.

(51) Int. Cl.
*H01L 21/67* (2006.01)
*C23C 14/48* (2006.01)
(Continued)

(52) U.S. Cl.
CPC ........ *H01L 21/67248* (2013.01); *C23C 14/48* (2013.01); *C23C 14/541* (2013.01);
(Continued)

(58) Field of Classification Search
CPC ......... H01L 21/67248; H01L 21/67109; H01L 21/67115; H01L 21/67213; H01L 21/265;
(Continued)

(56) References Cited

U.S. PATENT DOCUMENTS 5,064,289 A * 11/1991 Bockman ........... G01B 9/02018
356/485
5,221,142 A * 6/1993 Snow ....................... G01K 5/52
374/161
(Continued)

FOREIGN PATENT DOCUMENTS

TW 270225 B 2/1996
TW 200809930 A 2/2008
(Continued)

OTHER PUBLICATIONS

Written Opinion of the International Searching Authority in PCT/US2021/015884, dated Apr. 2021. (Year: 2021).*
(Continued)

*Primary Examiner* — Mary A Wilczewski
(74) *Attorney, Agent, or Firm* — DLA Piper LLP (US)

(57) ABSTRACT

The present disclosure relates generally to ion implantation, and more particularly, to systems and processes for measuring the temperature of a wafer within an ion implantation system. An exemplary ion implantation system may include a robotic arm, one or more load lock chambers, a pre-implantation station, an ion implanter, a post-implantation station, and a controller. The pre-implantation station is configured to heat or cool a wafer prior to the wafer being implanted with ions by the ion implanter. The post-implantation station is configured to heat or cool a wafer after the wafer is implanted with ions by the ion implanter. The pre-implantation station and/or post-implantation station are further configured to measure a current temperature of a wafer. The controller is configured to control the various components and processes described above, and to determine a current temperature of a wafer based on information received from the pre-implantation station and/or post-implantation station.

28 Claims, 13 Drawing Sheets

(51) Int. Cl.
*C23C 14/54* (2006.01)
*G01B 7/06* (2006.01)
*G01B 11/08* (2006.01)
*G01K 3/00* (2006.01)
*G01S 7/481* (2006.01)
*G01S 17/08* (2006.01)
*H01L 21/265* (2006.01)
*H01L 21/324* (2006.01)
*H01L 21/66* (2006.01)

(52) U.S. Cl.
CPC .............. *G01B 7/08* (2013.01); *G01B 11/08* (2013.01); *G01K 3/005* (2013.01); *G01S 7/4814* (2013.01); *G01S 17/08* (2013.01); *H01L 21/265* (2013.01); *H01L 21/324* (2013.01); *H01L 21/67115* (2013.01); *H01L 22/12* (2013.01); *H01L 22/26* (2013.01)

(58) Field of Classification Search
CPC ....... H01L 21/324; H01L 22/10; H01L 21/22; H01L 21/12; H01L 22/26; C23C 14/48; C23C 14/541; H01J 37/20; H01J 37/317; H01J 37/3171; H01J 2237/2001; H01J 2237/2482
See application file for complete search history.

(56) References Cited

U.S. PATENT DOCUMENTS

| | | | |
|---|---|---|---|
| 5,741,070 A | 4/1998 | Moslehi | |
| 6,084,240 A * | 7/2000 | Lin | H01J 37/304 250/443.1 |
| 6,812,045 B1 * | 11/2004 | Nikoonahad | G03F 7/70625 438/15 |
| 8,434,937 B2 * | 5/2013 | Koelmel | H01L 21/68742 374/161 |
| 8,450,193 B2 * | 5/2013 | England | H01L 21/6831 438/510 |
| 8,786,841 B2 * | 7/2014 | Barlett | H01L 21/67248 356/72 |
| 8,825,434 B2 * | 9/2014 | Koshimizu | G01B 9/0209 356/497 |
| 10,128,084 B1 * | 11/2018 | Baggett | H01J 37/1471 |
| 10,227,693 B1 * | 3/2019 | Baggett | H01L 21/6833 |
| 2002/0189757 A1 * | 12/2002 | Denton | H01L 22/26 118/712 |
| 2005/0118010 A1 * | 6/2005 | Ogawa | H01L 21/67742 414/744.1 |
| 2005/0238081 A1 * | 10/2005 | Takashima | G01K 7/343 374/E7.038 |
| 2008/0002753 A1 * | 1/2008 | Timans | G01K 15/00 374/2 |
| 2011/0272584 A1 * | 11/2011 | Zhang | G01J 1/58 250/361 R |
| 2017/0352544 A1 * | 12/2017 | Farley | H01L 21/26513 |
| 2018/0323092 A1 * | 11/2018 | Rao | G01K 11/20 |
| 2020/0203196 A1 * | 6/2020 | Baggett | C23C 16/4412 |
| 2021/0242054 A1 * | 8/2021 | Chen | C23C 14/48 |

FOREIGN PATENT DOCUMENTS

| | | | | |
|---|---|---|---|---|
| TW | 201606470 A | | 2/2016 | |
| TW | 201923848 A | | 6/2019 | |
| WO | 2008/003080 A2 | | 1/2008 | |
| WO | WO 2021/155270 | * | 8/2021 | .......... H01L 21/265 |

OTHER PUBLICATIONS

International Preliminary Report on Patentability received for PCT Patent Application No. PCT/US2021/015884, dated Aug. 11, 2022, 23 pages.

Notice of Allowance received for Taiwanese Patent Application No. 110102837, dated May 24, 2022, 3 pages (1 page of English Translation and 2 pages of Official copy).

Office Action received for Taiwanese Patent Application No. 110102837, dated Nov. 17, 2021, 13 pages (8 pages of English Translation and 7 pages of Official Copy).

* cited by examiner

WAFER TEMPERATURE MEASUREMENT IN AN ION IMPLANTATION SYSTEM

CROSS-REFERENCE TO RELATED APPLICATIONS

This application claims priority to: U.S. Provisional Patent Application Ser. No. 62/968,032, entitled "WAFER TEMPERATURE MEASUREMENT IN AN ION IMPLANTATION SYSTEM," filed on Jan. 30, 2020, the content of which is hereby incorporated by reference in its entirety. The present application is related to International Patent Application No. PCT ###, entitled "WAFER TEMPERATURE MEASUREMENT IN AN ION IMPLANTATION SYSTEM," filed on Jan. 29, 2021, the content of which is hereby incorporated by reference in its entirety.

BACKGROUND

1. Field

The present disclosure relates generally to ion implantation, and more particularly, to systems and processes for measuring the temperature of a wafer within an ion implantation system.

2. Related Art

In semiconductor device fabrication, the physical and/or electrical properties of a semiconductor wafer (also known as a semiconductor substrate) may be modified through a process known as ion implantation. Ion implantation may be performed using an ion implantation system, which may include an ion implanter that generates an ion beam to implant a wafer with ions. In addition to an ion implanter, an ion implantation system may include various processing stations for heating and/or cooling a wafer before and/or after the ion implanter implants a wafer with ions. A wafer's temperature within an ion implantation system before, during, and after ion implantation can play an important role in successfully implanting the wafer with ions as well as in the integrity of the wafer during its later use. Accordingly, efficient and accurate techniques for measuring a wafer's temperature during an ion implantation process are desirable.

BRIEF SUMMARY

The present disclosure relates to ion implantation systems and processes. An exemplary ion implantation system may include a robotic arm, one or more load lock chambers, an ion implanter, one or more processing stations (e.g., a pre-implantation station, a post-implantation station, etc.), and a controller. The one or more load lock chambers are configured to hold one or more wafers before and/or after the one or more wafers are processed by the ion implantation system. The pre-implantation station is configured to heat or cool a wafer prior to the wafer being implanted with ions by the ion implanter. Similarly, the post-implantation station is configured to heat or cool a wafer after the wafer is implanted with ions by the ion implanter. The pre-implantation station and/or post-implantation station are further configured to measure a current temperature of a wafer. The robotic arm is configured to move a wafer within the ion implantation system. For example, the robotic arm can be configured to move a wafer from the one or more load lock chambers to the pre-implantation station, from the pre- implantation station to the ion implanter, from the ion implanter to the post-implantation station, and/or from the post-implantation station back to the one or more load lock chambers. The controller is configured to control the various components and processes described above, as well as determine a current temperature of a wafer based on information received from one or more processing stations (e.g., the pre-implantation station and/or post-implantation station).

In some examples, a processing station (e.g., pre-implantation station and/or post-implantation station) is configured to measure a current temperature of a wafer using a single-laser method. In some examples, this method includes: after heating or cooling a wafer in the processing station, measuring a first distance from a first position of a laser source to a first point on an edge of the wafer by directing a first laser beam from the laser source at the first position to the first point; measuring a second distance from a second position of the laser source to a second point on the edge of the wafer by directing a second laser beam from the laser source at the second position to the second point; measuring a third distance from a third position of the laser source to a third point on the edge of the wafer by directing a third laser beam from the laser source at the third position to the third point; determining a current diameter of the wafer based at least on the measured first distance, second distance, and third distance; and determining a current temperature of the wafer based on the determined current diameter of the wafer.

In some examples, a processing station (e.g., pre-implantation station and/or post-implantation station) is configured to measure a temperature of a wafer using a bandgap method. In some examples, this method includes: after heating or cooling a wafer, directing, at a first side of the wafer, a laser beam from a laser source, wherein the laser beam is transmitted through the wafer; generating an absorption profile of the wafer across the predefined frequency range by measuring an intensity of the transmitted laser beam using a photodetector proximate to a second side of the wafer; determining a frequency corresponding to a current bandgap value of the wafer based on the absorption profile of the wafer; and determining a current temperature of the wafer corresponding to the determined frequency.

In some examples, a processing station (e.g., pre-implantation station and/or post-implantation station) is configured to measure a temperature of a wafer using a capacitance method. In some examples, this method includes: positioning the wafer between a top capacitive sensor and a bottom capacitive sensor of the processing station, wherein a top side of the wafer faces the top capacitive sensor and a bottom side of the wafer faces the bottom capacitive sensor; heating or cooling the wafer at the processing station; after heating or cooling the wafer, determining a first distance between the top side of the wafer and the top capacitive sensor based on a top capacitance measured by the top capacitive sensor; determining a second distance between the bottom side of the wafer and the bottom capacitive sensor based on a bottom capacitance measured by the bottom capacitive sensor; determining a current thickness of the wafer based on the first distance, the second distance, and a predefined distance at which the top capacitive sensor and the bottom capacitive sensor are positioned; and determining a current temperature of the wafer based on the determined current thickness of the wafer.

In some examples, a processing station (e.g., pre-implantation station and/or post-implantation station) is configured to measure a temperature of a wafer using a photoluminescence method. In some examples, this method includes: after heating or cooling the wafer, directing a laser beam from a laser source to a predefined location on the wafer; detecting, using a spectrophotometer or a monochromator, fluorescent light emitted by the wafer in response to absorbing laser energy of the laser beam; determining an intensity profile of the detected fluorescent light; and determining a current temperature of the wafer based on one or more characteristics determined from the intensity profile.

DETAILED DESCRIPTION

Figure 1:
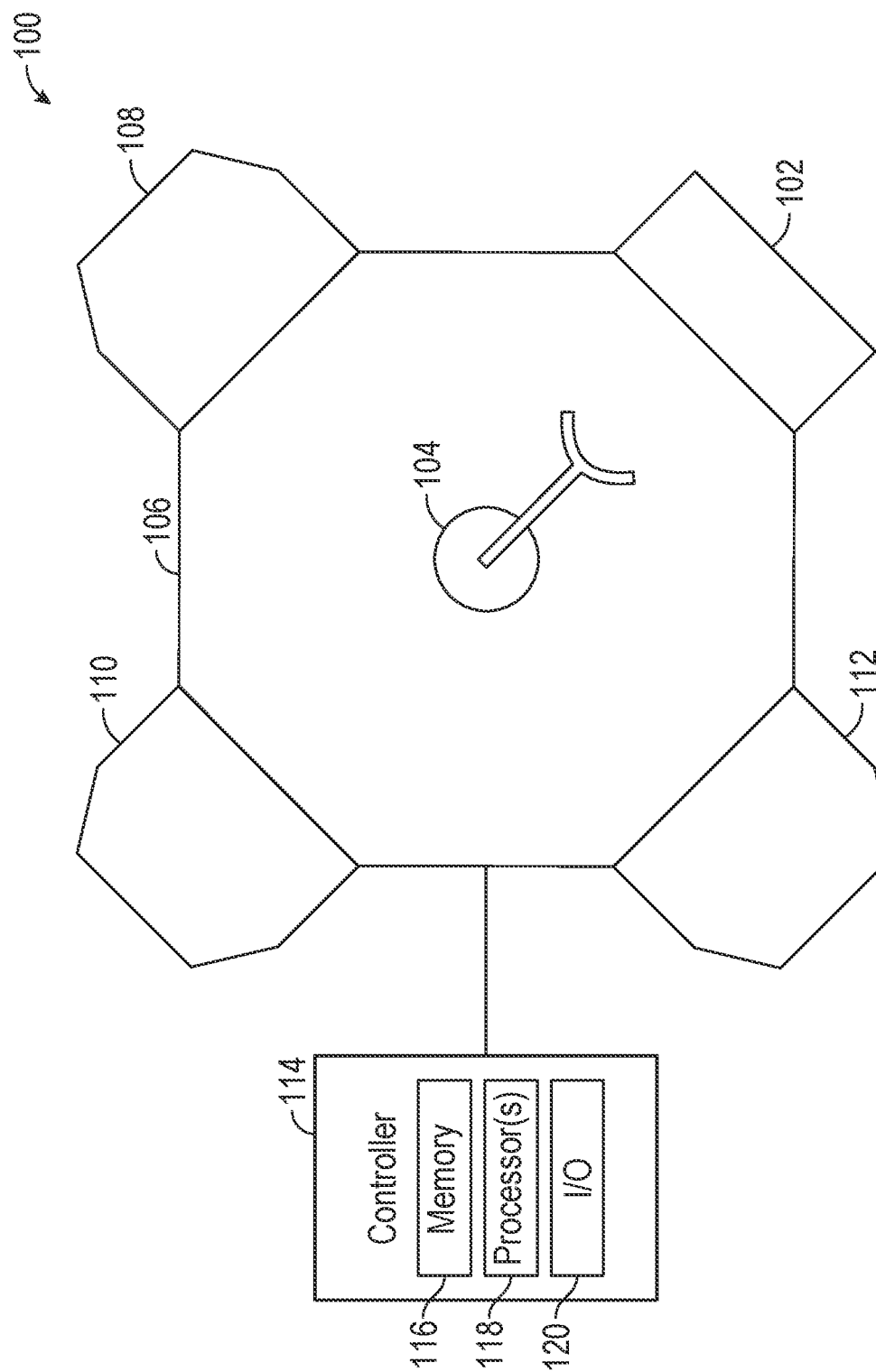
FIG. 1 illustrates an ion implantation system, according to various examples.

The following description is presented to enable a person of ordinary skill in the art to make and use the various embodiments. Descriptions of specific systems, devices, methods, and applications are provided only as examples. Various modifications to the examples described herein will be readily apparent to those of ordinary skill in the art, and the general principles defined herein may be applied to other examples and applications without departing from the spirit and scope of the various embodiments. Thus, the various embodiments are not intended to be limited to the examples described herein and shown, but are to be accorded the scope consistent with the claims.

An ion implantation system may include various processing stations for heating and/or cooling a wafer before and/or after the ion implanter implants a wafer with ions. A wafer's temperature within an ion implantation system before, during, and after ion implantation can play an important role in successfully implanting the wafer with ions as well as in the integrity of the wafer during its later use. Thus, conventional ion implantation systems employ various processes for measuring and monitoring a wafer's temperature within an ion implantation system. For example, one conventional process for measuring and monitoring a wafer's temperature within an ion implantation system includes detecting infrared emission from a wafer and determining the wafer's temperature based on the infrared emission. Another conventional process for measuring and monitoring a wafer's temperature within an ion implantation system includes contacting a wafer with a temperature sensor (e.g., a thermal couple), which can then provide the temperature at the point of contact with the wafer's surface.

However, the conventional systems and processes for measuring wafer temperature described above have several shortcomings. For example, measuring a wafer's temperature by detecting infrared emission from a wafer is only suitable as a measurement means when the wafer is at high temperatures that are well above ambient temperature (e.g., 20 to 25 degrees Celsius). As another example, measuring a wafer's temperature by contacting the wafer with a temperature sensor can be unreliable with respect to making good thermal contact to the wafer surface. Further, a temperature sensor can also absorb infrared light directly (and thus heat up) when measuring a wafer's temperature while one or more infrared heating lamps heat the wafer. The above shortcomings can lead to inaccurate wafer temperature measurements. Further, contacting a wafer with a temperature sensor can create undesirable backside particles on the wafer's surface. Accordingly, there is a need for a more reliable, non-contact system and process for measuring wafer temperature that can be utilized for various types of ion implantation methods and that will reduce the undesirable results of the conventional methods for measuring wafer temperature within an ion implantation system.

Systems and processes for efficiently and accurately measuring a temperature of a wafer during an ion implantation process without contacting the wafer are described herein. In particular, the present disclosure describes systems and process for measuring a temperature of a wafer during an ion implantation process based on, for example, the wafer's diameter, bandgap, thickness, and/or photoluminescence.

FIG. 1 illustrates ion implantation system 100, according to various examples. System 100 includes load lock chamber(s) 102, robotic arm 104, vacuum chamber 106, pre-implantation station 108, processing chamber 110 of an ion implanter, post-implantation station 112, and controller 114. Controller 114 includes memory 116 (which optionally includes one or more computer-readable storage mediums), processor(s) 118, and input/output (I/O) interface 120. As shown in FIG. 1, robotic arm 104 is positioned within vacuum chamber 106. Further, load lock chamber(s) 102, pre-implantation station 108, processing chamber 110, and post-implantation station 112 are each coupled to vacuum chamber 106 such that robotic arm 104 is capable of accessing load lock chamber(s) 102, pre-implantation station 108, processing chamber 110, and post-implantation station 112.

In some examples, during operation of ion implantation station 100, a wafer is introduced into load lock chamber(s) 102 (e.g., by an operator of ion implantation station 100). Robotic arm 104 moves the wafer from load lock chamber(s) 102 to pre-implantation station 108, where the wafer is heated or cooled to a predetermined temperature. After the wafer is heated or cooled, robotic arm 104 moves the wafer to processing chamber 110 of the ion implanter, where the wafer undergoes ion implantation while at the predetermined temperature. After implantation is complete, robotic arm 104 moves the implanted wafer to the post-implantation station, where the wafer is heated or cooled to bring the temperature of the wafer back to a desired temperature (e.g., ambient temperature). Robotic arm 104 then returns the wafer to load lock chamber(s) 102. The wafer can subsequently be removed from load lock chamber(s) 102 (e.g., by an operator of ion implantation station 100).

Load lock chamber(s) 102 is configured to hold one or more wafers before and/or after the one or more wafers are processed by ion implantation system 100. In some examples, load lock chamber(s) 102 includes two separate load lock chambers. In these examples, each load lock chamber may be configured to receive wafers from a Front Opening Universal Pod (FOUP). For example, each load lock chamber may be configured such that at least 25 wafers may be transferred from a FOUP to a cassette of each of the load lock chambers. In some examples, load lock chamber(s) 102 includes a high vacuum pumping system configured to bring an interior of load lock chamber(s) 102 to a required high vacuum or ultra-high vacuum (UHV) (e.g., to an interior pressure greater than or equal to $5 \times 10^{-7}$ torr). Thus, in the example above wherein load lock chamber(s) 102 includes two separate load lock chambers, all the wafers from a first standard FOUP may be transferred into a first load lock chamber of load lock chamber(s) 102 prior to pumping down the first load lock chamber to the required high vacuum (e.g., using the high vacuum pumping system). All of the wafers from a second standard FOUP may then be transferred into a second load lock chamber of load lock chamber(s) 102 and pumped down to the required high vacuum in parallel while waiting for the wafers of the first load lock chamber to be implanted. Such a configuration may be desirable for achieving a high-throughput (e.g., greater than 400 wafers per hour) of ion implantation system 100.

As mentioned above, robotic arm 104 is capable of accessing load lock chamber(s) 102, pre-implantation station 108, processing chamber 110, and post-implantation station 112. In particular, robotic arm 104 is configured to hold a wafer as well as position the wafer at, and/or remove the wafer from, load lock chamber(s) 102, pre-implantation station 108, processing chamber 110, and post-implantation station 112. Robotic arm 104 is positioned within (e.g., at the center of) vacuum chamber 106, the interior of which is kept at a high vacuum. An interior of pre-implantation station 108, processing chamber 110, and post-implantation station 112 are also kept at a high vacuum since pre-implantation station 108, processing chamber 110, and post-implantation station can each be accessed from the interior of vacuum chamber 106.

Thus, once a wafer is positioned within load lock chamber(s) 102 and an interior of load lock chamber(s) 102 is brought to a high vacuum (e.g., using a high vacuum pumping system), the wafer can remain within the high vacuum environment throughout ion implantation system 100's ion implantation process and/or until the wafer is returned to load lock chamber(s) 102 and the interior of load lock chamber(s) is returned to an atmospheric pressure. In some examples, a gate valve is positioned between load lock chamber(s) 102 and vacuum chamber 106 so that vacuum chamber 106 may remain at a high vacuum when an interior of load lock chamber(s) 102 is at atmospheric pressure. For example, the gate valve can be closed when load lock chamber(s) 102 is at an atmospheric pressure in order to keep an interior of vacuum chamber 106 at a high vacuum. In some examples, when load lock chamber(s) includes more than one (e.g., two) separate load lock chambers, a gate valve is positioned between each separate load lock chamber and vacuum chamber 106.

Pre-implantation station 108 includes a processing chamber and is configured to heat or cool a wafer prior to implanting the wafer with ions at the ion implanter of ion implantation system 100. Further, as mentioned above, an interior of pre-implantation station 108's processing chamber is kept at a high vacuum. In some examples, pre-implantation 108 includes a cooling electrostatic chuck ("E-chuck") that cools a wafer at pre-implantation station 108 (e.g., in a low-temperature ion implantation process). For example, the cooled E-chuck can be positioned within pre-implantation station 108's processing chamber and can be cooled using a coolant (e.g., liquid nitrogen) such that a wafer that is positioned on the cooled E-chuck (e.g., by robotic arm 104) can be cooled to low temperatures (e.g., −60 degrees Celsius, −100 degrees Celsius, −200 degrees Celsius, etc.). In some examples, pre-implantation station 108 includes a coolant release valve configured to cool a wafer to low temperatures (e.g., −60 degrees Celsius, −100 degrees Celsius, −200 degrees Celsius, etc.) by releasing a coolant (e.g., liquid nitrogen) into the interior of pre-implantation station 108's processing chamber. In some examples, releasing a coolant into the interior of pre-implantation station 108's processing chamber includes spraying the coolant directly at the wafer. In these examples, the processing chamber of pre-implantation station 108 can be sealed off from vacuum chamber 106 (e.g., via a gate valve) to prevent coolant from being released into vacuum chamber 106. In some examples, robotic arm 104 holds the wafer in place while coolant is released into the interior of pre-implantation station 108's processing chamber (e.g., without placing the wafer on a wafer stage or E-chuck).

In some examples, pre-implantation station 108 includes one or more infrared heating lamps (described in greater detail below with reference to FIG. 3) that heat a wafer at pre-implantation station 108 (e.g., in a high-temperature ion implantation process). For example, the one or more infrared heating lamps can be positioned within pre-implantation station 108's processing chamber such that a wafer can be positioned on a stage beneath the one or more infrared heating lamps (e.g., by robotic arm 104) so that the one or more infrared heating lamps heat the wafer with infrared light (e.g., to 300 degrees Celsius). Exemplary infrared heating lamps of pre-implantation station 108 include near infrared heating lamps (which produce infrared light with wavelengths between 780 nm to 1.4 μm), medium infrared heating lamps (which produce infrared light with wavelengths between 1.4 μm to 3 μm), and far infrared heating lamps (which produce infrared light with wavelengths between 3 μm to 100 μm). In some examples, robotic arm 104 holds the wafer in place while the wafer is heated (e.g., without placing the wafer on a wafer stage).

Figure 2:
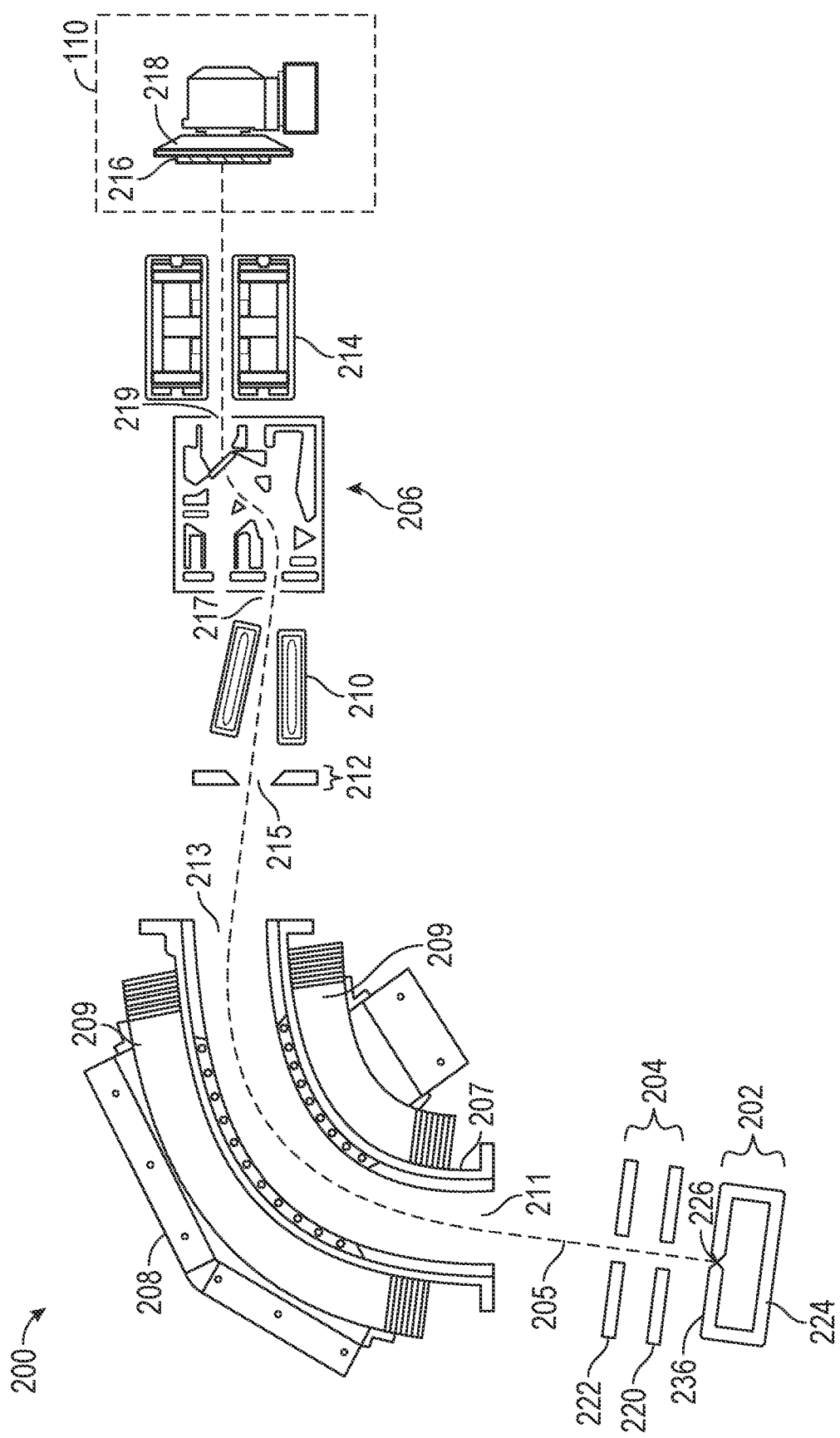
FIG. 2 illustrates a two-dimensional, top-down perspective view of an ion implanter, according to various examples.

As mentioned above, the ion implanter of ion implantation system 100 is configured to implant a wafer with ions from an ion beam and includes processing chamber 110. The ion implanter may be similar or identical to ion implanter 200 described below with reference to FIG. 2. In particular, FIG. 2 illustrates a two-dimensional, top-down perspective view of an ion implanter, according to various examples. As shown, ion implanter 200 includes ion source 202 and extraction manipulator 204 for generating ion beam 205. Extraction manipulator 204 extracts ion beam 205 from ion source 202 and directs ion beam 205 into magnetic analyzer 208 where ion beam 205 is filtered by mass, charge, and/or energy. Ion beam 205 is further directed through multipole magnets 210, electrode assembly 206, and multipole magnets 214 to adjust the energy, shape, direction, angle, and/or uniformity of ion beam 205. In particular, electrode assembly 206 is configured to adjust the energy of ion beam 205, remove neutral species from ion beam 205, and/or adjust the size, shape, and uniformity of ion beam 205. Multipole magnets 210 and 214 are configured to adjust the uniformity, center angle, and/or divergence angle of ion beam 205. Variable aperture assembly 212 is positioned between multipole magnets 210 and magnetic analyzer 208. Variable aperture assembly 212 is configured to adjust the ion current of ion beam 205. Ion implanter 200 further includes wafer support structure 218, which is configured to position wafer 216 in the path of ion beam 205, thereby causing implantation of ions into wafer 216.

Ion source 202 is configured to generate ions of a desired species. For example, for semiconductor device fabrication, desired ion species can include boron, phosphorus, or arsenic (e.g., B+, P+, and As+). In some examples, ion source 202 comprises a Bernas source, a Freeman source, or an indirectly heated cathode source. Ion source 202 includes arc chamber 224, which is configured to receive one or more process gases from one or more gas sources. In some examples, ion source 202 is configured to form a plasma in arc chamber 224 by electron ionization of the one or more process gases. In these examples, ion source 202 includes a cathode disposed within arc chamber 224. The cathode includes a filament that is heated to generate electrons for ionizing the one or more process gases. Further, the cathode is coupled to a power source, which biases the cathode at an arc voltage to accelerate the electrons from the cathode to the sidewalls of arc chamber 224. The energized electrons ionize the one or more process gases in arc chamber 224, thereby forming a plasma in arc chamber 224.

Ion source 202 further includes faceplate 236 on one side of arc chamber 224. Faceplate 236 includes exit aperture 226 (e.g., arc slit) through which ions extracted from ion source 202 exit arc chamber 224. For example, exit aperture 226 can be a slit or a slot configured to form a ribbon-shaped ion beam 205. In some examples, faceplate 236 is coupled to a power source to bias faceplate 236, thereby creating a potential difference (e.g., extraction voltage) between ion source 202 and extraction manipulator 204 to generate ion beam 205.

Extraction manipulator 204 includes suppression electrode 220 and ground electrode 222. Suppression electrode 220 is configured to resist electrons from back-flowing into ion source 202. For example, a power supply can be coupled to suppression electrode 220 to apply a suppression voltage to suppression electrode 220. Ground electrode 222 is coupled to a ground potential. Extraction manipulator 204 is configured to generate an ion beam by extracting ions from ion source 202. For example, suitable voltages can be applied to faceplate 236 and ground electrode 222 to generate a potential difference between faceplate 236 and ground electrode 222. The generated potential difference can cause ions to be extracted from arc chamber 224 through exit aperture 226 and accelerated through ground electrode 222 to generate ion beam 205.

As shown in FIG. 2, ion beam 205 is directed along a linear trajectory from extraction manipulator 204 to magnetic analyzer 208. Magnetic analyzer 208 includes yoke 207 and electromagnetic coils 209 wrapped around opposite sidewalls of yoke 207. Yoke 207 defines a channel through which ion beam 205 travels through magnetic analyzer 208. As shown, ion beam 205 enters magnetic analyzer 208 through first opening 211 of yoke 207 and exits magnetic analyzer 208 through second opening 213 of yoke 207. Magnetic analyzer 208 is configured to generate a magnetic field that causes ion beam 205 to deflect in a particular direction (e.g., the x-direction). While being deflected, the ions in ion beam 205 are filtered according to energy and mass-to-charge ratio such that only ions having a desired energy and mass-to-charge ratio may pass through magnetic analyzer 208 toward wafer 216. In some examples, magnetic analyzer 208 directs ion beam 205 along a linear path from opening 213 to electrode assembly 206.

As shown in FIG. 2, ion beam 205 is directed through variable aperture assembly 212 and multipole magnets 210 between magnetic analyzer 208 and electrode assembly 206. Variable aperture assembly 212 includes two movable plates that define variable aperture 215. However, in some examples, variable aperture 212 includes more than two moveable plates that define variable aperture 215 (e.g., three moveable plates, four moveable plates, etc.). In some examples, the movable plates are configured to adjust the size and shape of the variable aperture 215. In some examples, the size and shape of the aperture defines the size and shape of ion beam 205 exiting variable aperture assembly 212. Further, in some examples, variable aperture assembly 212 adjusts the ion current of ion beam 205 by adjusting the size of variable aperture 215. For example, variable aperture 215 can be reduced to limit the ion current of ion beam 205 transmitted through variable aperture assembly 212. By adjusting the size of variable aperture, the ion current may be quickly adjusted between implant processes, thereby increasing throughput and productivity.

Multipole magnets 210 include an array of coils arranged on ferromagnetic supports. Electrical energy is supplied to the array of coils to generate a contiguous magnetic field. In some examples, multipole magnets 210 are configured such that electrical energy is independently supplied to the individual coils. This may enable the magnetic field gradient over the contiguous magnetic field to be adjusted. Thus, in these examples, a suitable non-uniform magnetic field is generated to adjust the size, shape, angle, and/or uniformity of ion beam 205. For example, a suitable magnetic field can be generated by multipole magnets 210 to control the size and current density of the ion beam 205. In doing so, multipole magnets 210 can be configured to adjust the shape of ion beam 205 as well as its spatial uniformity.

Electrode assembly 206 is configured to accelerate and/or decelerate an ion beam to control the energy of the ion beam. In particular, electrode assembly 206 includes multiple electrodes for manipulating the ion beam as the ion beam travels through electrode assembly 206. For example, the electrodes of electrode assembly 206 may be configured to decelerate the ion beam as the ion beam travels through electrode assembly 206. The ion beam can thus enter opening 217 at an initial energy and exit opening 219 at a final energy that is lower than the initial energy. As another example, the electrodes of electrode assembly 206 may be configured to accelerate the ion beam or allow the ion beam to drift at constant velocity as the ion beam travels through electrode assembly 206. The ion beam can thus enter opening 217 at an initial energy and exit opening 219 at a final energy that is equal to, or greater than, the initial energy.

As shown in FIG. 2, ion beam 205 exits opening 219 of electrode assembly 206 and is directed through multipole magnets 214. In some examples, multipole magnets 214 are the same as multipole magnets 210 described above. In some examples, multipole magnets 214 include fewer or additional coils compared to multipole magnets 210. In some examples, multipole magnets 214 are configured to adjust the shape, direction, focus, and/or uniformity of ion beam 205. Further, in some examples, multipole magnets 214 are configured to steer ion beam 205 to strike the surface of wafer 216 in a particular location or to allow for other positional adjustments of ion beam 205. In other examples, multipole magnets 214 may be configured to repeatedly deflect ion beam 205 to scan wafer 216, which may be stationary or moving.

Wafer support structure 218 is configured to position wafer 216 in front of ion beam 205 exiting multiple magnets 214 to cause ions to implant into wafer 216. In some examples, wafer support structure 218 is configured to translate in one or more directions. For example, wafer support structure 218 can be configured to move wafer 216 with respect to ion beam 205 to scan ion beam 205 across wafer 216. In some examples, wafer support structure 218 is configured to rotate wafer 216.

It should be recognized that wafer 216 may comprise any suitable substrate used in the manufacturing of semiconductor devices, solar panels, or flat-panel displays. In examples where wafer 216 comprises a semiconductor substrate (e.g., silicon, germanium, gallium arsenide, etc.), wafer 216 may include semiconductor devices at least partially formed thereon.

Further, it should be appreciated that suitable variations and modifications may be made to ion implanter 200. For example, ion implanter 200 can include additional components such as additional electrodes and magnets for manipulating ion beam 205. As another example, ion implanter 200 can include more than one variable aperture assembly for controlling the current of ion beam 205. Note, as shown in FIG. 2, all of the components of ion implanter 200 are positioned outside of the processing chamber of ion implanter 200 (e.g., processing chamber 110) except wafer 216 and wafer support structure 218 (which are positioned within an interior of the processing chamber). In some examples, components of ion implanter 200 that are outside of ion implanter 200's processing chamber are coupled to an exterior surface of processing chamber 110. In some examples, components of ion implanter 200 that are outside of ion implanter 200's processing chamber are positioned near the processing chamber but are not coupled to the processing chamber. In any case, the components of ion implanter 200 that are positioned outside of ion implanter 200's processing chamber are positioned and configured in such a way that allows ion beam 205 to enter processing chamber 110 while maintaining an interior of processing chamber 110 at a high vacuum.

Returning to FIG. 1, post-implantation station 112 includes a processing chamber and is configured to heat or cool a wafer after the wafer is implanted with ions by the ion implanter. Further, as mentioned above, the processing chamber of post-implantation station 112 is configured to maintain a high vacuum. Note, while FIG. 1 illustrates post-implantation station 112 as including its own separate processing chamber, in some examples, post-implantation station 112 is located within load lock chamber(s) 102. In these examples, load lock chamber(s) 102 includes at least two separate load lock chambers, wherein the chamber(s) in which a wafer is positioned (e.g., by robotic arm 104) after the ion implanter implants a wafer with ions is different from the chamber(s) that hold the wafer prior to being cooled or heated at pre-implantation station 108. Further, in some examples, post-implantation station 112 is located within an auxiliary chamber of load lock chamber(s) 102. In some examples, the auxiliary chamber is coupled to load lock chamber(s) 102 and is accessible via load lock chamber(s) 102 (e.g., instead of via vacuum chamber 106). Further, in some examples, load lock chamber(s) 102 includes its own robotic arm configured to position a wafer in, and remove the wafer from, the auxiliary chamber. Thus, in these examples, a wafer is positioned within load lock chamber(s) 102 (e.g., by robotic arm 104) after the wafer is implanted with ions by the ion implanter, and then the robotic arm of load lock chamber(s) 102 positions the wafer at post-implantation station 112 within the auxiliary chamber. After post-implantation station 112 heats or cools the wafer within the auxiliary chamber, the robotic arm of load lock chamber(s) 102 moves the wafer and positions it back within load lock chamber(s) 102.

Similar to pre-implantation station 108, in some examples, post-implantation station 112 includes a cooling E-chuck that cools a wafer at post-implantation station 112. Further, in some examples, pre-implantation station 108 includes a coolant release valve configured to cool a wafer by releasing a coolant (e.g., liquid nitrogen) into the interior of the processing chamber of post-implantation station 112. For example, in a high-temperature ion implantation process where a wafer is heated in pre-implantation station 108 prior to the wafer being implanted with ions by the ion implanter (e.g., to 300 degrees Celsius), the cooling E-chuck and/or the coolant release valve can cool a wafer and bring the wafer's temperature back down to ambient temperature (e.g., 20 to 25 degrees Celsius) after the wafer has been implanted with ions by the ion implanter. Further, in some examples, robotic arm 104 holds the wafer in place while coolant is released into the interior of post-implantation station 112's processing chamber (e.g., without placing the wafer on a wafer stage or E-chuck).

In some examples, post-implantation station 112 includes one or more infrared heating lamps that heat a wafer at post-implantation station 112. For example, in a low-temperature ion implantation process where a wafer is cooled in pre-implantation station 108 prior to the wafer being implanted with ions by the ion implanter (e.g., to −100 degrees Celsius), the one or more infrared heating lamps of post-implantation station 112 can heat the cooled wafer back to ambient temperature after the cooled wafer is implanted with ions by the ion implanter. As with the one or more infrared heating lamps of pre-implantation station 108, exemplary infrared heating lamps of post-implantation station 112 include near infrared heating lamps (which produce infrared light with wavelengths between 780 nm to 1.4 μm), medium infrared heating lamps (which produce infrared light with wavelengths between 1.4 μm to 3 μm), and far infrared heating lamps (which produce infrared light with wavelengths greater than 3 μm to 100 μm).). In some examples, robotic arm 104 holds the wafer in place while the wafer is heated (e.g., without placing the wafer on a wafer stage).

Figure 3:
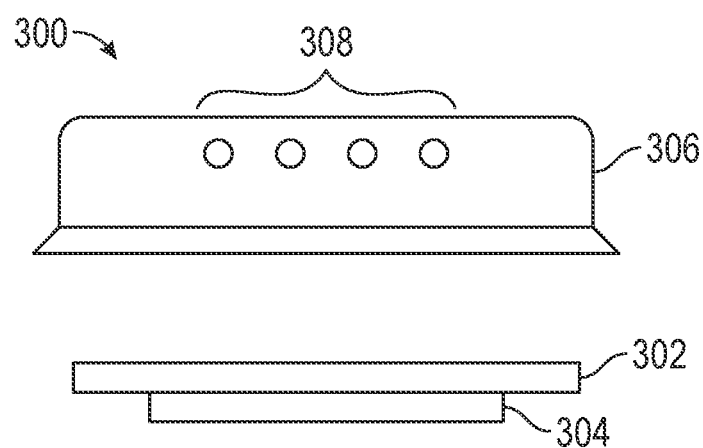
FIG. 3 illustrates a two-dimensional, side perspective view of an infrared heating lamp(s) configuration, according to various examples.

In some examples, the one or more infrared heating lamps of post-implantation station 112 (and/or of pre-implantation station 108) are configured similarly or identically to infrared heating lamp(s) configuration 300 described below with reference to FIG. 3 (e.g., within the processing chamber of pre-implantation station 108 and/or post-implantation station 112, load lock chamber(s) 102, and/or the auxiliary chamber of load lock chamber(s) 102 described above). FIG. 3 illustrates a two-dimensional, side perspective view of an infrared heating lamp(s) configuration, according to various examples. As shown, infrared heating lamp(s) configuration 300 includes wafer 302, stage 304, lamp housing 306, and infrared heating lamps 308. While FIG. 3 illustrates infrared heating lamps 308 as including four infrared heating lamps, in some examples, infrared heating lamp(s) configuration 300 includes more or less infrared heating lamps. Further, in some examples, a distance between infrared heating lamps 308 and wafer 302 can vary based on where infrared heating lamp(s) configuration 300 is positioned. For example, a distance between infrared heating lamps 308 and wafer 302 can be greater when infrared heating lamp(s) configuration 300 is positioned within post-implantation station 112's processing chamber than when infrared heating lamp(s) configuration 300 is positioned within load lock chamber(s) 102 and/or the auxiliary chamber of load lock chamber(s) 102.

Returning to FIG. 1, in some examples, pre-implantation station 108 and/or post-implantation station 112 are further configured to measure a current temperature of a wafer. For example, pre-implantation station 108 and/or post-implantation station 112 can be configured to perform one or more of the methods described below with reference to FIGS. 9-12 to determine the current temperature of the wafer. In some examples, pre-implantation station 108 and/or post-implantation station 112 include various temperature measurement components that are used to measure a temperature of a wafer. In some examples, the various temperature measurement components included in the pre-implantation station 108 and/or post-implantation station are based on the one or more methods that pre-implantation station 108 and/or post-implantation station 112 use to measure a temperature of a wafer. In other words, pre-implantation station 108 and/or post-implantation station 112 can include different temperature measurement components depending on the one or more methods used to measure a temperature of the wafer.

In some examples, both pre-implantation station 108 and post-implantation station 112 are configured to measure a current temperature of a wafer. In some of these examples, pre-implantation station 108 and post-implantation station 112 are both configured to use the same method to determine the current temperature of the wafer and thus include the same temperature measurement components. In other examples, pre-implantation station 108 and post-implantation station 112 are configured to use different methods to determine the current temperature of the wafer and thus include different temperature measurement components based on the one or more methods that they are each configured to use.

In some examples, the various temperature measurement components are configured and operated in such a way that allows pre-implantation station 108 and/or post-implantation station 112 to quickly and continuously measure a temperature of a wafer, even while pre-implantation station 108 and/or post-implantation station 112 heats or cools the wafer (as will be described in greater detail below with respect to FIGS. 4-7 and 9-12). For example, although it may only take pre-implantation station 108 and/or post-implantation station 112 several seconds to heat or cool a wafer to a desired temperature (e.g., less than 10 seconds), pre-implantation station 108 and/or post-implantation station 112 can measure a temperature of the wafer (using the various temperature measurement components and controller 114) multiple times within the time it takes to heat or cool the wafer to a desired temperature. For example, the pre-implantation station 108 and/or post-implantation station can measure a temperature of the wafer once every second, or more than once a second, so as to provide a continuous and dynamic wafer temperature measurement.

Note, for the sake of simplicity, FIGS. 4-7 and 9-13 and their corresponding descriptions below refer only to post-implantation configuration 112 instead of both pre-implantation station and post-implantation station. However, the configurations described with reference to FIGS. 4-7 and the processes for determining a temperature of a wafer described with reference to FIGS. 9-13 also apply to pre-implantation station 108. In other words, as mentioned above, pre-implantation station 108 can include temperature measurement components in accordance with FIGS. 4-7 and can be configured to perform one or more of the methods illustrated in FIGS. 9-13 despite the fact that those figures and their corresponding descriptions do not refer to a pre-implantation station.

Figure 4:
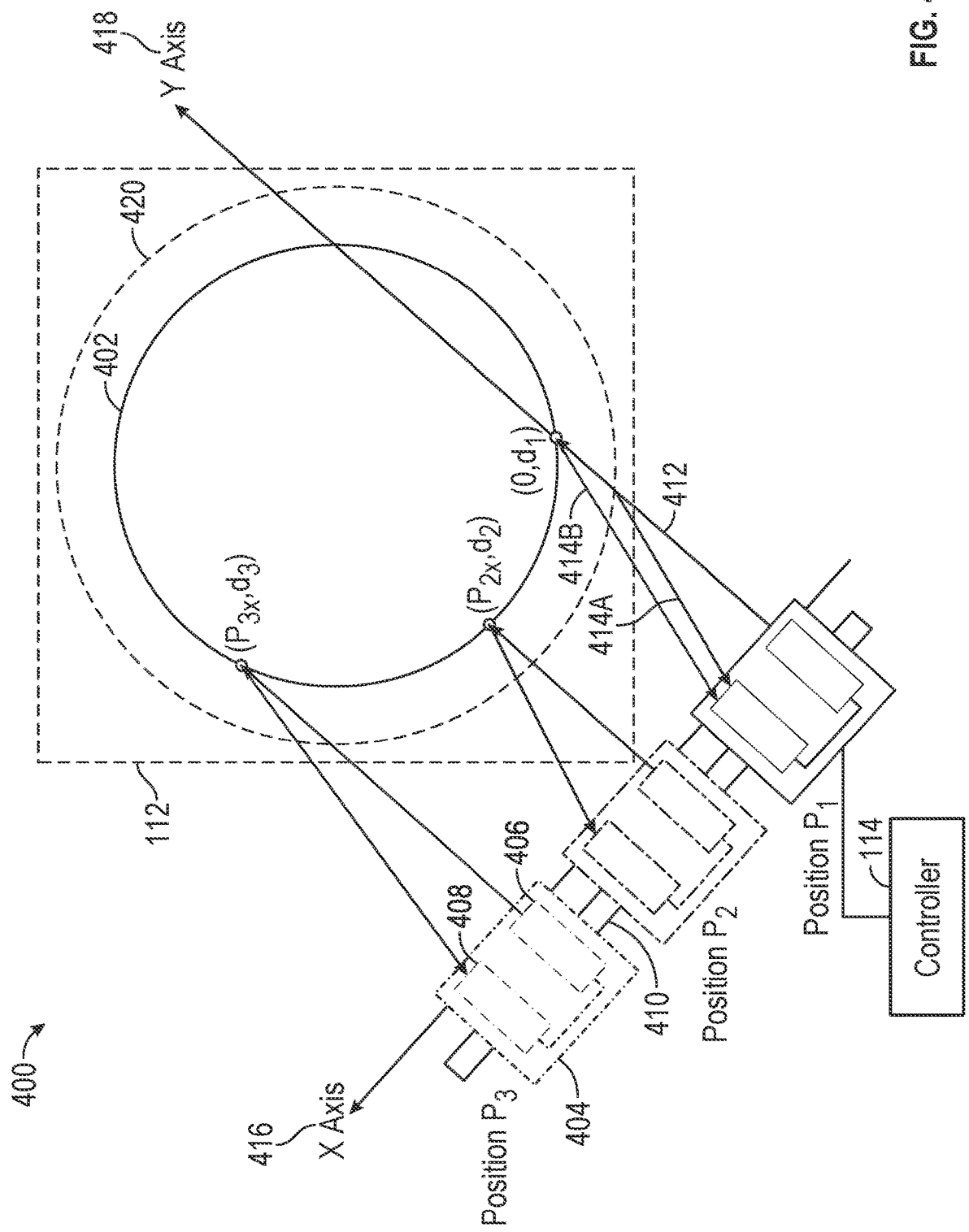
FIG. 4 illustrates a two-dimensional, top-down perspective view of a post-implantation station configuration for measuring a temperature of a wafer using a single-laser method, according to various examples.

FIG. 4. illustrates a two-dimensional, top-down perspective view of a post-implantation station configuration for measuring a temperature of a wafer using a single-laser method (e.g., process 900 described below with reference to FIG. 9), according to various examples. Post-implantation station configuration 400 includes various temperature measurement components, such as laser unit 404, laser source 406, laser sensor 408, and laser unit track 410. In some examples, laser source 406 is a narrow-band, tunable laser source. For example, laser source 406 can generate a laser beam having a wavelength between 400 nm and 779 nm. In other examples, laser source 406 can be a near infrared laser source (e.g., which produces a laser beam having a wavelength between 780 nm to 1.4 µm), a mid-infrared laser source (e.g., which produces a laser beam having a wavelength between 1.4 µm to 3 µm), or a far infrared laser source (e.g., which produces a laser beam having a wavelength between 3 µm to 100 µm). Note, the wavelength of a laser beam generated by laser source 406 is not limited to the example wavelength ranges described above. Laser sensor 408 is a time-of-flight laser sensor that is configured to determine a distance from an object (e.g., a wafer) based on an amount of time it takes for a laser beam that laser source 406 generates/directs to the object to reflect off of the object and return to laser sensor 408.

Laser source 406 is communicatively connected (e.g., via one or more wired connections) to laser sensor 408. Further, controller 114 is communicatively connected (e.g., via one or more wired connections) to laser source 406 and laser sensor 408. In some examples, laser source 406 and laser sensor 408 are not communicatively connected to one another.

As shown in FIG. 4, the dimensions (e.g., diameter, thickness, etc.) of a semiconductor wafer (in this case, a silicon wafer) change as the wafer's temperature changes. For example, in a high-temperature ion implantation process, a wafer's dimensions can expand as a result of the wafer's high temperature (e.g., 300 degrees Celsius). The wafer's dimensions can then reduce in size as the wafer cools down. Alternatively, in a low-temperature ion implantation process, a wafer's dimensions can reduce as a result of the wafer's low (e.g., −60 degrees Celsius). The wafer's dimensions can then increase in size as the wafer heats up. The single-laser method utilizes this material characteristic of semiconductor materials to determine a current temperature of a wafer based on the wafer's current diameter. Thus, FIG. 4 illustrates wafer 402 and expanded wafer 420 (which has a larger diameter than wafer 402).

As also shown in FIG. 4, the various temperature measurement components of post-implantation station configuration 400 are positioned outside of the processing chamber of post-implantation station 112. The temperature measurement components of post-implantation station configuration 400 can be similarly positioned in the examples described above wherein post-implantation station 112 is located within load lock chamber(s) 102 or an auxiliary chamber.

During operation, wafer 402/expanded wafer 420 is positioned at post-implantation station 112 (e.g., within the processing chamber of post-implantation station 112). For example, wafer 402/expanded wafer 420 can be placed on a wafer stage or a cooling E-chuck (e.g., in a high-temperature ion implantation process). Wafer 402/expanded wafer 420 is similar or identical to wafer 216 described above with reference to FIG. 2. In this case, wafer 402/expanded wafer 420 is a silicon wafer. In some examples, wafer 402/expanded wafer 420 is made of one or more other semiconductor materials, such as germanium, gallium arsenide, silicon carbide, gallium nitride, gallium phosphide, cadmium sulphide, and so forth.

In particular, as shown in FIG. 4, laser unit 404 (which includes laser source 406 and laser sensor 408) moves along laser unit track 410, which is parallel to X Axis 416. In some examples, laser unit 404's movement along laser unit track 410 is controlled by controller 114. As laser unit 404 travels along laser unit track 410, laser source 406 directs a laser beam to a point on an edge of wafer 402 (or expanded wafer 420) and laser sensor 408 receives the laser beam (after the laser beam reflects of the edge of the wafer) at Position 1, Position 2, and Position 3. For example, as shown at Position 1, laser source 406 directs laser beam 412 to a point on the edge of wafer 402 or expanded wafer 420 (e.g., via a view port of the processing chamber). Laser beam 412 travels parallel to Y Axis 418, reflects off of the edge of expanded wafer 420 (e.g., as laser beam 414A) or wafer 402 (e.g., as laser beam 414B), and returns to laser sensor 408. In some examples, after the above process is performed at Position 1, Position 2, and Position 3, laser unit 410 can return to Position 1 to repeat the process at each position. In some examples, instead of returning to Position 1 to repeat the above process, laser unit 410 can repeat the above process starting at Position 3 and subsequently repeat the process once again after it returns to Position 1.

Controller 114 determines a distance between laser source 406 and a point on the edge of the wafer based on an amount of time it takes for a laser beam from laser source 406 to reflect off the edge of wafer 402/expanded wafer 420 and return to laser sensor 408. For example, as shown in FIG. 4, controller 114 can determine distance $d_1$, $d_2$, and $d_3$ between laser source 406 and wafer 402 (e.g., as a coordinate on Y Axis 418) at Position 1, Position 2, and Position 3, respectively. Then, as will be explained in greater detail below with reference to FIG. 9, controller 114 uses the three distance measurements from each laser source 406 position, as well as laser source 406's horizontal position along X Axis 416 at each position (e.g., as a coordinate on X Axis 416), to determine a current temperature of wafer 402/expanded wafer 420. For example, controller 114 can determine a center point of wafer 402/expanded wafer 420 (e.g., an X Axis 416 coordinate and Y Axis 418 coordinate) based on the X Axis 416 and Y Axis 418 coordinates at each position. After, controller 114 can determine the diameter of wafer 402/expanded wafer 420 based on the center point. Lastly, controller 114 can determine the current temperature of wafer 402/expanded wafer 420 based on the determined diameter of wafer 402/expanded wafer 420 and a coefficient of linear thermal expansion for silicon.

The various temperature measurement components of FIG. 4 (e.g., laser source 406, laser sensor 408, etc.) can be configured to quickly and continuously acquire and provide the above information (e.g., X Axis 416 horizontal position coordinates, Y Axis 418 distance coordinates, etc.) as wafer 402/expanded wafer 420 heats up/cools down such that controller 114 can continuously determine and provide a current wafer temperature.

Further, although not illustrated in FIG. 4, post-implantation configuration 400 can include one or more infrared heating lamps (e.g., in a heating lamp housing), a cooling E-chuck, and/or a coolant release valve for releasing a coolant (e.g., as described above with reference to FIG. 1). However, regardless of which heating/cooling components that post-implantation station configuration 400 includes, a current temperature of wafer 402/expanded wafer 420 is still determined according to the process described above (and described in greater detail below with reference to FIG. 9).

Figure 5:
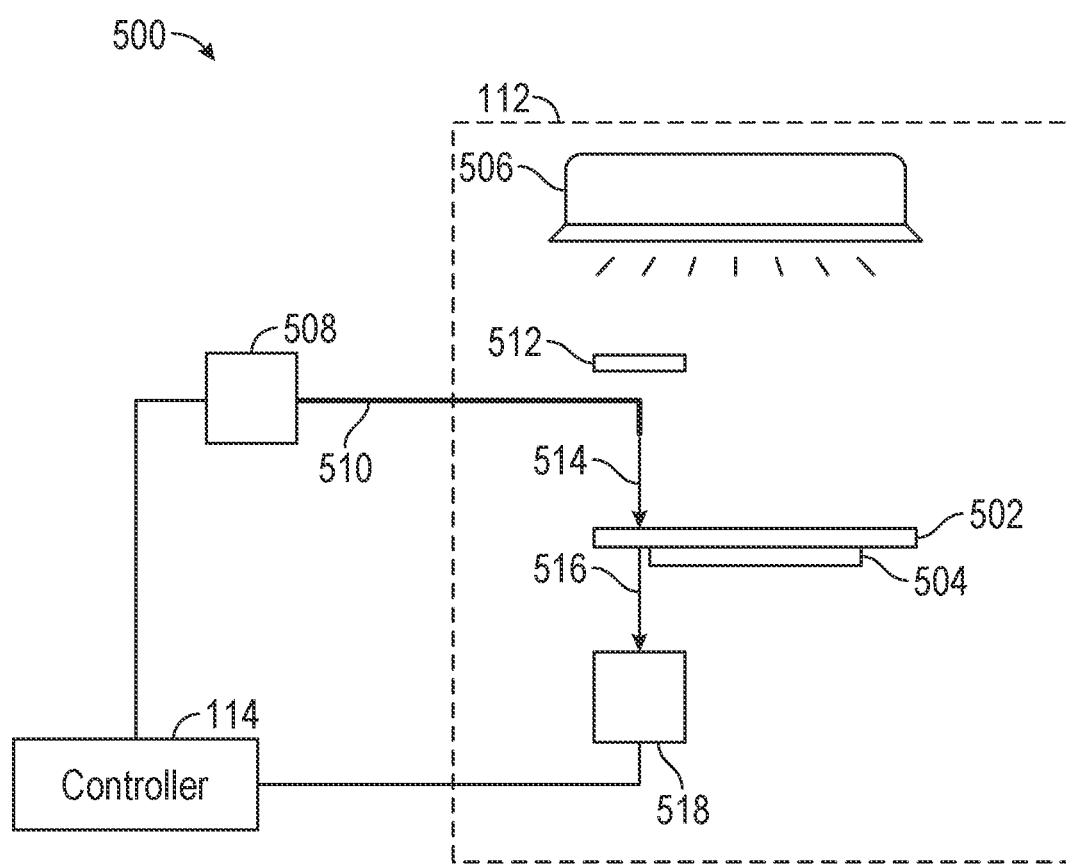
FIG. 5 illustrates a two-dimensional, side perspective view of a post-implantation station configuration for measuring a temperature of a wafer using a bandgap method, according to various examples.

FIG. 5 illustrates a two-dimensional, side perspective view of a post-implantation station configuration for measuring a temperature of a wafer using a bandgap method (e.g., process 1000 described below with reference to FIG. 10), according to various examples. Post-implantation station configuration 500 includes various temperature measurement components, such as laser source 508, optical fiber 510, infrared barrier 512, and photodetector 518. Post-implantation station configuration 500 further includes wafer stage 504 and heating lamp housing 506 (including one or more infrared heating lamps).

In some examples, laser source 508 is a narrow-band, tunable laser source. For example, laser source 406 can generate a laser beam having a wavelength between 400 nm and 779 nm. In other examples, laser source 508 can be a near infrared laser source (e.g., which produces a laser beam having a wavelength between 780 nm to 1.4 μm), a mid-infrared laser source (e.g., which produces a laser beam having a wavelength between 1.4 μm to 3 μm), or a far infrared laser source (e.g., which produces a laser beam having a wavelength between 3 μm to 100 μm). Note, the wavelength of a laser beam generated by laser source 508 is not limited to the example wavelength ranges described above. Further, in some examples, the wavelength of a laser beam generated by laser source 508 is based on the semiconductor material that a wafer is made of For example, the wavelength of a laser beam generated by laser source 508 when a wafer is made of silicon may be different from a laser beam generated by laser source 508 when a wafer is made of gallium arsenide.

Photodetector 518 is a broadband photodetector. In some examples, photodetector 518 is a narrowband detector. In yet other examples, photodetector 518 is a photodetector (e.g., broadband or narrowband) that tracks the wavelength at which laser source 508 is generating a laser beam. In general, photodetector 518 can be a photoemission photodetector, a semiconductor photodetector, a thermal photodetector, or a photochemical photodetector. More specifically, photodetector 518 can be a photodiode, a thermopile, a bolometer, a pyrometer, or any other type of photodetector. In some examples, photodetector 518 incorporates one or more filters that remove extraneous wavelengths of light (e.g., light that falls outside of a predetermined wavelength range). In some examples, photodetector 518 has an acceptance angle limited to receive only light from a laser beam generated by laser source 508 (or, at the very least, to reduce an amount of light that is not generated by laser source 508 that photodetector 518 receives). Controller 114 is communicatively connected to laser source 508 and photodetector 518 (e.g., via one or more wired connections).

Infrared barrier 512 is a rectangular-shaped flat plate made of an infrared-blocking material (e.g., a material that reflects, absorbs, and/or blocks more infrared light than the material transmits, and thus reduces an amount of infrared light that passes through the material). For example, infrared barrier 512 can be made of metal (e.g., aluminum), a material coated in metal, graphite, infrared-opaque polymer(s), ceramic, heat-absorbing glass, and/or any other material that reflects, absorbs, and/or blocks more infrared light than it transmits. In some examples, infrared barrier 512 is a circular-shaped flat plate, a triangular-shaped flat plate, a square-shaped flat plate, a diamond-shaped flat plate, a hexagon-shaped flat plate, or an octagon-shaped flat plate. Further, in some examples, infrared barrier 512 is another three-dimensional shape other than a flat plate. For example, a thickness/height of infrared barrier 512 can be increased such that infrared barrier is a cube, a prism, a cone, etc. As another example, infrared barrier 512 can be a sphere.

In some examples, a size of infrared barrier 512 (e.g., an area of a side of infrared barrier 512 that faces heating lamp housing 506) is based on an area of a shadow (created via the infrared light from the one or more heating lamps of heating lamp housing 506) that infrared barrier 512 casts on a first side of wafer 502. Specifically, in some examples, a size of infrared barrier 512 must be at least large enough to cast a shadow on the first side of wafer 502 that encompasses a spot of laser beam 514. For example, if a spot of laser beam 514 on the first side of wafer 502 has a diameter of 1 mm (i.e., an area of 0.79 mm$^2$), a size of a circular-shaped flat plate infrared barrier 512 must be large enough to cast a shadow (on the first side of wafer 502) having a diameter that is at least greater than 1 mm (e.g., 1.5 mm, 2 mm, etc.). In this manner, infrared barrier 512 reduces (or more preferably eliminates) an amount of infrared light from the one or more infrared heating lamps that directly strikes the portion of the first side of wafer 502 where the spot of laser beam 514 strikes. Note, one of ordinary skill in the art would appreciate that the area of the shadow that infrared barrier 512 casts on wafer 502 is also based on a distance between infrared barrier 512 and a first side of wafer 502. Thus, the size of infrared barrier 512 in the examples above is also based on a distance between infrared barrier 512 and the first side of wafer 502.

As shown in FIG. 5, laser source 508 and a first portion of optical fiber 510 are positioned outside of the processing chamber of post-implantation station 112 whereas wafer stage 504, heating lamp housing 506, a second portion of optical fiber 510, infrared barrier 512, and photodetector 518 are positioned within the processing chamber of post-implantation station 112. The above components of post-implantation station configuration 500 can be similarly positioned in the examples described above wherein post-implantation station 112 is located within load lock chamber(s) 102 or an auxiliary chamber. For example, if post-implantation station 112 is located within load lock chamber(s) 102, laser source 508 and a first portion of optical fiber 510 can be positioned outside of load lock chamber(s) 102 while wafer stage 504, heating lamp housing 506, a second portion of optical fiber 510, infrared barrier 512, and photodetector 518 are positioned within load lock chamber(s) 102.

During operation, wafer 502 is positioned at post-implantation station 112 (e.g., within the processing chamber of post-implantation station 112) on wafer stage 504. In some examples, wafer 502 is placed on a cooling E-chuck (e.g., in a high-temperature ion implantation process) instead of wafer stage 504. Wafer 502 is similar or identical to wafer 216 described above with reference to FIG. 2. In this case, wafer 502 is a silicon wafer. In some examples, wafer 502 is made of one or more other semiconductor materials, such as germanium, gallium arsenide, silicon carbide, gallium nitride, gallium phosphide, cadmium sulphide, and so forth.

The bandgap (also known as the band gap energy or energy gap) of a semiconductor wafer (in this case, a silicon wafer) changes as a function of temperature. Specifically, the bandgap of semiconductor materials (measured in electron volts (eV)) decreases as the temperature of the semiconductor materials increases. Thus, the bandgap method for determining a current temperature of a wafer utilizes this material characteristic of semiconductors to determine a current temperature of a wafer based on the wafer's current bandgap value.

In particular, as shown in FIG. 5, laser source 508 generates laser beam 514, which is directed to an interior of the processing chamber of post-implantation station 112 by optical fiber 510. An output end of optical fiber 510 then directs laser beam 514 to a spot on a first side of wafer 502. Laser beam 514 strikes the spot on the first side of wafer 502 and is transmitted from a second side of wafer 502 as laser beam 516. Photodetector 518 then collects transmitted laser beam 516 and measures an intensity of transmitted laser beam 516.

As shown, infrared barrier 512 is positioned between heating lamp housing 506 and wafer 502, and directly above the output end of optical fiber 510. In some examples, infrared barrier 512 is held in this position using one or more support structures. For example, infrared barrier 512 can be held in the position shown in FIG. 5 by a support arm having a first and second end that is connected/attached to infrared barrier 512 at the first end and connected/attached to the processing chamber of post-implantation station 112 at the second end.

As mentioned above, infrared barrier 512 reflects, absorbs, and/or blocks infrared light and is positioned such that it casts a shadow on a first side of wafer 502 that is large enough to encompass a spot of laser beam 514. Thus, infrared barrier 512 reduces (or more preferably, eliminates) an amount of infrared light that directly strikes the spot on the first side of wafer 502 that laser beam 514 strikes. In this manner, infrared barrier 512 reduces an amount of infrared light that is transmitted through the spot on the first side of wafer 502 and subsequently collected by photodetector 518 while still allowing the infrared light to directly strike (and heat) the portions of the first side of wafer 502 that are not covered by infrared barrier 512. Infrared light can create "noise" (e.g., additional/undesired intensity measurements) when photodetector 518 measures an intensity of transmitted laser beam 516. Thus, reducing (or more preferably, eliminating) an amount of infrared light that photodetector 518 collects allows photodetector 518 to more accurately measure an intensity of transmitted laser beam 516.

While laser beam 514 strikes the spot on the first side of wafer 502 (and photodetector 518 collects transmitted laser beam 516), controller 114 varies (e.g., increases or decreases) a frequency of laser beam 514 (e.g., via tunable laser source 508) across a predefined frequency range (e.g., $2.72 \times 10^{14}$ Hz to $2.76 \times 10^{14}$ Hz). As controller 114 varies the frequency of laser beam 514, an amount of laser beam 514 that wafer 502 absorbs will change (e.g., increase or decrease) and thus the intensity of transmitted laser beam 516 will also change (as laser beam absorption and transmission are inversely related). For example, as wafer 502's absorption of laser beam 514 increase, the intensity of transmitted laser beam 516 decreases. After controller 114 varies the frequency of laser beam 514 across the predefined frequency range, controller 114 generates an absorption profile of wafer 502 across the predefined frequency range based on photodetector 518's measurements of transmitted laser beam 516's intensity across the predefined frequency range. In some examples, controller 114 generates the absorption profile of wafer 502 while controller 114 varies the frequency of laser beam 514.

As will be explained in greater detail below with reference to FIG. 10, controller 114 determines a current temperature of wafer 502 based on the generated absorption profile. For example, if controller 114 tunes laser source 508 to scan the frequency of laser beam 514 from below the frequency corresponding to wafer 502's bandgap (i.e., the bandgap frequency) to above wafer 502's bandgap frequency, there will be a noticeable change in wafer 502's absorption of laser beam 514 at the bandgap frequency. Specifically, the absorption profile will indicate a low absorption by wafer 502 (i.e., a high transmitted laser beam 516 intensity) when laser source 508 is tuned to a frequency below wafer 502's bandgap frequency. However, the absorption profile will indicate a dramatic increase in wafer 502's absorption of laser beam 514 (i.e., a dramatic decrease in the intensity of transmitted laser beam 516) once laser source 508 is tuned to a frequency that exceeds wafer 502's bandgap frequency. Laser source 508's frequency at the point of the dramatic increase in wafer 502's absorption of laser beam 514 represents the bandgap frequency of wafer 502 at wafer 502's current temperature.

Controller 114 then determines the current temperature of wafer 502 based on wafer 502's determined bandgap frequency. Note, this current temperature determination is also based on wafer 502's material (in this case, silicon). In particular, the determined bandgap frequency may correspond to a different wafer 502 temperature based on the material wafer 502 is made of. For example, a determined bandgap frequency can correspond to a first temperature for a silicon wafer while also corresponding to a second temperature for a gallium arsenide wafer.

The various temperature measurement components of FIG. 5 (e.g., laser source 508, photodetector 518, etc.) can be configured to quickly and continuously acquire and provide the above information (e.g., frequency of laser beam 514, intensity of laser beam 516, etc.) as wafer 502 heats up/cools down such that controller 114 can continuously determine and provide a current wafer temperature. For example, once controller 114 generates an absorption profile of wafer 502 across a predefined frequency, controller 114 can once again begin tuning laser source 508 to scan the frequency of laser beam 514 from a low frequency to a high frequency (and photodetector 518 can continue measuring an intensity of transmitted laser beam 516) in order to generate another absorption profile of wafer 502. In this manner, controller 114 can continually generate absorption profiles of wafer 502 and thus continually determine wafer 502's current temperature until wafer 502 reaches a desired temperature.

Note, while FIG. 5 illustrates infrared barrier 512 positioned between heating lamp housing 506 and wafer 502, in some examples, infrared barrier 512 is positioned proximate to (e.g., directly above) photodetector 518 (or an input end of a second optical fiber described in greater detail below). In these examples, infrared barrier 512 is a filter that transmits transmitted laser beam 516 but reflects, blocks, and/or absorbs infrared light generated by the one or more infrared heating lamps of infrared heating lamp housing 506. In some examples, the filter is a dielectric mirror, such as a broadband hot mirror filter. In other examples, the filter is a dichroic mirror, such as a longpass dichroic mirror filter. For example, if a wavelength of transmitted laser beam 516 is expected to range from 1000 nm to 1200 nm, infrared barrier 512 can be a broadband hot mirror filter or a longpass dichroic mirror filter that transmits infrared light having a wavelength between 1000 nm and 1200 nm while reflecting, blocking, and/or absorbing the infrared light generated by the one or more infrared heating lamps. Note, in these examples, in order for the filter to successfully reduce an amount of infrared light generated by the one or more infrared heating lamps that photodetector 518 (or the input end of the second optical fiber) collects, a wavelength spectrum of the infrared light generated by the one or more heating lamps should not overlap with the wavelength range that the filter transmits, as this could result in the filter transmitting the infrared light generated by the one or more infrared heating lamps. For example, in the example above wherein the broadband hot mirror filter/longpass dichroic mirror filter transmits infrared light having a wavelength between 1000 nm and 1200 nm, the one or more heating lamps should only generate infrared light that does not have a wavelength between 1000 nm and 1200 nm.

In some examples, post-implantation configuration 500 does not include infrared barrier 512. In these examples, post-implantation configuration 500 utilizes other components and/or processes to reduce an amount of infrared light that photodetector 518 collects when collecting transmitted laser beam 516. For example, controller 114 can be communicatively connected to heating lamp housing 506 (and thus the one or more infrared heating lamps included therein) such that controller 114 can be configured to turn off the one or more infrared heating lamps while photodetector 518 collects transmitted laser beam 516 (e.g., as described in greater detail below with reference to step 812 of FIG. 8). In some examples, post-implantation configuration 500 utilizes other components and/or processes to reduce an amount of infrared light that photodetector 518 collects when collecting transmitted laser beam 516 in addition to infrared barrier 512.

Moreover, while FIG. 5 illustrates photodetector 518 within the processing chamber of post-implantation station 112, in some examples, photodetector 518 is positioned outside of the processing chamber of post-implantation station 112 (or load lock chamber(s) 102/the auxiliary chamber when post-implantation station 112 is positioned therein). In these examples, an input end of a second optical fiber is positioned proximate to the second side wafer 502 (e.g., where photodetector 518 is positioned in FIG. 5) and an output end of the second optical fiber is connected to photodetector 508, such that a first portion of the second optical fiber is within the processing chamber and a second portion of the optical fiber is outside of the processing chamber. The input end of the second optical fiber faces the second side of wafer 502 so that the second optical fiber collects transmitted laser beam 516 (i.e., via the input end), directs transmitted laser beam 516 to photodetector 518

(positioned outside of the processing chamber), and provides transmitted laser beam 516 to photodetector 518 (e.g., via the output end). Photodetector 518 then measures an intensity of transmitted laser beam 516 as described above.

As mentioned above with reference to FIG. 1, in some examples, post-implantation station 112 includes a cooling E-chuck and/or a coolant release valve that are configured to cool a wafer (e.g., in high-temperature ion implantation process). In these examples, post-implantation configuration 500 does not include infrared barrier 512 and heating lamp housing 506 (or the one or more infrared heating lamps included therein). Further, in the examples where post-implantation station 112 includes a cooling E-chuck, post-implantation configuration 500 does not include wafer stage 504. Rather, in these examples, wafer 502 is positioned on the cooling E-chuck (similarly to how wafer 502 is positioned on wafer stage 504) in order for the cooling E-chuck to cool the wafer. However, despite the above alterations to post-implantation station configuration 500 in these examples, a current temperature of wafer 502 is still determined according to the process described above (and described in greater detail below with reference to FIG. 10).

Figure 6:
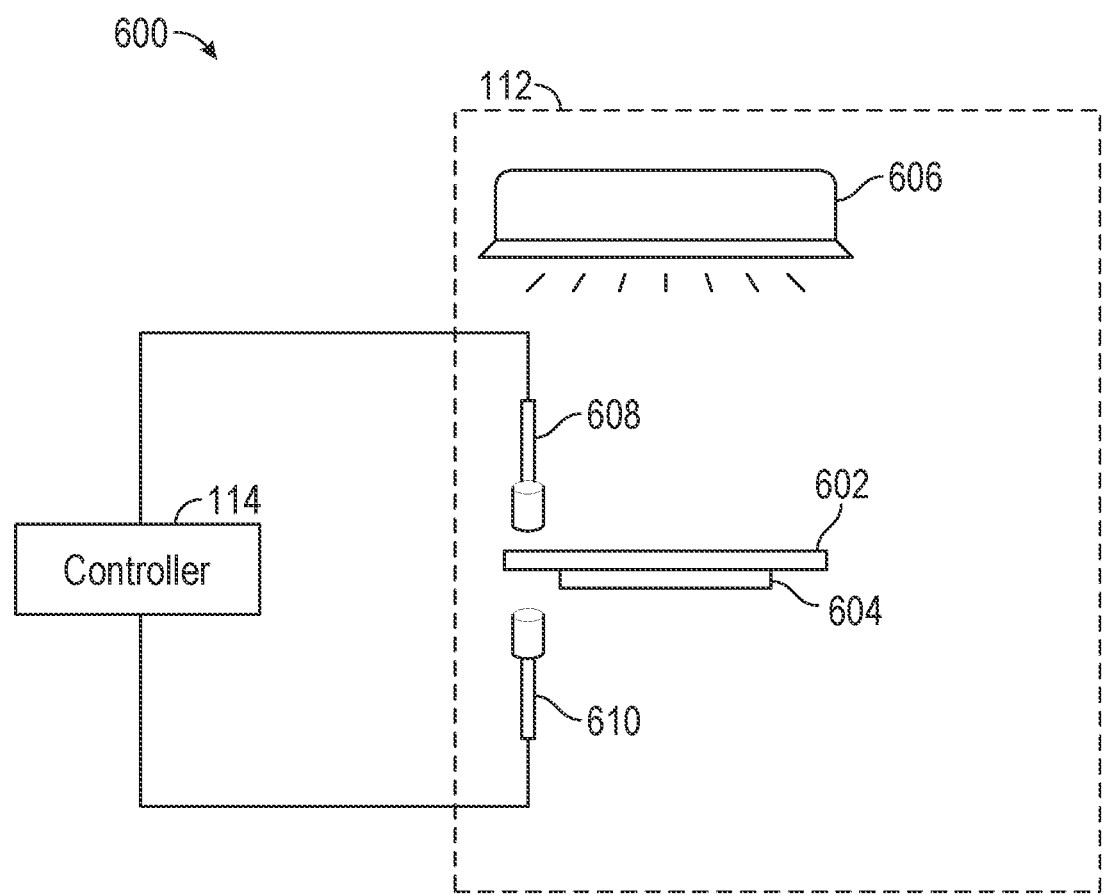
FIG. 6 illustrates a two-dimensional, side perspective view of a post-implantation station configuration for measuring a temperature of a wafer using a capacitance method, according to various examples.

FIG. 6 illustrates a two-dimensional, side perspective view of a post-implantation station configuration for measuring a temperature of a wafer using a capacitance method (e.g., process 1100 described below with reference to FIG. 11), according to various examples. Post-implantation station configuration 600 includes two temperature measurement components—top capacitive sensor 608 and bottom capacitive sensor 610. Capacitive sensors 608 and 610 are non-contact, object detection capacitive sensors. In some examples, capacitive sensors 608 and 610 are non-contact, level detection capacitive sensors. Post-implantation station configuration 600 further includes wafer stage 604 and heating lamp housing 606 (including one or more infrared heating lamps). In some examples, post-implantation station configuration 600 does not include wafer stage 604. In these examples, a robotic arm (e.g., robotic arm 104) holds a wafer in a fixed position between capacitive sensors 608 and 610. Controller 114 is communicatively connected to top capacitive sensor 608 and bottom capacitive sensor 610 (e.g., via one or more wired connections).

As shown in FIG. 6, wafer stage 604, heating lamp housing 606, top capacitive sensor 608, and bottom capacitive sensor 610 are all positioned within the processing chamber of post-implantation station 112. The above components of post-implantation station configuration 600 can be similarly positioned in the examples described above wherein post-implantation station 112 is located within load lock chamber(s) 102 or an auxiliary chamber. For example, if post-implantation station 112 is located within load lock chamber(s) 102, wafer stage 604, heating lamp housing 606, and capacitive sensors 608 and 610 can be positioned within load lock chamber(s) 102.

During operation, wafer 602 is positioned at post-implantation station 112 (e.g., within the processing chamber of post-implantation station 112) on wafer stage 604. In some examples, wafer 602 is placed on a cooling E-chuck (e.g., in a high-temperature ion implantation process) instead of wafer stage 604. Wafer 602 is similar or identical to wafer 216 described above with reference to FIG. 2. In this case, wafer 602 is a silicon wafer. In some examples, wafer 602 is made of one or more other semiconductor materials, such as germanium, gallium arsenide, silicon carbide, gallium nitride, gallium phosphide, cadmium sulphide, and so forth.

Top capacitive sensor 608 and bottom capacitive sensor 610 are positioned near a top side of wafer 602 and a bottom side of wafer 602, respectively. Further, top capacitive sensor 608 and bottom capacitive sensor 610 are positioned at a predefined distance from one another. For example, top capacitive sensor 608 and bottom capacitive sensor 610 can be positioned 5 mm apart from one another, with wafer 602 positioned in between. In some examples, top capacitive sensor 608 and bottom capacitive sensor 610 can be as close as 0.2 mm apart from one another or as far as 6 mm apart from one another. However, at no point does top capacitive sensor 608 or bottom capacitive sensor 610 make contact with wafer 602.

As explained above with respect to the single-laser method of determining a current temperature of a semiconductor wafer (described with reference to FIG. 4), semiconductor wafers change dimensions (e.g., diameter, thickness, etc.) as the temperature of the semiconductor wafers changes. Specifically, the thickness of a semiconductor wafer will increase as the semiconductor wafer heats up and decrease as the semiconductor wafer cools down. Thus, the capacitance method for determining a current temperature of a semiconductor wafer (in this case, a silicon wafer) utilizes this material characteristic of semiconductors to determine a current temperature of a wafer based on the wafer's current thickness.

In particular, top capacitive sensor 608 measures a top capacitance between itself and the top side of wafer 602 while bottom capacitive sensor 610 measures a bottom capacitance between itself and the bottom side of wafer 602. Controller 114 then determines a first distance between top capacitive sensor 608 and the top side of wafer 602, and a second distance between bottom capacitive sensor 610 and the bottom side of wafer 602, based on the top capacitance measurement and the bottom capacitance measurement, respectively. After, controller 114 determines a current thickness of wafer 602 based on the first distance, the second distance, and the predefined distance between top capacitive sensor 608 and bottom capacitive sensor 610. For example, if controller 114 determines a first distance of 80 μm and a second distance of 60 μm, and top capacitive sensor 608 is positioned 300 μm apart from bottom capacitive sensor 610, controller 114 can determine a current wafer thickness of 160 μm (i.e., 300 μm−(60 μm+80 μm)=160 μm). As will be explained in greater detail below with respect to FIG. 11, controller 114 uses the determined current thickness of wafer 602 to determine the current temperature of wafer 602.

As mentioned above, the temperature measurement components of FIG. 6 (e.g., top capacitive sensor 608 and bottom capacitive sensor 610) can be configured to quickly and continuously acquire and provide the above information (e.g., top and bottom capacitance measurements) as wafer 602 heats up/cools down such that controller 114 can continuously determine and provide a current wafer temperature. For example, controller 114 can continually receive top and bottom capacitance measurements from top capacitive sensor 608 and bottom capacitive sensor 610, respectively, and thus continually determine a current thickness of wafer 602. In this manner, controller 114 can continually wafer 602's current temperature until wafer 502 reaches a desired temperature.

Moreover, as mentioned above with reference to FIG. 1, in some examples, post-implantation station 112 includes a cooling E-chuck and/or a coolant release valve that are configured to cool a wafer (e.g., in high-temperature ion implantation process). In these examples, post-implantation configuration 600 does not include heating lamp housing 606 (or the one or more infrared heating lamps included therein). Further, in the examples where post-implantation station 112 includes a cooling E-chuck, post-implantation configuration 600 does not include wafer stage 604. Rather, in these examples, wafer 602 is positioned on the cooling E-chuck (similarly to how wafer 602 is positioned on wafer stage 504) in order for the cooling S-chuck to cool the wafer. However, despite the above alterations to post-implantation station configuration 600 in these examples, a current temperature of wafer 602 is still determined according to the process described above (and described in greater detail below with reference to FIG. 11).

Figure 7:
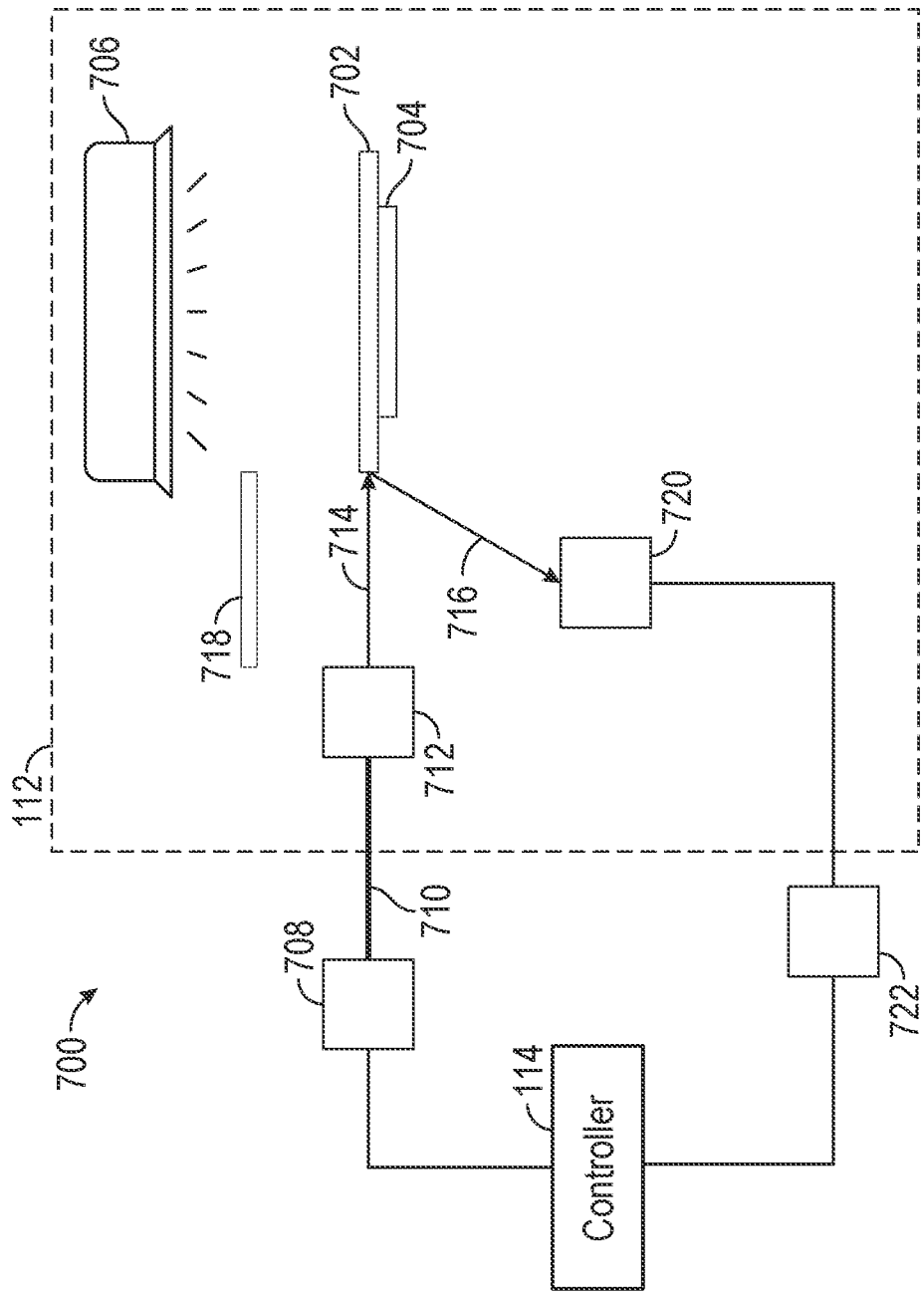
FIG. 7 illustrates a two-dimensional, side perspective view of a post-implantation station configuration for measuring a temperature of a wafer using a photoluminescence method, according to various examples.

FIG. 7 illustrates a two-dimensional, side perspective view of a post-implantation station configuration for measuring a temperature of a wafer using a photoluminescence method (e.g., process 1200 described below with reference to FIG. 12), according to various examples. Post-implantation station configuration 700 includes various temperature measurement components, such as laser source 708, optical fiber 710, optics module 712, infrared barrier 718, spectrophotometer 720, and amplifier 722. Post-implantation station configuration 700 further includes wafer stage 704 and heating lamp housing 706 (including one or more infrared heating lamps). Controller 114 is communicatively connected to laser source 708, spectrophotometer 720, and amplifier 722 (e.g., via one or more wired connections).

In some examples, laser source 708 is a narrow-band, tunable laser source. For example, laser source 708 can generate a laser beam having a wavelength between 400 nm and 779 nm. In other examples, laser source 406 can be a near infrared laser source (e.g., which produces a laser beam having a wavelength between 780 nm to 1.4 μm), a mid-infrared laser source (e.g., which produces a laser beam having a wavelength between 1.4 μm to 3 μm), or a far infrared laser source (e.g., which produces a laser beam having a wavelength between 3 μm to 100 μm). Note, the wavelength of a laser beam generated by laser source 406 is not limited to the example wavelength ranges described above.

Optics module 712 includes one or more lenses that are configured to shape and/or focus a laser beam generated by laser source 708 and received from optical fiber 710 (e.g., laser beam 714). For example, the one or more lenses of optics module 712 can be configured to reduce a spot size of a laser beam received from optical fiber 710. The one or more lenses of optics module 712 are further configured to direct a laser beam to wafer 702 (e.g., to an edge of wafer 702). In some examples, optics module 712 includes an optical chopper that is configured to change a frequency of a laser beam generated by laser source 708. For example, the optical chopper can be a variable frequency rotating disc chopper, a fixed frequency turning fork chopper, or an optical shutter. In this manner, the optical chopper can control a frequency at which a laser beam generated by laser source 708 strikes wafer 702 (and thus allows the frequency to be changed during an implantation process).

Infrared barrier 718 is a rectangular-shaped flat plate made of an infrared-blocking material (e.g., a material that reflects, absorbs, and/or blocks more infrared light than the material transmits, and thus reduces an amount of infrared light that passes through the material). For example, infrared barrier 718 can be made of metal (e.g., aluminum), a material coated in metal, graphite, infrared-opaque polymer(s), ceramic, heat-absorbing glass, and/or any other material that reflects, absorbs, and/or blocks more infrared light than it transmits. In some examples, infrared barrier 718 is a circular-shaped flat plate, a triangular-shaped flat plate, a square-shaped flat plate, a diamond-shaped flat plate, a hexagon-shaped flat plate, or an octagon-shaped flat plate. Further, in some examples, infrared barrier 718 is another three-dimensional shape other than a flat plate. For example, a thickness/height of infrared barrier 718 can be increased such that infrared barrier is a cube, a prism, a cone, etc. As another example, infrared barrier 718 can be a sphere.

In some examples, a portion of infrared barrier 718 extends over the edge of the wafer where laser beam 714 strikes such that infrared barrier 718 reduces (or more preferably, eliminates) an amount of infrared light from the one or more infrared heating lamps that directly strikes a portion of the top surface of wafer 702 proximate to that edge of the wafer. Such sizing/positioning of infrared barrier 718 can reduce (or more preferably, eliminate) an amount of infrared light from the one or more infrared heating lamps that passes in between infrared barrier 718 and wafer 702 (if any) and that is subsequently collected by spectrophotometer 720. Similarly, in some examples, a portion of infrared barrier 718 extends over optics module 712. Such sizing/positioning of infrared barrier 718 can reduce (or more preferably, eliminate) an amount of infrared light from the one or more infrared heating lamps that passes in between infrared barrier 718 and optics module 712 (if any) and that is subsequently collected by spectrophotometer 720.

Spectrophotometer 720 is an infrared spectrophotometer. For example, spectrophotometer 720 can be a Fourier transform infrared (FTIR) spectrophotometer or a dispersive infrared spectrophotometer. In some examples, spectrophotometer 720 is an ultraviolet (UV) light spectrophotometer or an atomic spectrophotometer. In some examples, post-implantation station configuration 700 includes a monochromator instead of spectrophotometer 720. In these examples, the monochromator is configured to receive emitted fluorescent light 716 (instead of spectrophotometer 720) and measure/detect a narrow band of emitted fluorescent light 716 based on the wavelength of emitted fluorescent light 716. For example, the monochromator can be configured to only measure/detect emitted fluorescent light 716 that falls within a predetermined wavelength or frequency range. In some examples, the narrow band of emitted fluorescent light 716 that the monochromator detects/measures is subsequently directed to amplifier 722.

Amplifier 722 is a lock-in amplifier configured to receive signals from spectrophotometer 720, extract and/or amplify signals corresponding to fluorescent light detected by spectrophotometer 720 (i.e., from the signals received from spectrophotometer 720), and provide the extracted fluorescent light signals to controller 114. For example, the lock-in-amplifier can be used to extract and/or amplify a desired range of fluorescent light signals from the detected fluorescent light signals. In the examples described above wherein spectrophotometer 720 is replaced with a monochromator, amplifier 722 receives signals corresponding to detected fluorescent light from the monochromator and subsequently extracts and/or amplifies the desired fluorescent light signals from the received signals.

During operation, wafer 702 is positioned at post-implantation station 112 (e.g., within the processing chamber of post-implantation station 112) on wafer stage 704. In some examples, wafer 702 is placed on a cooling E-chuck (e.g., in a high-temperature ion implantation process) instead of wafer stage 704. Wafer 702 is similar or identical to wafer 216 described above with reference to FIG. 2. In this case, wafer 702 is a silicon wafer. In some examples, wafer 702 is made of one or more other semiconductor materials, such as germanium, gallium arsenide, silicon carbide, gallium nitride, gallium phosphide, cadmium sulphide, and so forth.

As shown in FIG. 7, laser source 708, a first portion of optical fiber 710, and amplifier 722 are positioned outside of the processing chamber of post-implantation station 112 whereas wafer stage 704, heating lamp housing 706, a second portion of optical fiber 710, infrared barrier 718, and spectrophotometer 720 are positioned within the processing chamber of post-implantation station 112. The above components of post-implantation station configuration 700 can be similarly positioned in the examples described above wherein post-implantation station 112 is located within load lock chamber(s) 102 or an auxiliary chamber. For example, if post-implantation station 112 is located within load lock chamber(s) 102, laser source 708, a first portion of optical fiber 710, and amplifier 722 can be positioned outside of load lock chamber(s) 102 while wafer stage 704, heating lamp housing 706, a second portion of optical fiber 710, infrared barrier 718, and spectrophotometer 720 are positioned within load lock chamber(s) 102.

The photoluminescence of semiconductor materials (i.e., the emission of fluorescent light in response to the absorption of electromagnetic radiation (e.g., laser beam energy)) changes as a function of temperature. Thus, as will be explained in greater detail below, the photoluminescence method for determining a current temperature of a wafer utilizes this material characteristic of semiconductors to determine a current temperature of a semiconductor wafer (in this case, a silicon wafer) based on fluorescent light that the wafer emits in response to absorbing energy from a laser beam.

In particular, as shown in FIG. 7, laser source 708 generates laser beam 714, which is directed to optics module 712 (within the processing chamber of post-implantation station 112) by optical fiber 710. The one or more lenses included in optics module 712 focus and reduce the spot size of laser beam 714 such that laser beam 714 only strikes a portion of an edge of wafer 702 (i.e., because the spot size is smaller than wafer 702's thickness). For example, the one or more lenses can reduce the spot size of laser beam 714 such that laser beam 714 strikes an edge of wafer 702 in between an implant layer on the top of wafer 702 and a film layer on the bottom of wafer 702 (i.e., without directly striking the implant or film layers of wafer 702). The one or more lenses of optic module 712 then direct laser beam 714 to an edge of wafer 702. Note, in some examples, optics module 712 is configured and/or positioned to direct laser beam 714 to another portion of the wafer surface. For example, the optics module can be configured and/or positioned to direct laser beam 714 to a spot on a portion of the bottom surface of wafer 702 that is not in contact with wafer stage 704 (e.g., the portion of the bottom surface of wafer 702 that extends beyond wafer stage 704).

While laser beam 714 strikes the edge of wafer 702, wafer 702 absorbs energy (i.e., electromagnetic radiation) from laser beam 714 and in response, emits fluorescent light 716. In some examples, laser beam 714 strikes the edge of wafer 714 for a predetermined period of time. Spectrophotometer 720 detects emitted fluorescent light 716, and provides a plurality of signals including one or more signals representing the detected fluorescent light to amplifier 722. Then, amplifier 722 extracts the one or more signals representing the detected fluorescent light from the plurality of signals received from spectrophotometer 720, and subsequently provides the one or more signals representing the detected fluorescent light to controller 114.

As shown, infrared barrier 718 is positioned between heating lamp housing 706 and spectrophotometer 720. In some examples, infrared barrier 718 is held in this position using one or more support structures. For example, infrared barrier 718 can be held in the position shown in FIG. 7 by a support arm (having a first and second end) that is connected/attached to infrared barrier 718 at the first end and connected/attached to the processing chamber of post-implantation station 112 at the second end.

As mentioned above, infrared barrier 718 reflects, absorbs, and/or blocks infrared light and thus reduces an amount of infrared light that passes through infrared barrier 718. Thus, infrared barrier 718 reduces (or more preferably, eliminates) an amount of infrared light from the one or more infrared heating lamps that is collected by spectrophotometer 720. Infrared light can create "noise" (e.g., additional/undesired intensity measurements) when spectrophotometer 720 measures an intensity and/or wavelength of emitted fluorescent light 716. Thus, reducing (or more preferably, eliminating) an amount of infrared light that spectrophotometer 720 collects allows spectrophotometer 720 to more accurately measure an intensity and/or wavelength of transmitted laser beam 716.

After controller 114 receives the one or more signals representing the detected fluorescent light from amplifier 722, controller 114 determines an intensity profile of the detected fluorescent light based on the one or more signals. Specifically, controller 114 determines an intensity profile (e.g., a bell curve) representing an intensity of the detected fluorescent light as a function of the detected fluorescent light's wavelength. As mentioned above, the photoluminescence of a silicon wafer changes as a function of temperature. Thus, as will be explained in greater detail below with respect to FIGS. 12 and 13, controller 114 determines wafer 702's current temperature based on a peak wavelength and/or a full width at half maximum (FWHM) of an intensity peak in the intensity profile described above, as the peak wavelength and FWHM of the intensity peak are each related to a current temperature of wafer 702.

As used herein, the peak wavelength of a detected fluorescent light intensity profile represents the wavelength at which the detected fluorescent light has the highest intensity. In other words, the peak wavelength of such an intensity profile is the wavelength corresponding to an amplitude of an intensity peak in the intensity profile. Further, as used herein, the FWHM of a detected fluorescent light intensity profile represents a width of an intensity peak in the intensity profile (i.e., on the x-axis of the intensity profile) at half of the maximum intensity (i.e., half of the intensity peak's amplitude). For example, if the peak intensity of an intensity peak is 1, the FWHM is the difference between the two wavelength measurements having an intensity of 0.5. Thus, if the two wavelength measurements having an intensity of 0.5 are 1100 nm and 1200 nm, the FWHM of the intensity profile is 100 nm (i.e., 1200 nm−1100 nm=100 nm).

As mentioned above, the various temperature measurement components of FIG. 7 (e.g., laser source 708, optics module 712, spectrophotometer 720, amplifier 722, etc.) can be configured to quickly and continuously acquire and provide the above information (e.g., one or more signals representing detected fluorescent light) as wafer 702 heats up/cools down such that controller 114 can continuously determine and provide a current wafer temperature. For example, once controller 114 generates an intensity profile of wafer 702, controller 114 can once again begin cause laser source 508 to generate laser beam 714 (and spectrophotometer 720 can continue detecting emitted fluorescent light 716) in order to determine another intensity profile representing a normalized intensity of the detected fluorescent light as a function of the detected fluorescent light's wavelength. In this manner, controller 114 can continually determine intensity profiles representing detected fluorescent light and thus continually determine wafer 702's current temperature until wafer 702 reaches a desired temperature.

Note, while FIG. 7 illustrates infrared barrier 718 positioned between heating lamp housing 706 and wafer 702, in some examples, infrared barrier 718 is positioned proximate to (e.g., directly above) spectrophotometer 720 (or an input end of a second optical fiber described in greater detail below). In these examples, infrared barrier 718 is a filter that transmits emitted fluorescent light 716 but reflects, blocks, and/or absorbs infrared light generated by the one or more infrared heating lamps of infrared heating lamp housing 706. In some examples, the filter is a dielectric mirror, such as a broadband hot mirror filter. In other examples, the filter is a dichroic mirror, such as a longpass dichroic mirror filter. For example, if a wavelength of emitted fluorescent light 716 is expected to range from 900 nm to 1400 nm, infrared barrier 718 can be a broadband hot mirror filter or a longpass dichroic mirror filter that transmits infrared light having a wavelength between 900 nm and 1400 nm while reflecting, blocking, and/or absorbing the infrared light generated by the one or more infrared heating lamps. Note, in these examples, in order for the filter to successfully reduce an amount of infrared light generated by the one or more infrared heating lamps that spectrophotometer 720 (or the input end of the second optical fiber) collects, a wavelength spectrum of the infrared light generated by the one or more heating lamps should not overlap with the wavelength range that the filter transmits, as this could result in the filter transmitting the infrared light generated by the one or more infrared heating lamps. For example, in the example above wherein the broadband hot mirror filter/longpass dichroic mirror filter transmits infrared light having a wavelength between 900 nm and 1400 nm, the one or more heating lamps should only generate infrared light that does not have a wavelength between 900 nm and 1400 nm.

In some examples, post-implantation configuration 700 does not include infrared barrier 718. In these examples, post-implantation configuration 700 utilizes other components and/or processes to reduce an amount of infrared light that spectrophotometer 720 (or a monochromator) collects when collecting emitted fluorescent light 716. For example, controller 114 can be communicatively connected to heating lamp housing 506 (and thus the one or more infrared heating lamps included therein) such that controller 114 can be configured to turn off the one or more infrared heating lamps while spectrophotometer 720 (or a monochromator) collects emitted fluorescent light 716 (e.g., as will be described in greater detail below with reference to step 812 of FIG. 8).

As another example, optics module 712 can include an optical chopper that changes a frequency of a laser beam generated by laser source 708 such that laser beam 714 strikes wafer 702 at the frequency set by the chopper. In some examples, the frequency of laser beam 714 that the chopper sets is predetermined and is maintained throughout the temperature-measurement process. When laser beam 714 strikes wafer 702 at the frequency set by the chopper, emitted fluorescent light 716 will also have the same frequency. Thus, in these examples, spectrophotometer 720 (or a monochromator) will be configured to only detect/measure the intensity of light that is at the frequency set by the chopper. Similarly, in these examples, amplifier 722 is configured to extract and/or amplify detected fluorescent light signals (received from spectrophotometer 720 (or a monochromator)) having the frequency set by the chopper. This in turn prevents spectrophotometer 720 (or a monochromator) and/or amplifier 722 from detecting, measuring, extracting, and/or amplifying infrared light from the one or more heating lamps and/or light from the environment (e.g., because the infrared light/environment light do not have the same frequency as emitted fluorescent light 716). In other words, using a chopper in this manner filters out unwanted infrared light and/or environment light.

Note, in some examples, post-implantation configuration 700 utilizes the above components and/or processes to reduce an amount of infrared light that spectrophotometer 720 (or a monochromator) collects when collecting emitted fluorescent light 716 in addition to infrared barrier 718.

Moreover, while FIG. 7 illustrates spectrophotometer 720 positioned within the processing chamber of post-implantation station 112 and proximate to wafer 702, in some examples, spectrophotometer 720 (or a monochromator) is positioned outside of the processing chamber of post-implantation station 112 (or load lock chamber(s) 102/the auxiliary chamber when post-implantation station 112 is positioned therein). In these examples, an input end of a second optical fiber is positioned proximate to wafer 702 (e.g., proximate to an edge and/or side of wafer 702) and an output end of the second optical fiber is connected to spectrophotometer 720 (or a monochromator), such that a first portion of the second optical fiber is within the processing chamber and a second portion of the optical fiber is outside of the processing chamber. The input end of the second optical fiber faces towards (or in the general direction of) the predefined location on the wafer (i.e., where laser beam 714 strikes wafer 702) so that the second optical fiber collects emitted fluorescent light 716 (i.e., via the input end).

In some examples, the second optical fiber directs emitted fluorescent light 716 to spectrophotometer 720 positioned outside of the processing chamber (or a monochromator positioned outside of the processing chamber) and provides emitted fluorescent light 716 to spectrophotometer 720 (e.g., via the output end). Spectrophotometer 720 (or a monochromator) then detects emitted fluorescent light 716 and generates one or more signals representing emitted fluorescent light 716 as described above.

Moreover, as mentioned above with reference to FIG. 1, in some examples, post-implantation station 112 includes a cooling E-chuck and/or a coolant release valve that are configured to cool a wafer (e.g., in high-temperature ion implantation process). In these examples, post-implantation configuration 700 does not include infrared barrier 718 and heating lamp housing 706 (or the one or more infrared heating lamps included therein). Further, in the examples where post-implantation station 112 includes a cooling E-chuck, post-implantation configuration 700 does not include wafer stage 704. Rather, in these examples, wafer 702 is positioned on the cooling E-chuck (similarly to how wafer 702 is positioned on wafer stage 704) in order for the cooling E-chuck to cool the wafer. However, despite the above alterations to post-implantation station configuration 700 in these examples, a current temperature of wafer 702 is still determined according to the process described above (and described in greater detail below with reference to FIGS. 12 and 13).

Returning to FIG. 1, as mentioned above, ion implantation system 100 further includes controller 114. Controller 114 can be implemented on one or more standalone data processing devices or a distributed network of computers. Further, although controller 114 is illustrated as a single controller in FIG. 1, one of ordinary skill in the art would appreciate that controller 114 can include any number of controllers necessary to perform the controller 114 processes and functions disclosed herein.

As shown, controller 114 includes memory 116, processor(s) 118, and input/output (I/O) interface 120. I/O interface 120 facilitates input and output processing for controller 114. For example, I/O interface 120 can facilitate input and output processing for one or more input devices (e.g., a keyboard, mouse, etc.) and/or one or more output devices (e.g., a display) that are communicatively connected to controller 114 (e.g., via one or more wired connections) and that an operator of ion implantation system 100 can use to observe and control the processes and functions of controller 114. Processor(s) 118 utilize memory 116 to execute the instructions stored therein. In some examples, memory 116 includes random access memory (RAM), including but not limited to volatile RAM (e.g., DRAM, SRAM) and non-volatile RAM (e.g., NAND). In some examples, memory 116 further includes computer-readable storage media. In some examples, the computer-readable storage media are tangible and non-transitory. For example, memory 116 can include high-speed random access memory and can also include non-volatile memory, such as one or more magnetic disk storage devices, flash memory devices, or other non-volatile solid-state memory devices. In some examples, the computer-readable storage media of memory 116 store one or more programs for execution by processor(s) 118, the one or more programs including instructions for performing any of the methods and processes described herein (e.g., with reference to FIGS. 8-14).

Figure 8:
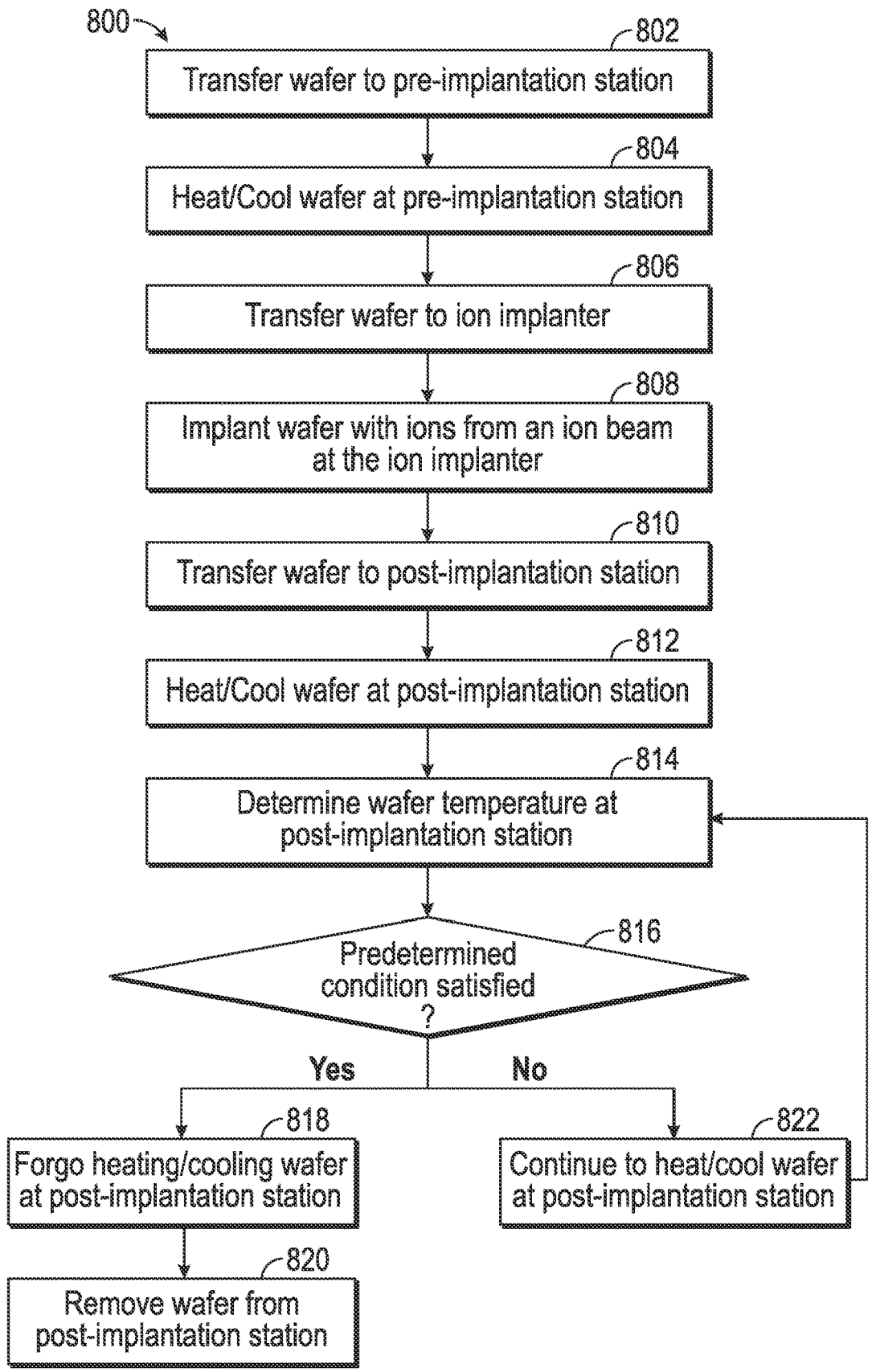
FIG. 8 illustrates a process for measuring a temperature of a wafer within an ion implantation system, according to various examples.

FIG. 8 illustrates a process for measuring a temperature of a wafer within an ion implantation system, according to various examples. In some examples, process 800 is performed by a system similar or identical to system 100, described above with reference to FIGS. 1-7. Process 800 is described below with simultaneous reference to FIGS. 1-7. Note, while FIG. 8 illustrates a process wherein a wafer temperature is determined only at a post-implantation station, in some examples, a wafer temperature is determined at a pre-implantation station (e.g., as described in greater detail below with reference to FIG. 14).

At step 802, process 800 causes a controller (e.g., controller 114) to control a robotic arm (e.g., robotic arm 104) to transfer a wafer (e.g., wafer 216, 402, 420, 502, 602, or 702) from a load lock chamber (e.g., load lock chamber(s) 102) to a pre-implantation station (e.g., pre-implantation station 108). For example, the robotic can position the wafer on a wafer stage located within a processing chamber of the pre-implantation station. As another example, in a low-temperature ion implantation process, the robotic arm can position the wafer on a cooling S-chuck located within the processing chamber of the pre-implantation station.

After the robotic arm positions the wafer at the pre-implantation station, at step 804, process 800 causes the controller to control the pre-implantation station to heat or cool the wafer to a first predetermined temperature. In some examples, process 800 causes the controller to control the pre-implantation station to heat the wafer to a first predetermined temperature (e.g., to 300 degrees Celsius). For example, process 800 can cause the controller to control one or more infrared heating lamps (e.g., infrared heating lamps 308) located within the processing chamber of the pre-implantation station to heat the wafer to the first predetermined temperature. In other examples, process 800 causes the controller to control the pre-implantation station to cool the wafer to a first predetermined temperature (e.g., −100 to 0 degrees Celsius). For example, process 800 can cause the controller to control the cooling E-chuck mentioned above and/or a coolant release valve within the processing chamber of the pre-implantation station to cool the wafer to the first predetermined temperature.

At step 806, process 800 causes the controller to control the robotic arm to transfer the wafer (while at the first predetermined temperature) to an ion implanter (e.g., ion implanter 200). For example, process 800 can cause the controller to control the robotic arm to position the wafer on a wafer support structure (e.g., wafer support structure 218) within a processing chamber of the ion implanter (e.g., processing chamber 110). The robotic arm can quickly transfer the wafer to the ion implanter such that the wafer is still at the first predetermined temperature when positioned on the wafer support structure.

At step 808, process 800 causes the controller to control the ion implanter to implant the wafer with ions from an ion beam (e.g., ion beam 205). For example, process 800 can cause the controller to control the ion implanter to generate the ion beam and direct the ion beam to the wafer. Process 800 can also cause the controller to control the wafer support structure to translate and/or rotate in one or more directions such that the ion beam is scanned across the wafer. In some examples, the ion implanter implants the wafer with ions while the wafer is maintained at, or approximately at, the first predetermined temperature (e.g., within 1 degrees Celsius of the first predetermined temperature). For example, the ion implanter can quickly implant the wafer with ions (e.g., in several seconds) such that the wafer is still at the first predetermined temperature when the ion implantation is complete.

After the wafer is implanted with ions at the ion implanter, at step 810, process 800 causes the controller to control the robotic arm to transfer the implanted wafer to a post-implantation station (e.g., post-implantation station 112). For example, process 800 can cause the controller to control the robotic arm to position the wafer on a wafer stage (e.g., wafer stage 504, 604, 704, etc.). Alternatively, process 800 can cause the controller to control the robotic arm to position the wafer on a cooling E-chuck. In some examples, the post-implantation station includes a processing chamber. In these examples, the wafer stage or cooling E-chuck are positioned within the processing chamber. In some examples, the post-implantation station is located within a load lock chamber (e.g., load lock chamber(s) 102), and thus the wafer stage or cooling E-chuck are positioned within the load lock chamber. For example, the wafer stage or cooling E-chuck can be located within the initial load lock chamber from which the robotic arm removed the wafer at step 802 (or another load lock chamber adjacent to the initial load lock chamber). In some examples, the post-implantation station is located within an auxiliary chamber of a load lock chamber, and thus the wafer stage or cooling E-chuck are positioned within the auxiliary chamber. In these examples, process 800 causes the controller to control the robotic arm to position the wafer within the load lock chamber. Then, a robotic arm of the load lock chamber transfers the wafer to the auxiliary chamber and positions the wafer on the wafer stage or cooling E-chuck.

In some examples, the wafer is positioned at the post-implantation station while the wafer is still at the first predetermined temperature. For example, as mentioned above, the wafer can still be at the first predetermined temperature after the wafer is implanted with ions. Thus, in these examples, the robotic arm can quickly transfer the implanted wafer to the post-implantation station such that the wafer is still at the first predetermined temperature when positioned on the wafer stage or cooling E-chuck.

After the wafer is transferred to the post-implantation station, at step 812, process 800 causes the controller to control the post-implantation station to heat or cool the wafer. In some examples (e.g., in a low-temperature ion implantation process), process 800 causes the controller to control the post-implantation station to heat the wafer to a second predetermined temperature (e.g., ambient temperature). For example, process 800 can cause the controller to control one or more infrared heating lamps (e.g., infrared heating lamps 308) of the post-implantation station (e.g., located within the processing chamber, load lock chamber, or auxiliary chamber) to heat the wafer from the first predetermined temperature (e.g., −60 degrees Celsius) to ambient temperature (e.g., 20 to 25 degrees Celsius). In other examples (e.g., in a high-temperature ion implantation process), process 800 causes the controller to control the post-implantation station to cool the wafer to a second predetermined temperature (e.g., ambient temperature). For example, process 800 can cause the controller to control a cooling E-chuck and/or a coolant release valve of the post-implantation station (e.g., located within the processing chamber, load lock chamber, or auxiliary chamber) to cool the wafer from the first predetermined temperature (e.g., 200 degrees Celsius) to ambient temperature.

In some examples, after the robotic arm transfers the wafer to the post-implantation station and before process 800 causes the controller to control the post-implantation station to heat or cool the wafer, process 800 causes the controller to control the post-implantation station (e.g., the temperature measurement components of the post-implantation station) to determine a reference wafer temperature. In these examples, the reference wafer temperature is the wafer's current temperature after being implanted with ions at the ion implanter. In some examples, process 800 causes the controller to determine the reference wafer temperature using one or more of the single-laser method (e.g., process 900), the bandgap method (e.g., process 1000), the capacitance method (e.g., process 1100), and the photoluminescence method (e.g., process 1200), which are described in greater detail below with reference to FIGS. 9-13.

After the wafer is heated or cooled at the post-implantation station, at step 814, process 800 causes the controller to determine a current temperature of the wafer. In some examples, process 800 causes the controller to determine the current temperature of the wafer after the wafer is heated or cooled at the post-implantation station for a predetermined period of time (e.g., 1 second, 2 seconds, 5 seconds, etc.). In some examples, process 800 causes the controller to periodically determine a current temperature (e.g., every 0.5 seconds, every 2 seconds, etc.) after the wafer is heated or cooled at the post-implantation station for a predetermined period of time (e.g., 1 second, 2 seconds, 5 seconds, etc.). For example, after the wafer is heated at the post-implantation station for 2 seconds, process 800 can thereafter cause the controller to determine a current temperature of the wafer every second. In some examples, process 800 causes the controller to continually determine the current temperature of the wafer after the wafer is heated or cooled at the post-implantation station for a predetermined period of time (e.g., 1 second, 2 seconds, 5 seconds, etc.) and until the wafer reaches a predetermined target temperature.

In some examples, process 800 causes the controller to determine the current temperature of the wafer while the wafer is heated or cooled at the post-implantation station. For example, after one or more infrared heating lamps of the post-implantation heat the wafer for a predetermined period of time, process 800 can cause the controller to determine the current temperature of the wafer while the one or more infrared heating lamps continue to heat the wafer. In other examples, process 800 causes the controller to control the one or more infrared heating lamps, cooling E-chuck, and/or coolant release valve of the post-implantation station to cease heating or cooling the wafer while the controller determines the current temperature of the wafer. For example, process 800 can cause the controller to turn off the one or more infrared heating lamps or stop the flow of coolant to the cooling E-chuck and/or coolant release valve. In these examples, after the controller determines the current temperature of the wafer (which can take less than a second), process 800 can cause the controller to control the one or more infrared heating lamps, cooling E-chuck, and/or coolant release valve of the post-implantation station to continue (i.e., resume) heating or cooling the wafer. For example, process 800 can cause the controller to turn on the one or more infrared heating lamps or resume the flow of coolant to the cooling E-chuck and/or coolant release valve.

In some examples, ceasing to heat or cool the wafer while the controller determines the current temperature of the wafer allows the controller to more accurately determine the current temperature of the wafer. For example, as described above with reference to FIGS. 5 and 7, infrared light from the one or more infrared heating lamps of the post-implantation station can create unwanted "noise" (e.g., unwanted infrared light intensity and/or wavelength measurements) when determining the current temperature of the wafer based on a bandgap method (e.g., process 1000) and/or a photoluminescence method (e.g., process 1200). The unwanted noise can subsequently lead to inaccurate current temperature determinations, as the bandgap and photoluminescence methods both utilize infrared light intensity and/or wavelength measurements to determine a current temperature of the wafer. Thus, ceasing to heat the wafer with the one or more infrared heating lamps in these examples can prevent a photodetector (e.g., photodetector 518) and/or a spectrophotometer (e.g., spectrophotometer 720) of the post-implantation station from collecting/detecting infrared light from the one or more heating lamps (and subsequently generating the unwanted noise mentioned above) while the controller determines the current temperature of the wafer based on the bandgap method and/or the photoluminescence method, respectively.

Process 800 causes the controller to determine the current temperature of the wafer at step 814 based on one or more of a single-laser method (e.g., process 900), a bandgap method (e.g., process 1000), a capacitance method (e.g., process 1100), and/or a photoluminescence method (e.g., process 1200). FIGS. 9-12 illustrate the various processes for determining the current temperature of the wafer based on each the above methods.

Figure 9:
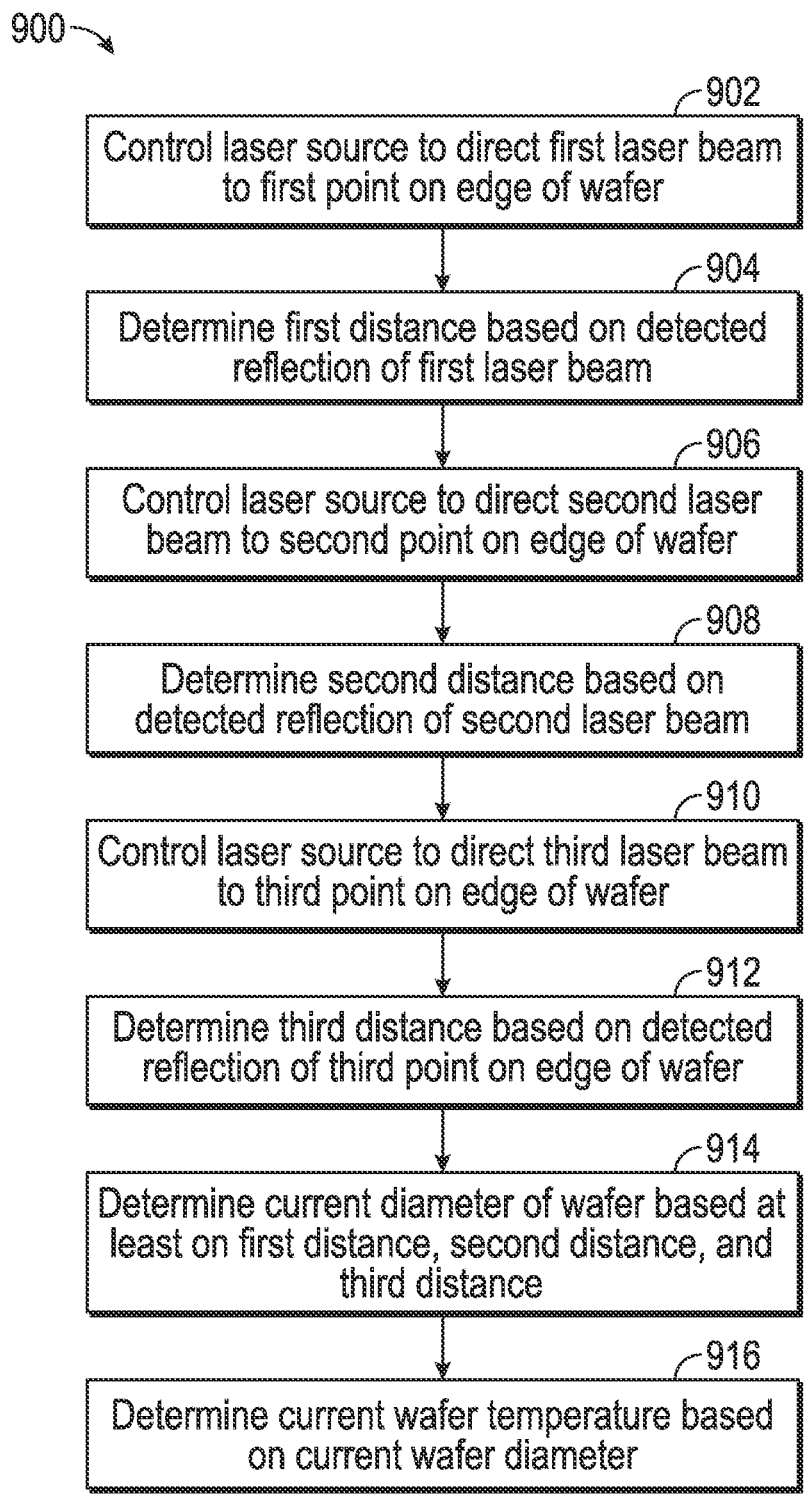
FIG. 9 illustrates a process for determining a temperature of a wafer at a post-implantation station using a single laser method, according to various examples.

FIG. 9 illustrates a process for determining a temperature of a wafer at a post-implantation station using a single laser method, according to various examples. In some examples, a controller performs process 900 using a post-implantation station configuration similar or identical to post-implantation station configuration 400, described above with reference to FIG. 4. Process 900 is described below with simultaneous reference to FIG. 4.

At step 902, process 900 causes a controller (e.g., controller 114) to control a laser source (e.g., laser source 406) to direct a first laser beam (e.g., laser beam 412) from the laser source at a first position (e.g., Position 1) to a first point on an edge of a wafer (e.g., wafer 402/expanded wafer 420). In particular, the laser source directs the first laser beam along a path that is parallel to a y-axis (e.g., Y-Axis 418).

At step 904, process 900 causes the controller to determine a first distance from the first position of the laser source to the first point on the edge of the wafer based on detecting a reflection of the first laser beam (e.g., laser beam 414A or 414B) using a laser sensor (e.g., laser sensor 408) of the post-implantation station. In particular, process 900 causes the controller to determine the first distance based on an amount of time it takes for the first laser beam to reflect off of the first point on the edge of the wafer and return to the laser sensor. The controller defines the first distance as a coordinate on the y-axis (e.g., $d_1$) and the first position of the laser source as a coordinate on an x-axis (e.g., X-Axis 416) such that the first point on the edge of the wafer is defined as a coordinate with x and y dimensions (e.g., 0, $d_1$). For example, the controller can define the first point on the edge of the wafer as (0.3 cm), with "0" representing the laser source's first position on the x-axis and "3 cm" representing the distance from the laser source to the first point on the edge of the wafer. Note, while FIG. 4 illustrates Position 1 as having an x-axis coordinate value of 0, in some examples, the controller defines the first position of the laser source as an x-axis coordinate having a value other than 0. For example, the controller can define the first point on the edge of the wafer as (1 cm, 3 cm).

After determining the first distance, the controller controls a laser unit (e.g., laser unit 410) that includes the laser source and laser sensor to move along a laser unit track from the first position to a second position (e.g., Position 2). In particular, the laser unit moves along the laser unit track in a straight line that is parallel to the x-axis.

At step 906, process 900 causes the controller to control the laser source to direct a second laser beam from the laser source at the second position to a second point on the edge of the wafer. As with the first laser beam, the laser source directs the second laser beam along a path that is parallel to the y-axis.

At step 908, process 900 causes the controller to determine a second distance from the second position of the laser source to the second point on the edge of the wafer based on detecting a reflection of the second laser beam using the laser sensor. In particular, process 900 causes the controller to determine the second distance based on an amount of time it takes for the second laser beam to reflect off of the second point on the edge of the wafer and return to the laser sensor. The controller defines the second distance as a coordinate on the y-axis (e.g., $d_2$) and the second position of the laser source as a coordinate on the x-axis (e.g., $P_{2x}$) such that the second point on the edge of the wafer is defined as a coordinate with x and y dimensions (e.g., $P_{2x}$, $d_2$). For example, the controller can define the second point on the edge of the wafer as (7 cm, 1.5 cm), with "7 cm" representing the laser source's second position on the x-axis and "1.5 cm" representing the distance from the laser source to the second point on the edge of the wafer.

After determining the second distance, the controller controls the laser unit to move along the laser unit track from the second position to a third position (e.g., Position 3).

At step 910, process 900 causes the controller to control the laser source to direct a third laser beam from the laser source at the third position to a third point on the edge of the wafer.

At step 912, process 900 causes the controller to determine a third distance from the third position of the laser source to the third point on the edge of the wafer based on detecting a reflection of the third laser beam using the laser sensor. In particular, process 900 causes the controller to determine the third distance based on an amount of time it takes for the third laser beam to reflect off of the third point on the edge of the wafer and return to the laser sensor. The controller defines the third distance as a coordinate on the y-axis (e.g., $d_3$) and the third position of the laser source as a coordinate on the x-axis (e.g., $P_{3x}$) such that the third point on the edge of the wafer is defined as a coordinate with x and y dimensions (e.g., $P_{3x}$, $d_3$). For example, the controller can define the third point on the edge of the wafer as (10 cm, 1.2 cm), with "10 cm" representing the laser source's third position on the x-axis and "1.2 cm" representing the distance from the laser source to the third point on the edge of the wafer.

At step 914, process 900 causes the controller to determine a current diameter of the wafer based at least on the first distance, second distance, and third distance (e.g., $y_1$, $y_2$, and $y_3$ determined at steps 904, 908, and 912, respectively). In particular, the controller first uses the three coordinate pairs defining the three points on the edge of the wafer and equations (1) and (2) shown below to determine a center point of the wafer (e.g., an x coordinate and y coordinate defining the center point of the wafer).

$$x = \frac{(x_1^2 + y_1^2)(y_2 - y_3) + (x_2^2 + y_2^2)(y_3 - y_1) + (x_3^2 + y_3^2)(y_1 - y_2)}{2(x_1(y_2 - y_3) - y_1(x_2 - x_3) + x_2 y_3 - x_3 y_2)} \quad (1)$$

$$y = \frac{(x_1^2 + y_1^2)(x_3 - x_2) + (x_2^2 + y_2^2)(x_1 - x_3) + (x_3^2 + y_3^2)(x_2 - x_1)}{2(x_1(y_2 - y_3) - y_1(x_2 - x_3) + x_2 y_3 - x_3 y_2)} \quad (2)$$

As shown in equations (1) and (2), "x" represents the x coordinate of the center point of the wafer and "y" represents the y coordinate of the center point of the wafer. Further, "$x_1$" and "$y_1$" represent the x and y coordinates defining the first point on the edge of the wafer, "$x_2$" and "$y_2$" represent the x and y coordinates defining the second point on the edge of the wafer, and "$x_3$" and "$y_3$" represent the x and y coordinates defining the third point on the edge of the wafer. Thus, the controller uses equation (1) to determine the x coordinate of the center point and equation (2) to determine the y coordinate of the center point.

After the controller determines the coordinate pair defining the center point of the wafer (e.g., x, y), the controller determines the current diameter of the wafer using the coordinate pair defining the center point and equation (3) shown below.

$$r = \sqrt{(x-x_1)^2 + (y-y_1)^2} \quad (3)$$

As shown in equation (3), "r" represents the current radius of the wafer, "x" represents the x coordinate of the center point, "y" represents the y coordinate of the center point, "$x_1$" represents the x coordinate of the first point on the edge of the wafer, and "$y_1$" represents the y coordinate of the first point on the edge of the wafer. Thus, the controller uses equation (3) to determine the current radius of the wafer. The controller then determines the current diameter of the wafer by multiplying the current radius by two (i.e., current wafer diameter=2×r).

At step 916, process 900 causes the controller to determine a current temperature of the wafer based on the determined current diameter of the wafer. In particular, as described above with reference to FIG. 4, this step in the single-laser method for determining a current temperature of a wafer (e.g., process 900) utilizes the material characteristic of semiconductors (e.g., silicon, gallium arsenide, etc.) to change size based on temperature. Specifically, the dimensions (e.g., length, width, diameter, thickness, etc.) of semiconductor materials increase in size as the material heats up and decrease in size as the material cools down. The coefficient of linear thermal expansion of a semiconductor material represents the extent to which the dimensions of that specific semiconductor material change in response to a change in temperature. Thus, the controller uses the coefficient of linear thermal expansion of a wafer's semiconductor material, the change in the wafer's diameter, and equation (4) below to determine a current temperature of a wafer.

$$\Delta L = L_c - L_0 = \alpha \times L_0 \times (T_c - T_0) \qquad (4)$$

As shown in equation (4), "$\Delta L$" represents the change in a wafer's diameter, with "$L_c$" representing the wafer's current diameter and "$L_0$" representing a reference diameter of the wafer. Further, "$\alpha$" represents the coefficient of linear thermal expansion of the wafer's semiconductor material. For example, if the wafer is made of silicon, $\alpha$ would be the coefficient of linear thermal expansion of silicon (i.e., $2.6 \times 10^{-6}$ °$C^{-1}$). Lastly, "$T_c$" represents the wafer's current temperature and "$T_0$" represents the wafer's reference temperature (i.e., the wafer's temperature corresponding to the wafer's reference diameter).

In some examples, the reference temperature of the wafer ($T_0$) is the second predetermined temperature (e.g., the final temperature that the wafer will be heated/cooled to at post-implantation station 112 discussed above with reference to step 812 of FIG. 8). In these examples, the reference diameter of the wafer ($L_0$) is the wafer's diameter corresponding to the second predetermined temperature.

In some examples, the wafer's diameter corresponding to the second predetermined temperature is a predetermined average diameter of one or more similar wafers at the second predetermined temperature. In these examples, the one or more similar wafers can be wafers that are made of the same material as the wafer and that have the same size (or nearly the same size) as the wafer at ambient temperature. For example, if the second predetermined temperature is 25 degrees Celsius, the wafer's diameter corresponding to the second predetermined temperature can be a predetermined average diameter of one or more silicon wafers at 25 degrees Celsius. The controller can then use this predetermined average wafer diameter at 25 degrees Celsius as the reference diameter for equation (4).

In other examples, the wafer's diameter corresponding to the second predetermined temperature is determined prior to the wafer undergoing an ion implantation process (e.g., prior to the wafer being placed in a load lock chamber). For example, if the second predetermined temperature is 20 degrees Celsius, an operator of an ion implantation system in which the wafer is to undergo an ion implantation process can measure the wafer's diameter before the wafer undergoes the ion implantation process and while the wafer is at 20 degrees Celsius. The controller can then use this measured wafer diameter at 20 degrees Celsius as the reference diameter for equation (4).

In yet other examples, the controller determines the wafer's diameter corresponding to the second predetermined temperature before the wafer is heated or cooled at a pre-implantation station (e.g., pre-implantation station 108). In these examples, the wafer is kept at the second predetermined temperature prior to the wafer being placed in a load lock chamber (e.g., load lock chamber(s) 102). Soon after the wafer is placed in the load lock chamber and before process 800 causes the controller to control a robotic arm (e.g., robotic arm 104) to transfer the wafer to the pre-implantation station (e.g., at step 802 of FIG. 8), the controller controls the robotic arm to transfer the wafer to a post-implantation station (e.g., post-implantation station 112). Because the wafer is quickly transferred to the post-implantation station after being kept at the second predetermined temperature, it is assumed that the wafer is still at the second predetermined temperature when the robotic arm positions the wafer at the post-implantation station.

Then, without heating or cooling the wafer at the post-implantation station, the controller performs steps 902-914 of process 900 described above to determine the wafer's diameter. For example, the controller can control the various temperature measurement components of the post-implantation station (e.g., post-implantation station configuration 400) to measure/determine a first reference distance, a second reference distance, and a third reference distance in the same manner that the controller controls the temperature measurement components to measure/determine the first distance, the second distance, and the third distance at steps 902-912 of process 900. Then, the controller can determine the wafer's diameter based at least on the first reference distance, second reference distance, and third reference distance in the same manner that the controller determines the current wafer diameter based on the first distance, second distance, and third distance at step 914 of process 900. The controller then uses this determined wafer diameter as the reference diameter for equation (4).

In the examples described above wherein the reference temperature of the wafer ($T_0$) is the second predetermined temperature, the controller uses equation (4) to solve for the wafer's current temperature ($T_c$). In particular, since the controller will have values for the current wafer diameter ($L_c$) (e.g., determined at step 914), the reference wafer diameter ($L_0$), the reference wafer temperature ($T_0$) (e.g., the second predetermined temperature), and the coefficient of linear thermal expansion for the wafer material ($\alpha$), the controller can solve for the current wafer temperature ($T_c$), as it is the only remaining unknown variable of equation (4).

In some examples, the reference temperature of the wafer ($T_0$) is the wafer's temperature after being implanted with ions at the ion implanter and prior to any heating or cooling at the post-implantation station. In some examples, it is assumed that the implanted wafer is still at the temperature it was heated or cooled to in the pre-implantation station (e.g., the first predetermined temperature discussed above with reference to step 804 of FIG. 8) after the robotic arm positions the implanted wafer at the post-implantation station because it only takes several seconds (e.g., 10 seconds) to implant the wafer with ions after the wafer is heated or cooled at the pre-implantation station. For example, if a wafer is cooled to −60 degrees Celsius in the pre-implantation station, it is assumed that the wafer is still at −60 degrees Celsius when a robotic arm positions the wafer at the post-implantation station. Thus, in this case, the reference temperature of the wafer would be −60 degrees Celsius.

In the examples described above wherein the reference temperature of the wafer ($T_0$) is the wafer's temperature after being implanted with ions at the ion implanter and prior to any heating or cooling at the post-implantation station, the controller determines a reference wafer diameter ($L_0$) after the robotic arm transfers the wafer to the post-implantation station (e.g., after step 810 of FIG. 8) and before the wafer is heated or cooled at the post-implantation station (e.g., before step 812 of FIG. 8). In particular, the controller determines the reference wafer diameter by performing steps 902-914 of process 900 described above before any heating or cooling of the wafer occurs. For example, the controller can control the various temperature measurement components of the post-implantation station (e.g., post-implantation station configuration 400) to measure/determine a first reference distance, a second reference distance, and a third reference distance in the same manner that the controller controls the temperature measurement components to measure/determine the first distance, second distance, and third distance at steps 902-912 of process 900. Then, the controller can determine the reference wafer diameter based at least on the first reference distance, second reference distance, and third reference distance in the same manner that the controller determines the current wafer diameter based at least on the first distance, second distance, and third distance at step 914 of process 900.

After the controller determines the reference wafer diameter (corresponding to the wafer's temperature after being implanted with ions at the ion implanter), the controller controls the post-implantation station to begin heating or cooling the wafer (e.g., as described above with reference to step 812 of FIG. 8). Then, after the post-implantation station heats or cools the wafer (e.g., for a predetermined period of time), the controller once again performs steps 902-914 of process 900 described above to determine a current wafer diameter ($L_c$). The controller then uses equation (4) to solve for the wafer's current temperature ($T_c$). In particular, since the controller will have values for the current wafer diameter ($L_c$), the reference wafer diameter ($L_0$), the reference wafer temperature ($T_0$) (e.g., the assumed wafer temperature corresponding to the determined reference wafer diameter), and the coefficient of linear thermal expansion for the wafer material ($\alpha$), the controller can solve for the current wafer temperature ($T_c$), as it is the only remaining unknown variable of equation (4).

Once the controller determines a current temperature of a wafer at step 916, the controller can return to process 800 and perform steps 816, 818, 820, and/or 822 as will be described in greater detail below with reference to FIG. 8. It should be appreciated that some steps in process 900 may be combined, the order of some steps can be changed, and some steps can be omitted. Further, it should be appreciated that additional steps may be performed.

Figure 10:
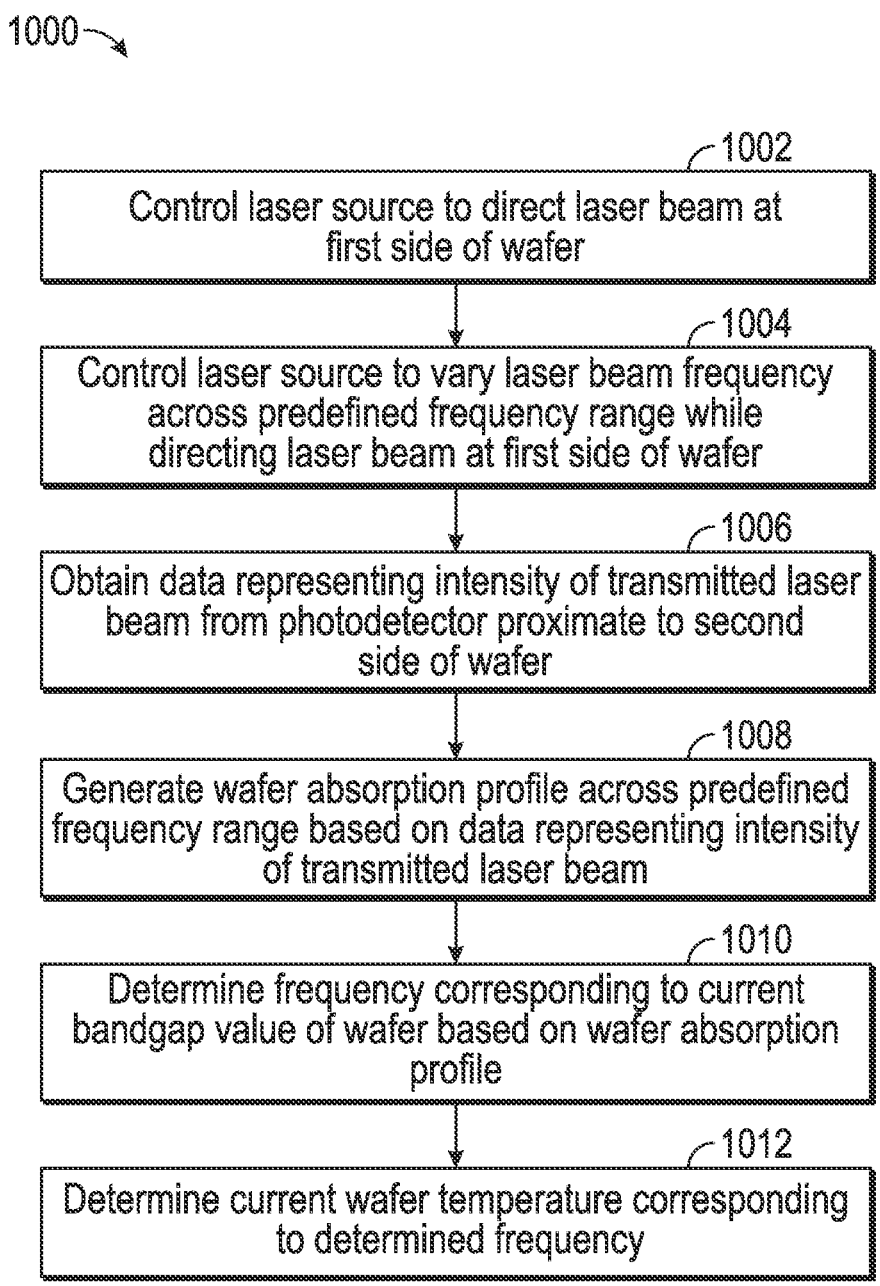
FIG. 10 illustrates a process for determining a temperature of a wafer at a post-implantation station using a bandgap method, according to various examples.

FIG. 10 illustrates a process for determining a temperature of a wafer at a post-implantation station using a bandgap method, according to various examples. In some examples, a controller performs process 1000 using a post-implantation station configuration similar or identical to post-implantation station configuration 500, described above with reference to FIG. 5. Process 1000 is described below with simultaneous reference to FIG. 5.

At step 1002, process 1000 causes a controller (e.g., controller 114) to control a laser source (e.g., laser source 508) to direct a laser beam (e.g., laser beam 514) to a first side (e.g., a top or bottom surface) of a wafer (e.g., wafer 502). As shown in FIG. 5, in some examples, process 1000 causes the controller to control the laser source to direct the laser beam to an input end of an optical fiber (e.g., optical fiber 510). The optical fiber then directs the laser beam to the first side of the wafer (e.g., via an output end of the optical fiber). Further, as will be discussed below with reference to step 1006, when the laser beam strikes the first side of the wafer, it travels through the wafer and is transmitted from a second side (e.g., a top or bottom surface) of the wafer.

Note, as mentioned above with reference to step 812 of FIG. 8, in some examples, the controller controls the post-implantation station to cease heating or cooling the wafer while the controller determines the current temperature of the wafer. With respect to process 1000, in some examples, the controller controls the post-implantation station to cease heating or cooling the wafer once the controller controls the laser source to direct the laser beam to the first side of the wafer (or the input end of the optical fiber). In some examples, the controller does not control the post-implantation to resume heating or cooling the wafer until after step 1008, 1010, or 1012 (described in greater detail below). For example, the controller can control the post-implantation to resume heating or cooling the wafer once the controller generates a wafer absorption profile at step 1008.

At step 1004, process 1000 causes the controller to control the laser source to vary a frequency of the laser beam across a predefined frequency range while the laser source (or the optical fiber) directs the laser beam at the first side of the wafer. In other words, process 1000 causes the controller to control the laser source to vary the frequency of the laser beam while the laser beam strikes the first side of the wafer. For example, the predefined frequency range can include, or fall within, $2.72 \times 10^{14}$ Hz to $2.76 \times 10^{14}$ Hz. In some examples, after the controller has controlled the laser source to vary the frequency of the laser beam across the entire predefined frequency range, the controller controls the laser source to cease directing the laser beam at the first side of the wafer (or the input end of the optical fiber).

At step 1006, process 1000 causes the controller to obtain data representing an intensity of the transmitted laser beam from a photodetector (e.g., photodetector 518) proximate to the second side of the wafer. In particular, as mentioned above, when the laser beam strikes the first side of the wafer, it travels through the wafer and is transmitted from the second side of the wafer. As shown in FIG. 5, the photodetector is positioned proximate to the second side of the wafer such that the photodetector receives/detects the transmitted laser beam and measures the transmitted laser beam's intensity. The photodetector subsequently provides data representing the measured intensity of the transmitted laser beam to the controller.

At step 1008, process 1000 causes the controller to generate an absorption profile of the wafer across the predefined frequency range based on the data representing the intensity of the transmitted laser beam. In particular, as the laser source varies the frequency of the laser beam, the intensity of the transmitted laser beam will also vary. The intensity of the transmitted laser beam varies because the amount of laser energy from the laser beam that the wafer absorbs is based in part on the frequency of the laser beam. For example, the wafer may absorb less laser energy when the laser beam is at a lower frequency (e.g., $2.72 \times 10^{14}$ Hz) compared to when the laser beam is at a higher frequency (e.g., $2.76 \times 10^{14}$ Hz). Further, because the intensity of the transmitted laser beam is inversely related to the amount of laser energy the wafer absorbs, the transmitted laser beam in the example above will have a higher intensity when the laser beam is at the lower frequency (i.e., since the wafer absorbs less laser energy at the lower frequency). Thus, in some examples, the absorption profile correlates the varying transmitted laser beam intensity to a corresponding laser beam frequency across the predefined frequency range. In other words, the absorption profile includes a transmitted laser beam intensity value for one or more (or all) frequency values within the predefined frequency range that the laser source sets the frequency of the laser beam to.

At step 1010, process 1000 causes the controller to determine a frequency corresponding to a current bandgap value of the wafer based on the absorption profile of the wafer. As described above with reference to FIG. 5, the bandgap (also known as the band gap energy or energy gap) of a semiconductor material (e.g., silicon, gallium arsenide, etc.) changes as a function of temperature. Specifically, the bandgap of semiconductor materials (measured in electron volts (eV)) decreases as the temperature of the semiconductor materials increases. Moreover, the bandgap of semiconductor materials affects how the semiconductor materials absorb laser energy from a laser beam. Specifically, there is a noticeable change in a semiconductor material's absorption of laser energy from a laser beam when the frequency of the laser beam reaches the frequency corresponding to the semiconductor's current bandgap value (i.e., the bandgap frequency). Thus, as the semiconductor material's temperature changes, the semiconductor material's bandgap and bandgap frequency will also change. Steps 1010 and 1012 of the bandgap method for determining a current temperature of a wafer (e.g., process 1000) utilize the above material characteristics of semiconductor materials to determine a current temperature of a semiconductor wafer.

In particular, the controller uses the absorption profile (e.g., generated at step 1008) to determine the frequency at which there is a noticeable change in the wafer's absorption of the laser beam's energy, as that frequency corresponds to the wafer's current bandgap. For example, if at step 1004, the controller tunes the laser source to scan the frequency of the laser beam from below the wafer's bandgap frequency to above the wafer's bandgap frequency, the absorption profile will indicate a low absorption by the wafer (i.e., a high transmitted laser beam intensity) when the laser source is tuned to a frequency below the wafer's bandgap frequency. However, the absorption profile will indicate a dramatic increase in the wafer's absorption of the laser beam (i.e., a dramatic decrease in the intensity of the transmitted laser beam) once the laser source is tuned to a frequency that exceeds the wafer's bandgap frequency. The laser source's frequency at the point of the dramatic increase in the wafer's absorption of the laser beam represents the bandgap frequency of the wafer at the wafer's current temperature.

After the controller determines the bandgap frequency of the wafer, at step 1012, process 1000 causes the controller to determine a current temperature of the wafer corresponding to the determined bandgap frequency. In particular, the controller uses known temperature and bandgap frequency relationships for silicon, such as those illustrated in table (1) below, to determine a temperature corresponding to the wafer's current bandgap frequency. For example, if the controller determines that the wafer's current bandgap frequency is $2.73 \times 10^{14}$ Hz (e.g., at step 1010), the controller can use the known temperature and bandgap frequency relationships for silicon shown in table (1) to determine that the wafer's current temperature is 0 degrees Celsius.

TABLE (1)

| Si Bandgap (eV) | Temperature (° K.) | Temp (° C.) | Wavelength (nm) | Frequency (Hz) |
| --- | --- | --- | --- | --- |
| 1.122290014 | 293 | 20 | 1104.883751 | 2.72E+14 |
| 1.127218683 | 273 | 0 | 1100.052739 | 2.73E+14 |
| 1.131943468 | 253 | −20 | 1095.461068 | 2.74E+14 |
| 1.136450291 | 233 | −40 | 1091.116796 | 2.75E+14 |
| 1.13861721 | 223 | −50 | 1089.040276 | 2.75E+14 |
| 1.140723749 | 213 | −60 | 1087.029179 | 2.76E+14 |
| 1.142767751 | 203 | −70 | 1085.084873 | 2.76E+14 |

Note, temperature and bandgap frequency relationships can vary between different semiconductor materials. Thus, while table (1) only includes temperature/bandgap frequency relationships for silicon, in some examples, the controller uses known temperature and bandgap frequency relationships for other semiconductor materials based on the one or more semiconductor materials of which the wafer is made. For example, if the wafer is made of gallium arsenide, the controller can use known temperature and bandgap frequency relationships for gallium arsenide to determine a current temperature of the wafer. Further, in some examples, the controller can determine a wavelength corresponding to the determined bandgap frequency (since wavelength and frequency are directly related) and subsequently determine the wafer's current temperature based on the determined bandgap wavelength. For example, this bandgap wavelength determination may be preferable when bandgap frequencies of a semiconductor material for a range of temperatures (e.g., 20 to −70 degrees Celsius) fall within a narrow range (such as the frequencies shown above in table (1)).

As mentioned above with reference to step 812 of FIG. 8, in some examples, after the robotic arm transfers the wafer to the post-implantation station and before the controller controls the post-implantation station to heat or cool the wafer, the controller controls the post-implantation station to determine a reference wafer temperature. In some examples, the controller determines a reference wafer temperature by performing steps 1002-1012 of process 1000 described above before any heating or cooling of the wafer occurs. For example, the controller can control various temperature measurement components of the post-implantation station (e.g., the temperature measurement components of post-implantation station configuration 500) to measure an intensity of a transmitted reference laser beam across a predefined frequency range and generate an absorption profile based on the measured intensity of the transmitted reference laser beam in the same manner that the controller controls the temperature measurement components to measure the intensity of the transmitted laser beam across the predefined frequency range and generates the absorption profile at steps 1002-1008. Then, the controller can determine a frequency corresponding to a reference bandgap value of the wafer based on the generated absorption profile and determine the reference wafer temperature based on the determined reference bandgap frequency in the same manner that the controller determines the bandgap frequency and current temperature of the wafer at steps 1010 and 1012, respectively.

In some examples, the controller uses the determined reference wafer temperature at step 816 of FIG. 8 (described in greater detail below). For example, if the predetermined condition of step 816 includes a requirement that the wafer temperature increase or decrease by a certain amount, the controller can use the determined reference wafer temperature and the determined current wafer temperature to determine whether the predetermined condition is satisfied. For example, if the reference wafer temperature is −60 degrees Celsius, the current wafer temperature is 20 degrees Celsius, and the predetermined condition includes a requirement that the wafer temperature increase by 80 degrees Celsius, the controller can determine that the predetermined condition is satisfied.

Once the controller determines the current temperature of the wafer at step 1012, the controller can return to process 800 and perform steps 816, 818, 820, and/or 822 as will be described in greater detail below with reference to FIG. 8. It should be appreciated that some steps in process 1000 may be combined, the order of some steps can be changed, and some steps can be omitted. Further, it should be appreciated that additional steps may be performed.

Figure 11:
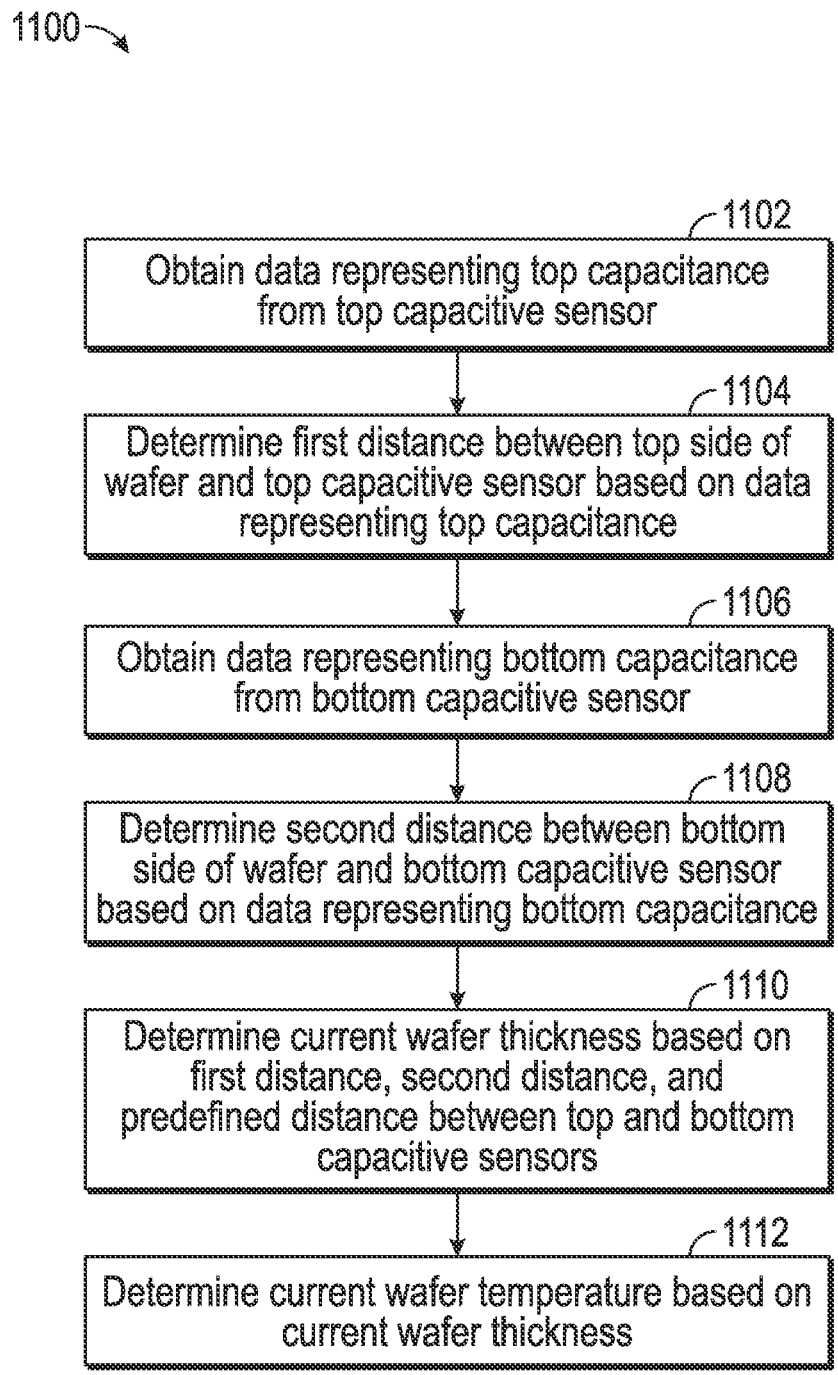
FIG. 11 illustrates a process for determining a temperature of a wafer at a post-implantation station using a capacitance method, according to various examples.

FIG. 11 illustrates a process for determining a temperature of a wafer at a post-implantation station using a capacitance method, according to various examples. In some examples, a controller performs process 1100 using a post-implantation station configuration similar or identical to post-implantation station configuration 600, described above with reference to FIG. 6. Process 1100 is described below with simultaneous reference to FIG. 6.

At step 1102, process 1100 causes a controller (e.g., controller 114) to obtain data representing a top capacitance from a top capacitive sensor (e.g., top capacitive sensor 608). In particular, the top capacitive sensor measures the capacitance between itself and a top side of a wafer (e.g., wafer 602) and subsequently provides the data representing the top capacitance to the controller.

At step 1104, process 1100 causes the controller to determine a first distance between the top side of the wafer and the top capacitive sensor based on the data representing the top capacitance (e.g., obtained at step 1102).

At step 1106, process 1100 causes the controller to obtain data representing a bottom capacitance from a bottom capacitive sensor (e.g., bottom capacitive sensor 610). In particular, the bottom capacitive sensor measures the capacitance between itself and a bottom side of the wafer and subsequently provides the data representing the bottom capacitance to the controller.

At step 1108, process 1100 causes the controller to determine a second distance between the bottom side of the wafer and the bottom capacitive sensor based on the data representing the bottom capacitance (e.g., obtained at step 1106).

At step 1110, process 1100 causes the controller to determine a current thickness of the wafer based on the first distance, the second distance, and a predefined distance between the top capacitive sensor and the bottom capacitive sensor. For example, if the predefined distance between the top and bottom capacitive sensors is 1 mm, the first distance is 500 μm, and the second distance is 300 μm, the controller can determine that the current thickness of the wafer is 200 μm (i.e., 1 mm−500 μm−300 μm=200 μm).

At step 1112, process 1100 causes the controller to determine a current temperature of the wafer based on the determined current thickness of the wafer. In particular, as described above with reference to FIG. 6, this step in the capacitance method for determining a current temperature of a wafer (e.g., process 1100) utilizes the material characteristic of semiconductors (e.g., silicon, gallium arsenide, etc.) to change size based on temperature. Specifically, the dimensions (e.g., length, width, diameter, thickness, etc.) of semiconductor materials increase in size as the material heats up and decreases in size as the material cools down. The coefficient of linear thermal expansion of a semiconductor material represents the extent to which the dimensions of that specific semiconductor material change in response to a change in temperature. Thus, the controller uses the coefficient of linear thermal expansion of a wafer's semiconductor material, the change in the wafer's thickness, and equation (5) below to determine a current temperature of a wafer.

$$\Delta d = d_c - d_0 = \alpha \times d_0 \times (T_c - T_0) \quad (5)$$

As shown in equation (5), "$\Delta d$" represents the change in a wafer's thickness, with "$d_c$" representing the wafer's current thickness and "$d_0$" representing a reference thickness of the wafer. Further, "$\alpha$" represents the coefficient of linear thermal expansion of the wafer's semiconductor material. For example, if the wafer is made of silicon, $\alpha$ would be the coefficient of linear thermal expansion of silicon (i.e., $2.6 \times 10^{-6}$ °C.$^{-1}$). Lastly, "$T_c$" represents the wafer's current temperature and "$T_0$" represents the wafer's reference temperature (i.e., the wafer's temperature corresponding to the wafer's reference thickness).

In some examples, the reference temperature of the wafer ($T_0$) is the second predetermined temperature (e.g., the final temperature that the wafer will be heated/cooled to at post-implantation station 112 discussed above with reference to step 812 of FIG. 8). In these examples, the reference thickness of the wafer ($d_0$) is the wafer's thickness corresponding to the second predetermined temperature.

In some examples, the wafer's thickness corresponding to the second predetermined temperature is a predetermined average thickness of one or more similar wafers at the second predetermined temperature. In these examples, the one or more similar wafers can be wafers that are made of the same material as the wafer and that have the same size (or nearly the same size) as the wafer at ambient temperature. For example, if the second predetermined temperature is 25 degrees Celsius, the wafer's thickness corresponding to the second predetermined temperature can be a predetermined average thickness of one or more silicon wafers at 25 degrees Celsius. The controller can then use this predetermined average wafer thickness at 25 degrees Celsius as the reference thickness for equation (5).

In other examples, the wafer's thickness corresponding to the second predetermined temperature is determined prior to the wafer undergoing an ion implantation process (e.g., prior to the wafer being placed in a load lock chamber). For example, if the second predetermined temperature is 20 degrees Celsius, an operator of an ion implantation system in which the wafer is to undergo an ion implantation process can measure the wafer's thickness before the wafer undergoes the ion implantation process and while the wafer is at 20 degrees Celsius. The controller can then use this measured wafer thickness at 20 degrees Celsius as the reference thickness for equation (5).

In yet other examples, the controller determines the wafer's thickness corresponding to the second predetermined temperature before the wafer is heated or cooled at a pre-implantation station (e.g., pre-implantation station 108). In these examples, the wafer is kept at the second predetermined temperature prior to the wafer being placed in a load lock chamber (e.g., load lock chamber(s) 102). Soon after the wafer is placed in the load lock chamber and before the controller controls a robotic arm (e.g., robotic arm 104) to transfer the wafer to the pre-implantation station (e.g., at step 802 of FIG. 8), the controller controls the robotic arm to transfer the wafer to a post-implantation station (e.g., post-implantation station 112). Because the wafer is quickly transferred to the post-implantation station after being kept at the second predetermined temperature, it is assumed that the wafer is still at the second predetermined temperature when the robotic arm positions the wafer at the post-implantation station.

Then, without heating or cooling the wafer at the post-implantation station, the controller performs steps 1102-1110 of process 1100 described above to determine the wafer's thickness. For example, the controller can control the various temperature measurement components of the post-implantation station (e.g., post-implantation station configuration 600) to measure/determine a first reference distance and a second reference distance in the same manner that the controller controls the temperature measurement components to measure/determine the first distance and the second distance at steps 1102-1108 of process 1100. Then, the controller can determine the wafer's thickness based on the first reference distance, the second reference distance, and the predefined distance between the top and bottom capacitive sensors in the same manner that the controller determines the current wafer thickness based on the first distance, the second distance, and the predefined distance between the top and bottom capacitive sensors at step 1110 of process 1100. The controller then uses this determined wafer thickness as the reference thickness for equation (5).

In the examples described above wherein the reference temperature of the wafer ($T_0$) is the second predetermined temperature, the controller uses equation (5) to solve for the wafer's current temperature ($T_c$). In particular, since the controller will have values for the current wafer thickness ($d_c$) (e.g., determined at step 1110), the reference wafer thickness (do), the reference wafer temperature ($T_0$) (e.g., the second predetermined temperature), and the coefficient of linear thermal expansion for the wafer material ($\alpha$), the controller can solve for the current wafer temperature ($T_c$), as it is the only remaining unknown variable of equation (5).

In some examples, the reference temperature of the wafer ($T_0$) is the wafer's temperature after being implanted with ions at the ion implanter and prior to any heating or cooling at the post-implantation station. In some examples, it is assumed that the implanted wafer is still at the temperature it was heated or cooled to in the pre-implantation station (e.g., the first predetermined temperature discussed above with reference to step 804 of FIG. 8) after the robotic arm positions the implanted wafer at the post-implantation station because it only takes several seconds (e.g., 10 seconds) to implant the wafer with ions after the wafer is heated or cooled at the pre-implantation station. For example, if a wafer is cooled to −60 degrees Celsius in the pre-implantation station, it is assumed that the wafer is still at −60 degrees Celsius when a robotic arm positions the wafer at the post-implantation station. Thus, in this case, the reference temperature of the wafer would be −60 degrees Celsius.

In the examples described above wherein the reference temperature of the wafer ($T_0$) is the wafer's temperature after being implanted with ions at the ion implanter and prior to any heating or cooling at the post-implantation station, the controller determines a reference wafer thickness (do) after the robotic arm transfers the wafer to the post-implantation station (e.g., after step 810 of FIG. 8) and before the wafer is heated or cooled at the post-implantation station (e.g., before step 814 of FIG. 8). In particular, the controller determines the reference wafer thickness by performing steps 1102-1110 of process 1100 described above before any heating or cooling of the wafer occurs. For example, the controller can control the various temperature measurement components of the post-implantation station (e.g., post-implantation station configuration 600) to measure/determine a first reference distance and a second reference distance in the same manner that the controller controls the temperature measurement components to measure/determine the first distance and the second distance at steps 1102-1108 of process 1100. Then, the controller can determine the reference wafer thickness based on the first reference distance, the second reference distance, and the predefined distance between the top and bottom capacitive sensors in the same manner that the controller determines the current wafer thickness based on the first distance, the second distance, and the predefined distance between the top and bottom capacitive sensors at step 1110 of process 1100.

After the controller determines the reference wafer thickness (corresponding to the wafer's temperature after being implanted with ions at the ion implanter), the controller controls the post-implantation station to begin heating or cooling the wafer (e.g., as described above with reference to step 812 of FIG. 8). Then, after the post-implantation station heats or cools the wafer (e.g., for a predetermined period of time), the controller once again performs steps 1102-1110 of process 1100 described above to determine a current wafer thickness ($d_c$). The controller then uses equation (5) to solve for the wafer's current temperature ($T_c$). In particular, since the controller will have values for the current wafer thickness ($d_c$), the reference wafer thickness ($d_0$), the reference wafer temperature ($T_0$) (e.g., the assumed wafer temperature corresponding to the determined reference wafer thickness), and the coefficient of linear thermal expansion for the wafer material ($\alpha$), the controller can solve for the current wafer temperature ($T_c$), as it is the only remaining unknown variable of equation (5).

Once the controller determines a current temperature of a wafer at step 1112, the controller can return to process 800 and perform steps 816, 818, 820, and/or 822 as will be described in greater detail below with reference to FIG. 8. It should be appreciated that some steps in process 1100 may be combined, the order of some steps can be changed, and some steps can be omitted. Further, it should be appreciated that additional steps may be performed.

Figure 12:
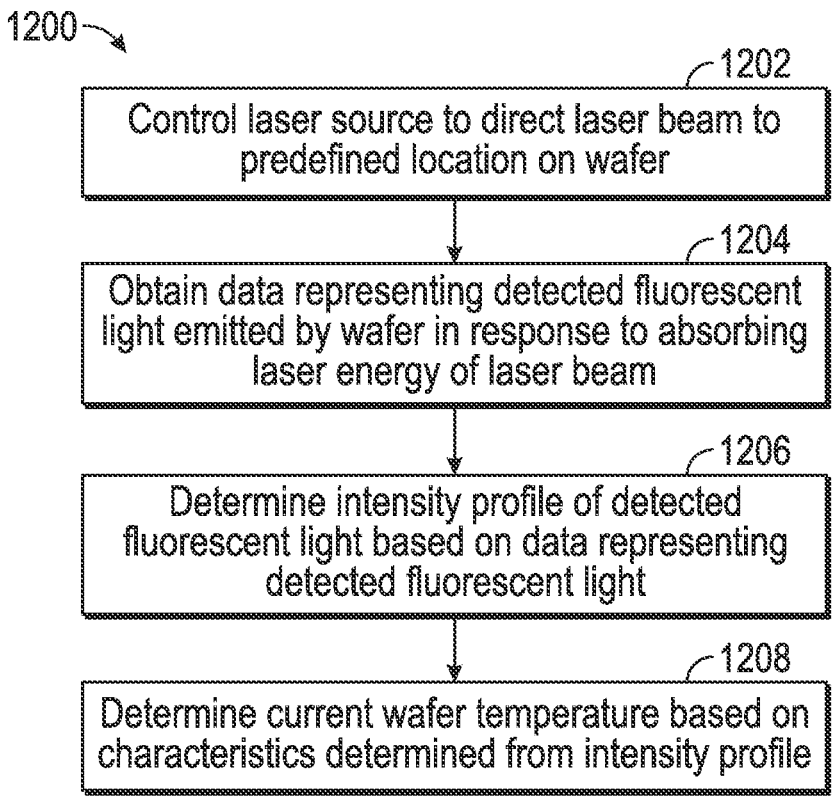
FIG. 12 illustrates a process for determining a temperature of a wafer at a post-implantation station using a photoluminescence method, according to various examples.

FIG. 12 illustrates a process for determining a temperature of a wafer at a post-implantation station using a photoluminescence method, according to various examples. In some examples, a controller performs process 1200 using a post-implantation station configuration similar or identical to post-implantation station configuration 700, described above with reference to FIG. 7. Process 1200 is described below with simultaneous reference to FIGS. 7 and 13.

At step 1202, process 1200 causes a controller (e.g., controller 114) to control a laser source (e.g., laser source 708) to direct a laser beam (e.g., laser beam 714) to a predefined location on a wafer (e.g., wafer 702). In some examples, process 1200 causes the controller to control the laser source to direct the laser beam to an optics module (e.g., optics module 712). The optics module then directs the laser beam to the predefined location on the wafer. As shown in FIG. 7, in some examples, process 1200 causes the controller to control the laser source to direct the laser beam to an input end of an optical fiber (e.g., optical fiber 710). The optical fiber then directs the laser beam to the optics module (e.g., via an output end of the optical fiber), which directs the laser beam to the predefined location on the wafer. In other examples, the optical fiber directs the laser beam to the predefined location on the wafer (e.g., via an output end of the optical fiber) instead of directing the laser beam to the optics module.

In some examples, the optics module includes an optical chopper. In these examples, the optics module directs the laser beam to the predefined location on the wafer at a frequency set by the optical chopper. In some examples, the laser beam frequency set by the optical chopper is predetermined and is maintained throughout the temperature-measurement process.

In some examples, the predefined location on the wafer is on an edge of the wafer. In these examples, one or more lenses included in the optics module mentioned above reduce a size of a spot of the laser beam such that the diameter of the laser beam spot is smaller than the thickness of the wafer. For example, the one or more lenses can reduce the size of the laser beam spot such that the optics module can direct the laser beam to a predefined location in between an implant layer (e.g., the portion of the wafer that includes implanted ions) and a film layer of the wafer without the laser beam directly striking either the implant later or the film layer (i.e., because the laser beam spot does not overlap either layer). In other examples, the predefined location on the wafer is on a side of the wafer (e.g., a bottom or top surface of the wafer).

At step 1204, process 1200 causes the controller to obtain data representing detected fluorescent light that the wafer emits in response to absorbing laser energy of the laser beam. In particular, as explained above with reference to FIG. 7, while the laser beam strikes the predefined location on the wafer, the wafer absorbs energy (i.e., electromagnetic radiation) from the laser beam and in response, emits fluorescent light (e.g., emitted fluorescent light 716). A spectrophotometer (e.g., spectrophotometer 720) proximate to the wafer (e.g., proximate to the predefined location on the wafer) detects the emitted fluorescent light. Specifically, in some examples, the spectrophotometer detects an intensity and/or a wavelength of the emitted fluorescent light.

In some examples, the controller obtains the data representing the detected fluorescent light from the spectrophotometer. In other examples, as shown in FIG. 7, the controller obtains the data representing the detected fluorescent light from an amplifier (e.g., amplifier 722). In these examples, the amplifier receives the data representing the detected fluorescent light from the spectrophotometer. The amplifier then extracts specific data from the data representing the detected fluorescent light and provides the extracted data to the controller. In some examples, the amplifier extracts data representing detected fluorescent light of a specific intensity and/or wavelength range. For example, the amplifier can extract data representing detected fluorescent light having a wavelength between 900 nm and 1400 nm, and subsequently provide the extracted data to the controller. In this manner, the amplifier can remove unwanted or unhelpful data from the data representing the detected fluorescent light, such as data representing infrared light generated by one or more heating lamps that is detected by the spectrophotometer (e.g., when the infrared heating lamp light falls outside of the specific intensity and/or wavelength range).

At step 1206, process 1200 causes the controller to determine an intensity profile of the detected fluorescent light based on the data representing the detected fluorescent light. In some examples, the intensity profile represents an intensity of the detected fluorescent light as a function of the detected fluorescent light's wavelength. In some examples, the controller normalizes the data representing the intensity of the detected fluorescent light such that the intensity profile represents a normalized intensity of the detected fluorescent light as a function of the detected fluorescent light's wavelength. For example, the controller can normalize the data representing the intensity of the detected fluorescent light by dividing a relative fluorescence intensity (i.e., the detected fluorescence intensity) at each wavelength of the detected fluorescent light by the relative fluorescence intensity at the peak wavelength of the detected fluorescent light. In this manner, the data representing the intensity of the detected fluorescent light can be converted from the detected units of measurement for fluorescent light intensity (e.g., lumens, lux, etc.) to a fluorescent light intensity scale that ranges from 0 to 1.

Figure 13:
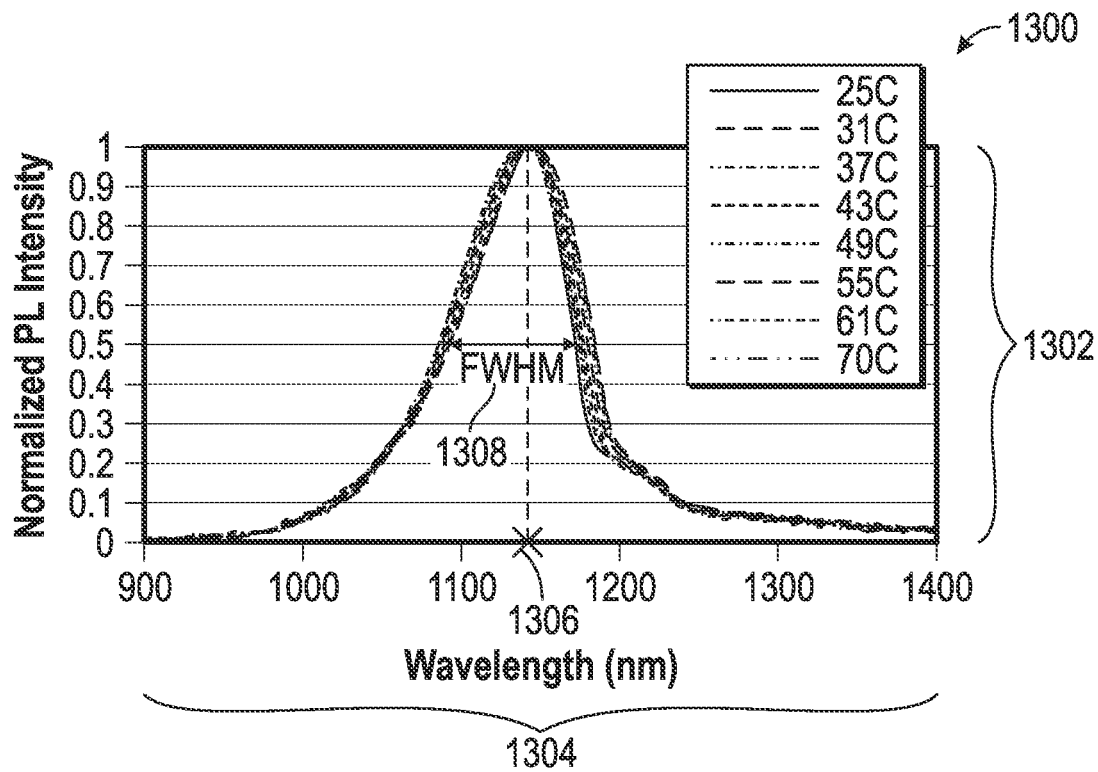
FIG. 13 illustrates a plurality of exemplary fluorescent light intensity profiles corresponding to a wafer at various temperatures.

For example, FIG. 13 illustrates a plurality of exemplary fluorescent light intensity profiles corresponding to a wafer (e.g., wafer 702) at various temperatures. In particular, intensity profiles 1300 are bell curve graphs representing a normalized intensity of detected fluorescent light 1302 as a function of the detected fluorescent light's wavelength 1304 that the wafer emitted while at various temperatures (e.g., at 25 degrees Celsius, 31 degrees Celsius, etc.). In other words, each intensity profile of intensity profiles 1300 corresponds to a different wafer temperature. As shown, because the detected fluorescent light intensity is normalized, the intensity profile at each wafer temperature has a minimum intensity of 0 and a maximum intensity of 1. Further, each intensity profile has a peak wavelength and a FWHM. For example, FIG. 13 illustrates a peak wavelength 1306 and a FWHM 1308 for the intensity profile corresponding to the fluorescent light emitted by the wafer (and detected by the spectrophotometer) while the wafer was at 25 degrees Celsius.

Note, while FIG. 13 illustrates the plurality of intensity profiles as bell curve graphs, one of ordinary skill in the art would appreciate that the controller can determine an intensity profile at step 1206 without having to generate a corresponding graph of the intensity profile. Rather, the intensity profile can be, for example, a data set including data representing the intensity of the detected fluorescent light as a function of the detected fluorescent light's wavelength.

Returning to FIG. 12, at step 1208, process 1200 causes the controller to determine a current temperature of the wafer based on one or more characteristics that the controller determines from the intensity profile. In some examples, the one or more characteristics that the controller determines include a peak wavelength of an intensity peak in the intensity profile (e.g., peak wavelength 1306) and/or a FWHM of the intensity peak (e.g., FWHM 1308).

In particular, as described above with reference to FIG. 7, the photoluminescence of semiconductor materials (i.e., the emission of fluorescent light in response to the absorption of electromagnetic radiation (e.g., laser beam energy)) changes as a function of temperature. For example, a peak wavelength and/or FWHM of a semiconductor material's emitted fluorescent light changes as a function of temperature. Thus, this step in the photoluminescence method for determining a current temperature of a wafer (e.g., process 1200) utilizes the above material characteristic of semiconductor materials to determine a current temperature of a semiconductor wafer.

Specifically, in some examples, the controller uses predetermined equations representing relationships between a semiconductor material's emitted fluorescent light peak wavelength/emitted fluorescent light FWHM and the semiconductor material's current temperature to solve for a semiconductor wafer's current temperature. In some examples, the equations are determined by incrementally measuring peak wavelength/FWHM of a single wafer (made of a known semiconductor material) at various temperatures (e.g., prior to performing process 800), recording the peak wavelength/FWHM results in a database table for each of the various temperatures, and subsequently deriving the equations based on the peak wavelength/FWHM results and their corresponding wafer temperatures.

For example, when the one or more characteristics that the controller determines include a peak wavelength of an intensity peak in an intensity profile, the controller can determine the current temperature of a silicon wafer based on equation (6) below, which represents a nonlinear relationship between an emitted fluorescent light peak wavelength of silicon and a current temperature of silicon:

$$y = 5\times10^{-7}x^5 - 6\times10^{-5}x^4 + 0.00051x^3 - 0.2098x^2 + 4.2022x + 1108.1 \qquad (6)$$

As shown in equation (6), "y" represents the peak wavelength of the intensity peak in the intensity profile and "x" represents the current temperature of silicon. Thus, in these examples, after the controller determines a silicon wafer's emitted fluorescent light peak wavelength (y), the controller can solve for the current temperature of the silicon wafer (x), as it is the only remaining unknown variable of equation (6).

As another example, when the one or more characteristics that the controller determines include a FWHM of an intensity peak in an intensity profile, the controller can additionally or alternatively determine the current temperature of a silicon wafer based on equation (7) below, which represents a nonlinear relationship between an emitted fluorescent light FWHM of silicon and a current temperature of silicon:

$$y=5\times10^{-6}x^4-0.001x^3+0.0726x^2-2.1272x+107.62 \quad (7)$$

As shown in equation (7), "y" represents the FWHM of the intensity peak in the intensity profile and "x" represents the current temperature of silicon. Thus, in these examples, after the controller determines a silicon wafer's emitted fluorescent light FWHM (y), the controller can solve for the current temperature of the silicon wafer (x), as it is the only remaining unknown variable of equation (7).

Note, relationships between photoluminescence and current temperature can vary between different semiconductor materials. In some examples, the controller uses predetermined equations representing the above relationships for other semiconductor materials based on the one or more semiconductor materials that a wafer is made of For example, if a wafer is made of gallium arsenide, the controller can use predetermined equations representing the above relationships for gallium arsenide to determine a current temperature of the gallium arsenide wafer. Further, relationships between photoluminescence and current temperature can even vary between wafers made of the same semiconductor material but that are from different batches or produced by different manufacturers. Thus, equations (6) and (7) are simply examples of the nonlinear relationships between silicon's emitted fluorescent light peak wavelength and current temperature, and silicon's emitted fluorescent light FWHM and current temperature, respectively, and should not be considered as the only equations that the controller uses for silicon wafers at this step.

In some examples, the controller uses a database table (such as the database table described above) to determine a semiconductor wafer's current temperature instead of using predetermined equations. For example, the controller can use such a database table to determine the wafer temperature that corresponds to a semiconductor wafer's emitted fluorescent light peak wavelength. As described above, the controller can generate these database tables prior to process 800 by measuring the peak wavelength/FWHM of a semiconductor wafer (e.g., of a batch of similar semiconductor wafers) at known temperatures.

As mentioned above with reference to step 812 of FIG. 8, in some examples, after the robotic arm transfers the wafer to the post-implantation station and before the controller controls the post-implantation station to heat or cool the wafer, the controller controls the post-implantation station to determine a reference wafer temperature. In some examples, the controller determines a reference wafer temperature by performing steps 1202-1208 of process 1200 described above before any heating or cooling of the wafer occurs. For example, the controller can control various temperature measurement components of the post-implantation station (e.g., the temperature measurement components of post-implantation station configuration 700) to direct a laser beam to a predefined location on a wafer, detect fluorescent light emitted from the wafer, and determine a reference intensity profile based on the detected fluorescent light in the same manner that the controller controls the temperature measurement components to direct the laser beam to the predefined location on the wafer, detect fluorescent light emitted from the wafer, and determine the intensity profile based on the detected fluorescent light at steps 1202-1206. Then, the controller can determine a reference temperature of the wafer based on characteristics determined from the reference intensity profile in the same manner that the controller determines the current temperature of the wafer based on characteristics determined from the intensity profile at step 1208.

In some examples, the controller uses the determined reference wafer temperature at step 816 of FIG. 8 (described in greater detail below). For example, if the predetermined condition of step 816 includes a requirement that the wafer temperature increase or decrease by a certain amount, the controller can use the determined reference wafer temperature and the determined current wafer temperature to determine whether the predetermined condition is satisfied. For example, if the reference wafer temperature is −60 degrees Celsius, the current wafer temperature is 0 degrees Celsius, and the predetermined condition includes a requirement that the wafer temperature increase by 85 degrees Celsius, the controller can determine that the predetermined condition is not satisfied.

Once the controller determines the current temperature of the wafer at step 1208, the controller can return to process 800 and perform steps 816, 818, 820, and/or 822 as will be described in greater detail below with reference to FIG. 8. It should be appreciated that some steps in process 1200 may be combined, the order of some steps can be changed, and some steps can be omitted. Further, it should be appreciated that additional steps may be performed.

Returning to FIG. 8, at step 816, process 800 causes the controller to determine whether the determined current temperature of the wafer (e.g., determined by process 900, 1000, 1100, and/or 1200) satisfies a predetermined condition. In some examples, the predetermined condition includes a requirement that the determined current temperature of the wafer be greater than or equal to a third predetermined temperature (e.g., when the wafer is heated at the post-implantation station). For example, the predetermined condition can include a requirement that the determined current temperature of the wafer be greater than or equal to 20 degrees Celsius. In other examples, the predetermined condition includes a requirement that the determined current temperature of the wafer be less than or equal to a third predetermined temperature (e.g., when the wafer is cooled at the post-implantation station). For example, the predetermined condition can include a requirement that the determined current temperature of the wafer be less than or equal to 25 degrees Celsius. In some examples, the third predetermined temperature is the same temperature as the second predetermined temperature described above with reference to step 812.

If the controller determines that the determined current temperature of the wafer satisfies the predetermined condition, at step 818, process 800 causes the controller to control the post-implantation station to forgo continuing to heat or cool the wafer at the post-implantation station. For example, in the examples described above wherein the one or more infrared heating lamps, cooling E-chuck, and/or coolant release valve of the post-implantation station heat or cool the wafer while the controller determines the current temperature of the wafer, the controller can turn off the one or more infrared heating lamps or stop the flow of coolant to the cooling E-chuck and/or coolant release valve. Alternatively, in the examples described above wherein the controller controls the one or more infrared heating lamps, cooling E-chuck, and/or coolant release valve of the post-implantation station to cease heating or cooling the wafer while the controller determines the current temperature of the wafer, the controller can keep the one or more infrared heating lamps turned off or continue to stop the flow of coolant to the cooling S-chuck and/or coolant release valve.

At step 820, process 800 causes the controller to control the robotic arm to remove the wafer from the post-implantation station. In some examples, process 800 causes the controller to control the robotic arm to remove the wafer from the post-implantation station (e.g., from the processing chamber of the post-implantation station) and transfer the wafer to a load lock chamber (e.g., load lock chamber(s) 102). In some examples, process 800 causes the controller to control the robotic arm to transfer the wafer to the initial load lock chamber from which the robotic arm removed the wafer at step 802 (or another load lock chamber adjacent to the initial load lock chamber). In the examples described above wherein the post-implantation station is located within an auxiliary chamber of a load lock chamber, the robotic arm of the load lock chamber transfers the wafer from the auxiliary chamber back to the load lock chamber. In the examples described above wherein the post-implantation station is located within a load lock chamber, the controller forgoes performing step 820 and the wafer remains in the load lock chamber/post-implantation station. Alternatively, the controller controls the robotic arm to remove the wafer from the load lock chamber/post-implantation station and subsequently transfer the wafer to another load lock chamber. In any case, an operator of the ion implantation system, or another automated mechanism and/or system (e.g., controlled by the controller), removes the wafer from the ion implantation station via the load lock chamber.

If the controller determines that the determined current temperature of the wafer does not satisfy the predetermined condition, at step 822, process 800 causes the controller to control the post-implantation station to continue heating or cooling the wafer at the post-implantation station. For example, in the examples described above wherein the one or more infrared heating lamps, cooling E-chuck, and/or coolant release valve of the post-implantation station heat or cool the wafer while the controller determines the current temperature of the wafer, the controller can keep the one or more infrared heating lamps turned on or continue the flow of coolant to the cooling E-chuck and/or coolant release valve. Alternatively, in the examples described above wherein the controller controls the one or more infrared heating lamps, cooling E-chuck, and/or coolant release valve of the post-implantation station to cease heating or cooling the wafer while the controller determines the current temperature of the wafer, the controller can turn on the one or more infrared heating lamps or resume the flow of coolant to the cooling E-chuck and/or coolant release valve.

After the controller controls the post-implantation station to continue heating or cooling the wafer at step 820, the controller once again performs steps 814 and 816 (e.g., after a predetermined period of time of continued heating/cooling). In some examples, the controller continues performing steps 814, 816, and 822 until the predetermined condition is satisfied at step 816. For example, the controller will continue determining the current temperature of the wafer and controlling the post-implantation station to heat or cool the wafer until the determined current temperature of the wafer is greater than or equal to 20 degrees Celsius.

It should be appreciated that some steps in process 800 may be combined, the order of some steps can be changed, and some steps can be omitted. Further, it should be appreciated that additional steps may be performed. For example, if the ion implanter of ion implantation system 100 includes one or more infrared heating lamps, cooling E-chuck, and/or coolant release valve (e.g., within processing chamber 110 of the ion implanter), process 800 may additionally include a step for heating or cooling the wafer while implanting the wafer with ions from an ion beam at the ion implanter (e.g., in between steps 808 and 810). As another example, as will be described in greater detail below with reference to FIG. 14, process 800 may additionally include one or more steps for determining a temperature of a wafer at a pre-implantation station, or may include one or more steps for determining a temperature of a wafer at a pre-implantation station instead of determining a temperature of a wafer at a post-implantation station.

Figure 14:
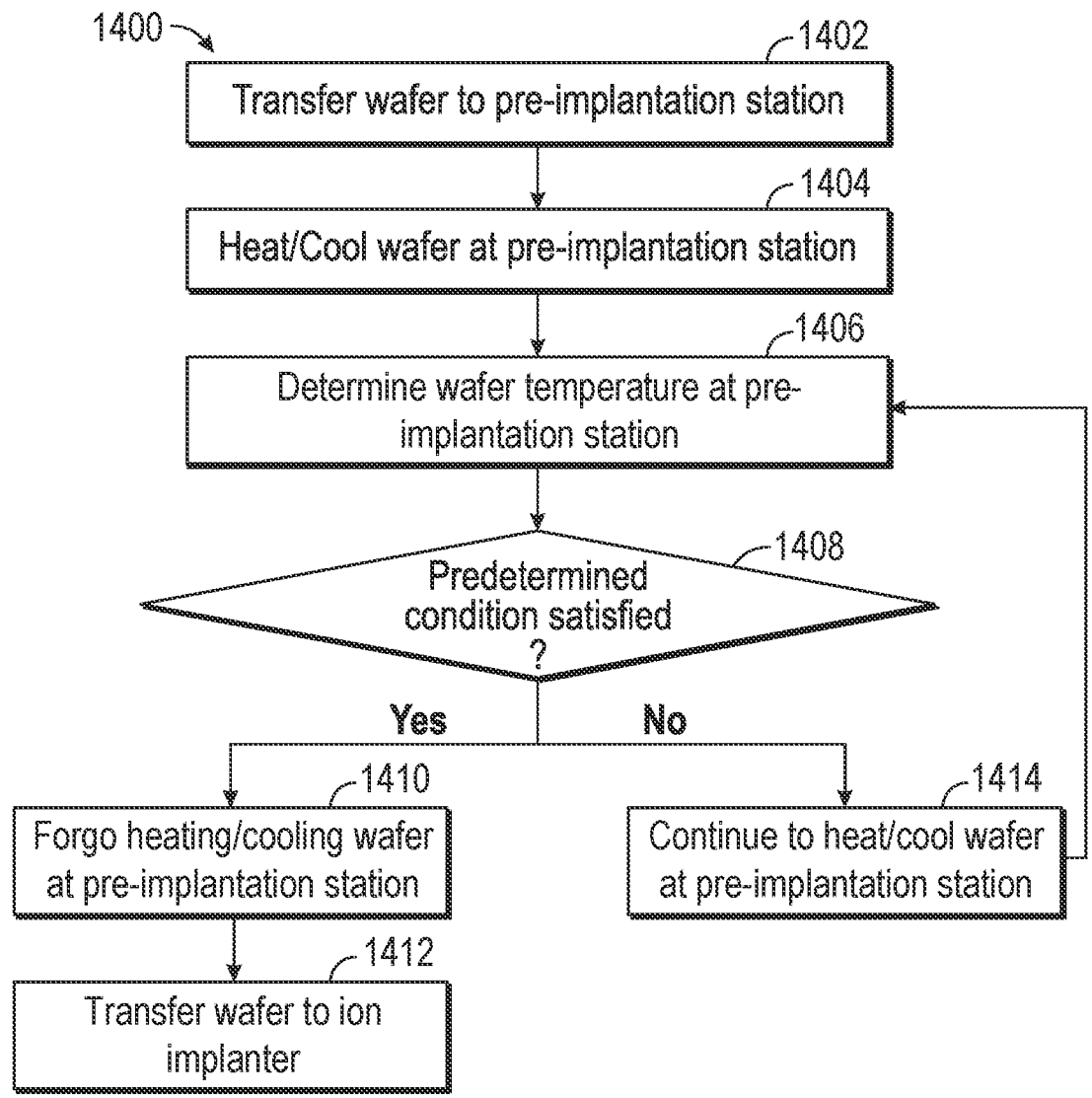
FIG. 14 illustrates a process for measuring a temperature of a wafer within an ion implantation system, according to various examples.

FIG. 14 illustrates a process for measuring a temperature of a wafer within an ion implantation system, according to various examples. In some examples, process 1400 is performed by a system similar or identical to system 100, described above with reference to FIGS. 1-7. In particular, FIG. 14 illustrates steps that can be performed in addition to the steps of process 800 (e.g., steps 1406-1410 and 1414) or instead of certain steps of process 800 (e.g., instead of steps 814-818 and 822).

At step 1402, process 1400 causes a controller (e.g., controller 114) to control a robotic arm (e.g., robotic arm 104) to transfer a wafer (e.g., wafer 216, 402, 420, 502, 602, or 702) from a load lock chamber (e.g., load lock chamber(s) 102) to a pre-implantation station (e.g., pre-implantation station 108). In some examples, step 1402 is identical to step 802 of process 800.

After the robotic arm positions the wafer at the pre-implantation station, at step 1404, process 1400 causes the controller to control the pre-implantation station to heat or cool the wafer to a first predetermined temperature. In some examples, step 1404 is identical to step 804 of process 800.

In some examples, after the robotic arm transfers the wafer to the pre-implantation station and before process 1400 causes the controller to control the pre-implantation station to heat or cool the wafer, process 1400 causes the controller to control the pre-implantation station (e.g., the temperature measurement components of the pre-implantation station) to determine a reference wafer temperature. The reference temperature of the wafer will typically be ambient temperature or the temperature at which the wafer was kept prior to being introduced into the ion implantation system. In some examples, process 1400 causes the controller to determine the reference wafer temperature using one or more of the single-laser method (e.g., process 900), the bandgap method (e.g., process 1000), the capacitance method (e.g., process 1100), and the photoluminescence method (e.g., process 1200), which are described in greater detail above with reference to FIGS. 9-12.

After the wafer is heated or cooled at the pre-implantation station, at step 1406, process 1400 causes the controller to determine a current temperature of the wafer. In some examples, process 1400 causes the controller to determine the current temperature of the wafer at step 1406 based on one or more of a single-laser method (e.g., process 900), a bandgap method (e.g., process 1000), a capacitance method (e.g., process 1100), and/or a photoluminescence method (e.g., process 1200).

In some examples, process 1400 causes the controller to determine the current temperature of the wafer after the wafer is heated or cooled at the pre-implantation station for a predetermined period of time (e.g., 1 second, 2 seconds, 5 seconds, etc.). In some examples, process 1400 causes the controller to periodically determine a current temperature (e.g., every 0.5 seconds, every 2 seconds, etc.) after the wafer is heated or cooled at the pre-implantation station for a predetermined period of time (e.g., 1 second, 2 seconds, 5 seconds, etc.). For example, after the wafer is heated at the pre-implantation station for 2 seconds, process 1400 can thereafter cause the controller to determine a current temperature of the wafer every second. In some examples, process 1400 causes the controller to continually determine the current temperature of the wafer after the wafer is heated or cooled at the pre-implantation station for a predetermined period of time (e.g., 1 second, 2 seconds, 5 seconds, etc.) and until the wafer reaches a predetermined target temperature.

In some examples, process 1400 causes the controller to determine the current temperature of the wafer while the wafer is heated or cooled at the pre-implantation station. For example, after one or more infrared heating lamps of the post-implantation heat the wafer for a predetermined period of time, process 1400 can cause the controller to determine the current temperature of the wafer while the one or more infrared heating lamps continue to heat the wafer. In other examples, process 1400 causes the controller to control the one or more infrared heating lamps, cooling E-chuck, and/or coolant release valve of the post-implantation station to cease heating or cooling the wafer while the controller determines the current temperature of the wafer. For example, process 1400 can cause the controller to turn off the one or more infrared heating lamps or stop the flow of coolant to the cooling E-chuck and/or coolant release valve. In these examples, after the controller determines the current temperature of the wafer (which can take less than a second), process 1400 can cause the controller to control the one or more infrared heating lamps, cooling E-chuck, and/or coolant release valve of the post-implantation station to continue (i.e., resume) heating or cooling the wafer. For example, process 1400 can cause the controller to turn on the one or more infrared heating lamps or resume the flow of coolant to the cooling E-chuck and/or coolant release valve.

In some examples, ceasing to heat or cool the wafer while the controller determines the current temperature of the wafer allows the controller to more accurately determine the current temperature of the wafer. For example, as described above with reference to FIGS. 5 and 7, infrared light from the one or more infrared heating lamps can create unwanted "noise" (e.g., unwanted infrared light intensity and/or wavelength measurements) when determining the current temperature of the wafer based on a bandgap method (e.g., process 1000) and/or a photoluminescence method (e.g., process 1200). The unwanted noise can subsequently lead to inaccurate current temperature determinations, as the bandgap and photoluminescence methods both utilize infrared light intensity and/or wavelength measurements to determine a current temperature of the wafer. Thus, ceasing to heat the wafer with the one or more infrared heating lamps in these examples can prevent a photodetector (e.g., photodetector 518), a spectrophotometer (e.g., spectrophotometer 720), and/or a monochromator of the pre-implantation station from collecting/detecting infrared light from the one or more heating lamps (and subsequently generating the unwanted noise mentioned above) while the controller determines the current temperature of the wafer based on the bandgap method and/or the photoluminescence method, respectively.

At step 1408, process 1400 causes the controller to determine whether the determined current temperature of the wafer (e.g., determined by process 900, 1000, 1100, and/or 1200) satisfies a predetermined condition. In some examples, the predetermined condition includes a requirement that the determined current temperature of the wafer be greater than or equal to the first predetermined temperature (e.g., when the wafer is heated at the pre-implantation station). For example, the predetermined condition can include a requirement that the determined current temperature of the wafer be greater than or equal to 200 degrees Celsius. In other examples, the predetermined condition includes a requirement that the determined current temperature of the wafer be less than or equal to the first predetermined temperature (e.g., when the wafer is cooled at the post-implantation station). For example, the predetermined condition can include a requirement that the determined current temperature of the wafer be less than or equal to −100 degrees Celsius.

If the controller determines that the determined current temperature of the wafer satisfies the predetermined condition, at step 1410, process 1400 causes the controller to control the pre-implantation station to forgo continuing to heat or cool the wafer at the pre-implantation station. For example, in the examples described above wherein the one or more infrared heating lamps, cooling E-chuck, and/or coolant release valve of the pre-implantation station heat or cool the wafer while the controller determines the current temperature of the wafer, the controller can turn off the one or more infrared heating lamps or stop the flow of coolant to the cooling E-chuck and/or coolant release valve. Alternatively, in the examples described above wherein the controller controls the one or more infrared heating lamps, cooling E-chuck, and/or coolant release valve of the pre-implantation station to cease heating or cooling the wafer while the controller determines the current temperature of the wafer, the controller can keep the one or more infrared heating lamps turned off or continue to stop the flow of coolant to the cooling S-chuck and/or coolant release valve.

At step 1412, process 1400 causes the controller to control the robotic arm to remove the wafer from the pre-implantation station and transfer the wafer (while at the first predetermined temperature) to an ion implanter (e.g., ion implanter 200). In some examples, step 1412 is identical to step 806 of process 800.

If at step 1408, the controller determines that the determined current temperature of the wafer does not satisfy the predetermined condition, at step 1414, process 1400 causes the controller to control the pre-implantation station to continue heating or cooling the wafer at the pre-implantation station. For example, in the examples described above wherein the one or more infrared heating lamps, cooling E-chuck, and/or coolant release valve of the pre-implantation station heat or cool the wafer while the controller determines the current temperature of the wafer, the controller can keep the one or more infrared heating lamps turned on or continue the flow of coolant to the cooling E-chuck and/or coolant release valve. Alternatively, in the examples described above wherein the controller controls the one or more infrared heating lamps, cooling E-chuck, and/or coolant release valve of the pre-implantation station to cease heating or cooling the wafer while the controller determines the current temperature of the wafer, the controller can turn on the one or more infrared heating lamps or resume the flow of coolant to the cooling E-chuck and/or coolant release valve.

After the controller controls the pre-implantation station to continue heating or cooling the wafer at step 1414, the controller once again performs steps 1406 and 1408 (e.g., after a predetermined period of time of continued heating/cooling). In some examples, the controller continues performing steps 1406, 1408, and 1414 until the predetermined condition is satisfied at step 1408. For example, the controller will continue determining the current temperature of the wafer and controlling the pre-implantation station to heat or cool the wafer until the determined current temperature of the wafer is less than or equal to −150 degrees Celsius.

In some examples, after the controller performs step 1412, the controller returns to process 800 and perform steps 808-820 (and 822 if necessary) as described in greater detail above with reference to FIG. 8. For example, the controller can return to process 800 and perform steps 808-820 (and 822 if necessary) when the temperature of a wafer is also determined in the post-implantation station. In other examples, after the controller performs step 1412, the controller returns to process 800 and perform steps 808-812 and 818-820 as described in greater detail above with reference to FIG. 8. For example, the controller can return to process 800 and perform steps 808-812 and 818-820 when the temperature of a wafer is not determined in the post-implantation station (e.g., when the heating/cooling at step 812 is based on time instead of the current temperature of the wafer). It should be appreciated that some steps in process 1400 may be combined, the order of some steps can be changed, and some steps can be omitted. Further, it should be appreciated that additional steps may be performed.

While specific components, configurations, features, and functions are provided above, it will be appreciated by one of ordinary skill in the art that other variations may be used. Additionally, although a feature may appear to be described in connection with a particular example, one skilled in the art would recognize that various features of the described examples may be combined. Moreover, aspects described in connection with an example may stand alone.

Although embodiments have been fully described with reference to the accompanying drawings, it should be noted that various changes and modifications will be apparent to those skilled in the art. Such changes and modifications are to be understood as being included within the scope of the various examples as defined by the appended claims.

What is claimed is:

1. A method for controlling wafer temperature in an ion implantation system having an ion implanter and a processing station, the method comprising:
    implanting a wafer with ions from an ion beam while maintaining the wafer at a first predetermined temperature within a processing chamber of the ion implanter;
    heating the wafer at the processing station with one or more infrared heating lamps;
    ceasing to heat the wafer by turning off the one or more infrared heating lamps;
    after turning off the one or more infrared heating lamps, at the processing station:
        directing a laser beam from a laser source to a predefined location on the wafer; and
        detecting, using a monochromator, fluorescent light emitted by the wafer in response to absorbing laser energy of the laser beam;
    determining an intensity profile of the detected fluorescent light;
    determining a current temperature of the wafer based on one or more characteristics determined from the intensity profile; and
    in accordance with the determined current temperature of the wafer satisfying a predetermined condition:
        forgoing continuing heating the wafer at the processing station; and
        removing the wafer from the processing station.

2. The method of claim 1, further comprising:
    in accordance with the determined current temperature of the wafer not satisfying the predetermined condition, continuing heating the wafer.

3. The method of claim 2, wherein the laser source and the monochromator are disposed outside of a chamber of the processing station, further comprising:
    while heating the wafer, at the processing station:
        collecting the fluorescent light with an optical fiber within the chamber of the processing station, wherein the optical fiber is connected to the monochromator; and
        directing, with the optical fiber, the fluorescent light to the monochromator.

4. The method of claim 1, further comprising:
    prior to directing the laser beam to the predefined location on the wafer, directing the laser beam from the laser source to an optical chopper, wherein the optical chopper controls a frequency at which the laser beam strikes the predefined location on the wafer.

5. The method of claim 1, wherein determining an intensity profile of the detected fluorescent light includes extracting and amplifying fluorescent light signals from the detected fluorescent light using a lock-in-amplifier, wherein the intensity profile is determined based on the extracted and amplified fluorescent light signals.

6. The method of claim 1, wherein the one or more characteristics determined from the intensity profile include at least one of a peak wavelength of an intensity peak in the intensity profile and a full width half maximum of the intensity peak.

7. The method of claim 1, wherein the determination of the current temperature of the wafer is further based on a material of the wafer.

8. The method of claim 1, wherein the processing station is a post-implantation station, and wherein the predetermined condition includes a requirement that the determined current temperature of the wafer be greater than or equal to a second predetermined temperature.

9. The method of claim 1, wherein the processing station is a pre-implantation station, and wherein the predetermined condition includes a requirement that the determined current temperature of the wafer be less than or equal to the first predetermined temperature.

10. A method for controlling wafer temperature in an ion implantation system having an ion implanter and a processing station, the method comprising:
    implanting a wafer with ions from an ion beam while maintaining the wafer at a first predetermined temperature within a processing chamber of the ion implanter;
    heating or cooling the wafer at the processing station;
    after heating or cooling the wafer, at the processing station:
        directing a laser beam from a laser source to a predefined location on an edge extending between a top surface of the wafer and a bottom surface of the wafer, wherein a size of a spot of the laser beam is smaller than a thickness of the wafer and wherein the thickness of the wafer is equivalent to a length of the edge;

detecting, using a monochromator, fluorescent light emitted by the wafer in response to absorbing laser energy of the laser beam;
determining an intensity profile of the detected fluorescent light; and
determining a current temperature of the wafer based on one or more characteristics determined from the intensity profile; and
in accordance with the determined current temperature of the wafer satisfying a predetermined condition:
forgoing continuing to heat or cool the wafer at the processing station; and
removing the wafer from the processing station.

11. The method of claim 10, further comprising:
prior to directing the laser beam to the predefined location on the wafer, directing the laser beam from the laser source to an optical chopper, wherein the optical chopper controls a frequency at which the laser beam strikes the predefined location on the wafer.

12. The method of claim 10, wherein determining an intensity profile of the detected fluorescent light includes extracting and amplifying fluorescent light signals from the detected fluorescent light using a lock-in-amplifier, wherein the intensity profile is determined based on the extracted and amplified fluorescent light signals.

13. The method of claim 10, wherein the one or more characteristics determined from the intensity profile include at least one of a peak wavelength of an intensity peak in the intensity profile and a full width half maximum of the intensity peak.

14. A non-transitory computer-readable storage medium storing one or more programs, the one or more programs comprising instructions, which when executed by one or more processors of a controller of an ion implantation system, cause the controller to:
control an ion implanter of the ion implantation system to implant ions into a wafer while maintaining the wafer at a first predetermined temperature within a processing chamber of the ion implanter;
control a processing station of the ion implantation system to heat the wafer at the processing station with one or more infrared heating lamps;
control a processing station of the ion implantation system to cease heating the wafer by turning off the one or more infrared heating lamps;
after turning off the one or more infrared heating lamps:
control a laser source to direct a laser beam to a predefined location on the wafer; and
obtain, from a monochromator, data representing detected fluorescent light emitted by the wafer in response to absorbing laser energy of the laser beam;
determine an intensity profile of the detected fluorescent light based on the data representing the detected fluorescent light;
determine a current temperature of the wafer based on one or more characteristics determined from the intensity profile; and
in accordance with the determined current temperature of the wafer satisfying a predetermined condition:
control the processing station to forgo continuing heating the wafer at the processing station; and
control the robotic arm to remove the wafer from the processing station.

15. The non-transitory computer-readable storage medium of claim 14, the one or more programs further comprising instructions, which when executed by one or more processors of a controller of an ion implantation system, cause the controller to:
in accordance with the determined current temperature of the wafer not satisfying the predetermined condition, control the processing station to continue heating the wafer.

16. The non-transitory computer-readable storage medium of claim 15, wherein controlling the processing station to heat or cool the wafer comprises controlling one or more infrared heating lamps to heat the wafer, and wherein the laser source and the monochromator are disposed outside of a chamber of the processing station, the one or more programs further comprising instructions, which when executed by one or more processors of a controller of an ion implantation system, cause the controller to:
while controlling the one or more infrared heating lamps to heat the wafer, control the processing station to:
collect the fluorescent light with an optical fiber within the chamber of the processing station, wherein the optical fiber is connected to the monochromator; and
direct, with the optical fiber, the fluorescent light to the monochromator.

17. The non-transitory computer-readable storage medium of claim 14, the one or more programs further comprising instructions, which when executed by one or more processors of a controller of an ion implantation system, cause the controller to:
prior to controlling the laser source to direct the laser beam to the predefined location on the wafer, controlling the laser to direct the laser beam from the laser source to an optical chopper, wherein the optical chopper controls a frequency at which the laser beam strikes the predefined location on the wafer.

18. An ion implantation system, comprising:
an ion implanter;
a processing station; and
a controller,
wherein the controller comprises memory and one or more processors, and
wherein the memory stores one or more programs, the one or more programs comprising instructions, which when executed by the one or more processors, cause the controller to:
control an ion implanter of the ion implantation system to implant ions into a wafer while maintaining the wafer at a first predetermined temperature within a processing chamber of the ion implanter;
control the processing station of the ion implantation system to heat the wafer at the processing station with one or more infrared heating lamps;
control the processing station of the ion implantation system to cease heating the wafer by turning off the one or more infrared heating lamps;
after turning off the one or more infrared heating lamps:
control a laser source to direct a laser beam to a predefined location on the wafer;
obtain, from a monochromator, data representing detected fluorescent light emitted by the wafer in response to absorbing laser energy of the laser beam;
determine an intensity profile of the detected fluorescent light based on the data representing the detected fluorescent light;
determine a current temperature of the wafer based on one or more characteristics determined from the intensity profile; and in accordance with the determined current temperature of the wafer satisfying a predetermined condition:
control the processing station to forgo continuing heating the wafer at the processing station; and
control the robotic arm to remove the wafer from the processing station.

19. The ion implantation system of claim 18, the one or more programs further comprising instructions, which when executed by one or more processors, cause the controller to:
in accordance with the determined current temperature of the wafer not satisfying the predetermined condition, control the processing station to continue heating the wafer.

20. The ion implantation system of claim 19, wherein controlling the processing station to heat or cool the wafer comprises controlling one or more infrared heating lamps to heat the wafer, and wherein the laser source and the monochromator are disposed outside of a chamber of the processing station, the one or more programs further comprising instructions, which when executed by one or more processors, cause the controller to:
while controlling the one or more infrared heating lamps to heat the wafer, control the processing station to:
collect the fluorescent light with an optical fiber within the chamber of the processing station, wherein the optical fiber is connected to the monochromator; and
direct, with the optical fiber, the fluorescent light to the monochromator.

21. A non-transitory computer-readable storage medium storing one or more programs, the one or more programs comprising instructions, which when executed by one or more processors of a controller of an ion implantation system, cause the controller to:
control an ion implanter of the ion implantation system to implant ions into a wafer while maintaining the wafer at a first predetermined temperature within a processing chamber of the ion implanter;
control a processing station of the ion implantation system to heat or cool the wafer at the processing station;
after heating or cooling the wafer:
control a laser source to direct a laser beam to a predefined location on an edge extending between a top surface of the wafer and a bottom surface of the wafer, wherein a size of a spot of the laser beam is smaller than a thickness of the wafer and wherein the thickness of the wafer is equivalent to a length of the edge;
obtain, from a monochromator, data representing detected fluorescent light emitted by the wafer in response to absorbing laser energy of the laser beam;
determine an intensity profile of the detected fluorescent light based on the data representing the detected fluorescent light;
determine a current temperature of the wafer based on one or more characteristics determined from the intensity profile; and
in accordance with the determined current temperature of the wafer satisfying a predetermined condition:
control the processing station to forgo continuing to heat or cool the wafer at the processing station; and
control the robotic arm to remove the wafer from the processing station.

22. The non-transitory computer-readable storage medium of claim 21, the one or more programs further comprising instructions, which when executed by one or more processors of a controller of an ion implantation system, cause the controller to:
prior to controlling the laser source to direct the laser beam to the predefined location on the wafer, control the laser source to direct the laser beam from the laser source to an optical chopper, wherein the optical chopper controls a frequency at which the laser beam strikes the predefined location on the wafer.

23. The non-transitory computer-readable storage medium of claim 21, wherein determining an intensity profile of the detected fluorescent light includes extracting and amplifying fluorescent light signals from the detected fluorescent light using a lock-in-amplifier, wherein the intensity profile is determined based on the extracted and amplified fluorescent light signals.

24. The non-transitory computer-readable storage medium of claim 21, wherein the one or more characteristics determined from the intensity profile include at least one of a peak wavelength of an intensity peak in the intensity profile and a full width half maximum of the intensity peak.

25. An ion implantation system, comprising:
an ion implanter;
a processing station; and
a controller,
wherein the controller comprises memory and one or more processors, and
wherein the memory stores one or more programs, the one or more programs comprising instructions, which when executed by the one or more processors, cause the controller to:
control an ion implanter of the ion implantation system to implant ions into a wafer while maintaining the wafer at a first predetermined temperature within a processing chamber of the ion implanter;
control a processing station of the ion implantation system to heat or cool the wafer at the processing station;
after heating or cooling the wafer:
control a laser source to direct a laser beam to a predefined location on an edge extending between a top surface of the wafer and a bottom surface of the wafer, wherein a size of a spot of the laser beam is smaller than a thickness of the wafer and wherein the thickness of the wafer is equivalent to a length of the edge;
obtain, from a monochromator, data representing detected fluorescent light emitted by the wafer in response to absorbing laser energy of the laser beam;
determine an intensity profile of the detected fluorescent light based on the data representing the detected fluorescent light;
determine a current temperature of the wafer based on one or more characteristics determined from the intensity profile; and
in accordance with the determined current temperature of the wafer satisfying a predetermined condition:
control the processing station to forgo continuing to heat or cool the wafer at the processing station; and
control the robotic arm to remove the wafer from the processing station.

26. The ion implantation system of claim 25, the one or more programs further comprising instructions, which when executed by one or more processors of a controller of an ion implantation system, cause the controller to:
prior to controlling the laser source to direct the laser beam to the predefined location on the wafer, control the laser source to direct the laser beam from the laser source to an optical chopper, wherein the optical chopper controls a frequency at which the laser beam strikes the predefined location on the wafer.

27. The ion implantation system of claim 25, wherein determining an intensity profile of the detected fluorescent light includes extracting and amplifying fluorescent light signals from the detected fluorescent light using a lock-in-amplifier, wherein the intensity profile is determined based on the extracted and amplified fluorescent light signals.

28. The ion implantation system of claim 25, wherein the one or more characteristics determined from the intensity profile include at least one of a peak wavelength of an intensity peak in the intensity profile and a full width half maximum of the intensity peak.

\* \* \* \* \*